US010440456B2

(12) United States Patent
Kim et al.

(10) Patent No.: US 10,440,456 B2
(45) Date of Patent: Oct. 8, 2019

(54) ARTIFICIAL INTELLIGENCE SOUND OUTPUT APPARATUS, HUB FOR COMMUNICATION NETWORK, AND METHOD OF MANUFACTURING THE APPARATUS AND GRILLE FOR THE APPARATUS

(71) Applicant: LG ELECTRONICS INC., Seoul (KR)

(72) Inventors: Sangin Kim, Seoul (KR); Sanghoon Chi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/604,975

(22) Filed: May 25, 2017

(65) Prior Publication Data
US 2017/0347172 A1 Nov. 30, 2017

Related U.S. Application Data

(60) Provisional application No. 62/341,566, filed on May 25, 2016.

(30) Foreign Application Priority Data

Jul. 6, 2016 (WO) ................ PCT/KR2016/007335
Aug. 22, 2016 (KR) ........................ 10-2016-0106330

(51) Int. Cl.
*H04R 1/02* (2006.01)
*G06F 3/16* (2006.01)
(Continued)

(52) U.S. Cl.
CPC ............ *H04R 1/025* (2013.01); *G06F 3/165* (2013.01); *H04R 1/02* (2013.01); *H05K 5/0017* (2013.01);
(Continued)

(58) Field of Classification Search
CPC .......... H04R 1/025; H04R 1/023; H04R 3/00; H04R 2420/076; H04R 2499/15; H05K 5/0017; H05K 5/03; H05K 7/20436
(Continued)

(56) References Cited

U.S. PATENT DOCUMENTS 3,483,945 A 12/1969 Michael
4,974,698 A 12/1990 Smith
(Continued)

OTHER PUBLICATIONS

U.S. Appl. No. 15/604,902, filed May 25, 2017.
(Continued)

*Primary Examiner* — Disler Paul
(74) *Attorney, Agent, or Firm* — KED & Associates, LLP

(57) ABSTRACT

Disclosed is an artificial intelligence hub including: a main body having a speaker for outputting sound; a communication module for wirelessly communicating with a surrounding device; a base provided below the main body to support the main body; a cover coupled to a top of the main body, the cover having an upper surface for displaying a screen based on information exchanged via the communication module; and a grille having a vertically elongated cylindrical shape and provided with a plurality of through-holes therein, the main body being provided within the grille, the grille being coupled at an upper end thereof to the cover housing and coupled at a lower end thereof to the base.

19 Claims, 46 Drawing Sheets

(51) Int. Cl.
*H05K 5/00* (2006.01)
*H05K 5/03* (2006.01)
*H05K 7/20* (2006.01)
*H04R 3/00* (2006.01)

(52) U.S. Cl.
CPC ........... *H05K 5/03* (2013.01); *H05K 7/20436* (2013.01); *H04R 1/023* (2013.01); *H04R 3/00* (2013.01); *H04R 2201/028* (2013.01); *H04R 2420/07* (2013.01); *H04R 2499/15* (2013.01)

(58) Field of Classification Search
USPC .............................. 381/388, 333, 336, 306
See application file for complete search history.

(56) References Cited

U.S. PATENT DOCUMENTS

| | | | |
|---|---|---|---|
| 5,444,198 | A | 8/1995 | Gallas |
| 5,504,502 | A | 4/1996 | Arita et al. |
| 5,652,413 | A | 7/1997 | Mulera |
| 6,104,819 | A * | 8/2000 | Nickum ............... H04R 1/1041 381/123 |
| 6,186,269 | B1 | 2/2001 | Vollmer et al. |
| 6,790,400 | B1 | 9/2004 | Muller et al. |
| 7,429,707 | B2 | 9/2008 | Yanai et al. |
| D632,265 | S | 2/2011 | Choi et al. |
| 8,003,886 | B1 | 8/2011 | Rintz |
| 8,068,618 | B2 | 11/2011 | Vollmer |
| D687,009 | S | 7/2013 | Song et al. |
| D700,904 | S | 3/2014 | Miller et al. |
| 9,036,858 | B1 | 5/2015 | Reeves et al. |
| 9,131,301 | B2 | 9/2015 | Tsai et al. |
| D743,819 | S | 11/2015 | Golnik et al. |
| D746,166 | S | 12/2015 | Li |
| D747,984 | S | 1/2016 | Zhao et al. |
| 9,280,141 | B2 * | 3/2016 | Parker .................... G04G 13/02 |
| 9,304,736 | B1 | 4/2016 | Whiteley et al. |
| 9,319,795 | B2 | 4/2016 | Qu et al. |
| 9,453,655 | B2 | 9/2016 | Bruck et al. |
| D784,963 | S | 4/2017 | Saule et al. |
| 9,633,197 | B2 | 4/2017 | Lakshmanan et al. |
| 9,641,919 | B1 * | 5/2017 | Poole ....................... H04R 1/02 |
| 9,659,577 | B1 * | 5/2017 | Langhammer .......... G10L 21/06 |
| 9,791,839 | B2 | 10/2017 | Matsuoka et al. |
| 9,820,024 | B1 | 11/2017 | Rolf |
| 9,830,005 | B2 | 11/2017 | Sakaguchi et al. |
| 9,843,851 | B2 * | 12/2017 | Chamberlin ........... H04R 1/028 |
| 9,851,728 | B2 | 12/2017 | Matsuoka et al. |
| 9,857,961 | B2 | 1/2018 | Fadell et al. |
| 2006/0182299 | A1 | 8/2006 | Whitehouse et al. |
| 2006/0250762 | A1 | 11/2006 | Yang et al. |
| 2011/0148812 | A1 | 6/2011 | Hente |
| 2011/0303520 | A1 | 12/2011 | Burnel et al. |
| 2012/0035020 | A1 | 2/2012 | Kamm |
| 2012/0051015 | A1 | 3/2012 | Dabov et al. |
| 2013/0001971 | A1 | 1/2013 | Stein |
| 2013/0338839 | A1 | 12/2013 | Rogers et al. |
| 2014/0049886 | A1 | 2/2014 | Lee et al. |
| 2014/0074283 | A1 * | 3/2014 | Blackburn ............ A61J 7/0076 700/237 |
| 2014/0086431 | A1 | 3/2014 | Martin et al. |
| 2014/0110237 | A1 | 4/2014 | Enomoto et al. |
| 2014/0139047 | A1 | 5/2014 | Haines et al. |
| 2014/0219491 | A1 | 8/2014 | Ludlum et al. |
| 2014/0315620 | A1 | 10/2014 | Wells |
| 2015/0010194 | A1 | 1/2015 | Rodgers |
| 2015/0027803 | A1 | 1/2015 | Boyce |
| 2015/0104042 | A1 * | 4/2015 | Ito .......................... H04H 60/04 381/119 |
| 2015/0136572 | A1 | 5/2015 | Liu et al. |
| 2015/0201255 | A1 * | 7/2015 | Porter ...................... H04R 1/00 381/334 |
| 2015/0264461 | A1 | 9/2015 | Hovanky et al. |
| 2015/0334480 | A1 | 11/2015 | Yang et al. |
| 2015/0334859 | A1 | 11/2015 | Lee et al. |
| 2016/0071440 | A1 | 3/2016 | Hibbert |
| 2016/0173977 | A1 * | 6/2016 | Lim ....................... H04R 1/406 381/334 |
| 2016/0259376 | A1 | 9/2016 | Christfort |
| 2016/0335423 | A1 | 11/2016 | Beals |
| 2016/0345086 | A1 * | 11/2016 | Chamberlin ........... H04R 1/028 |
| 2017/0006374 | A1 | 1/2017 | Song et al. |
| 2017/0163437 | A1 | 6/2017 | Yang et al. |
| 2017/0180850 | A1 | 6/2017 | Hsu et al. |
| 2017/0242412 | A1 | 8/2017 | Kim |
| 2017/0259983 | A1 | 9/2017 | Tolman et al. |
| 2017/0288447 | A1 | 10/2017 | Guibene et al. |
| 2017/0330429 | A1 | 11/2017 | Tak et al. |
| 2017/0345420 | A1 | 11/2017 | Barnett, Jr. |
| 2018/0052218 | A1 | 2/2018 | Meadow |

OTHER PUBLICATIONS

U.S. Appl. No. 15/605,041, filed May 25, 2017.
U.S. Appl. No. 15/605,136, filed May 25, 2017.
U.S. Appl. No. 15/605,265, filed May 25, 2017.
U.S. Office Action dated Mar. 8, 2018 issued in co-pending U.S. Appl. No. 15/605,019.
U.S. Office Action dated Mar. 12, 2018 issued in co-pending U.S. Appl. No. 15/605,075.
U.S. Office Action dated Mar. 12, 2018 issued in co-pending U.S. Appl. No. 15/605,519.
U.S. Notice of Allowance dated Jul. 30, 2018 issued in U.S. Appl. No. 15/605,041.
U.S. Office Action dated Oct. 2, 2018 issued in U.S. Appl. No. 15/604,836.
U.S. Appl. No. 15/604,836, filed May 25, 2017.
U.S. Office Action dated Dec. 29, 2017 issued in co-pending U.S. Appl. No. 15/604,902.
U.S. Notice of Allowance dated Jan. 17, 2018 issued in co-pending U.S. Appl. No. 15/605,265.
U.S. Office Action dated Jan. 29, 2018 issued in co-pending U.S. Appl. No. 15/604,836.
U.S. Notice of Allowance dated Feb. 2, 2018 issued in co-pending U.S. Appl. No. 15/605,136.
U.S. Office Action dated Feb. 23, 2018 issued in co-pending U.S. Appl. No. 15/605,041.
U.S. Office Action dated May 23, 2018 issued in co-pending U.S. Appl. No. 15/605,066.
U.S. Final Office Action dated May 30, 2018 issued in co-pending U.S. Appl. No. 15/604,836.
U.S. Notice of Allowance dated Mar. 5, 2019 issued in U.S. Appl. No. 15/604,836.

* cited by examiner

FIG. 8
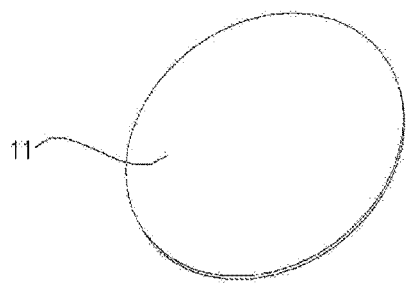
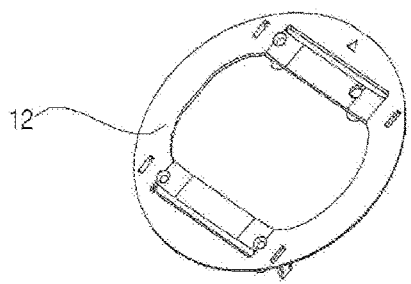
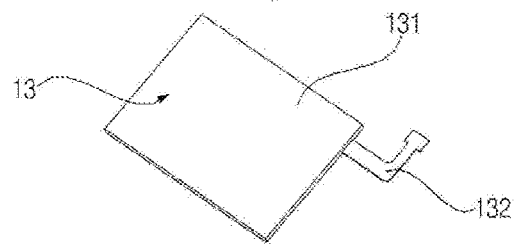
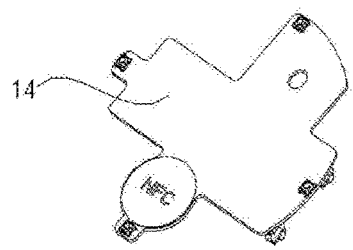
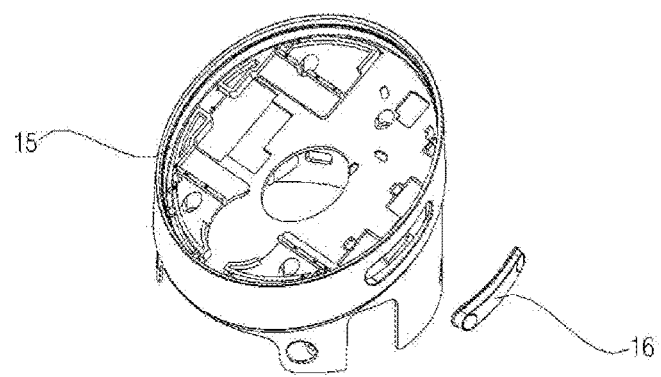

A3

ARTIFICIAL INTELLIGENCE SOUND OUTPUT APPARATUS, HUB FOR COMMUNICATION NETWORK, AND METHOD OF MANUFACTURING THE APPARATUS AND GRILLE FOR THE APPARATUS

CROSS-REFERENCE TO RELATED APPLICATIONS

This application claims the priority benefit of U.S. Provisional Application No. 62/341,566, filed on May 25, 2016, PCT/KR2016/007335, filed on Jul. 6, 2016, and Korean Application No. 10-2016-0106330, filed on Aug. 22, 2016, the disclosures of which are incorporated herein by reference.

BACKGROUND

1. Field

The present disclosure relates to a sound output apparatus, a hub for a communication network, and a method of manufacturing the apparatus and a grille for the apparatus.

2. Background

Various wired/wireless communications technologies may be used to form a connection or a network to exchange data within a given space, such as an office or a home. Devices having a communication function may be connected via the resulting data connection or network. For example, electronic appliances, such as a washing machine, a refrigerator, or an air conditioner, may be connected via wired/wireless connections to an access point (AP) coupled to Internet, and the appliances may access the Internet through the AP to exchange data with remote devices. Also, a terminal device, such as a smart phone, tablet computer, or personal computer, may share information with the appliances through the AP or via the data connections.

Coupling an appliance to a terminal may provide limited functionality because only certain types of information may be available from the appliances. For example, when connected to a refrigerator, the terminal can typically only access limited information collected by sensors installed in or coupled to the refrigerator (i.e., an internal temperature sensor). Consequently, the terminal may have limited ability to collect information regarding external conditions (e.g., ambient external temperature and humidity levels, a status of nearby devices, usage of other devices by a user, the location of the user, etc.) and optimize the control of the appliance in view of these eternal conditions. Technology related to the Internet of Things (IoT) may be used to interconnect various devices and sensors (i.e., "things") via wired/wireless connections to allow the things to share information. The IoT technology adds, for example, communication and sensor functionality to various devices so that the devices may exchange information and/or be controlled based on the shared information.

An apparatus (i.e., a hub) that may integrate and manage appliances or other device within the diversified network environments and to communicate with users based on the information from the appliances is desired.

BRIEF DESCRIPTION OF THE DRAWINGS

The embodiments will be described in detail with reference to the following drawings in which like reference numerals refer to like elements wherein:

FIG. 8 is an exploded perspective view of a cover;

DETAILED DESCRIPTION

Figure 1:
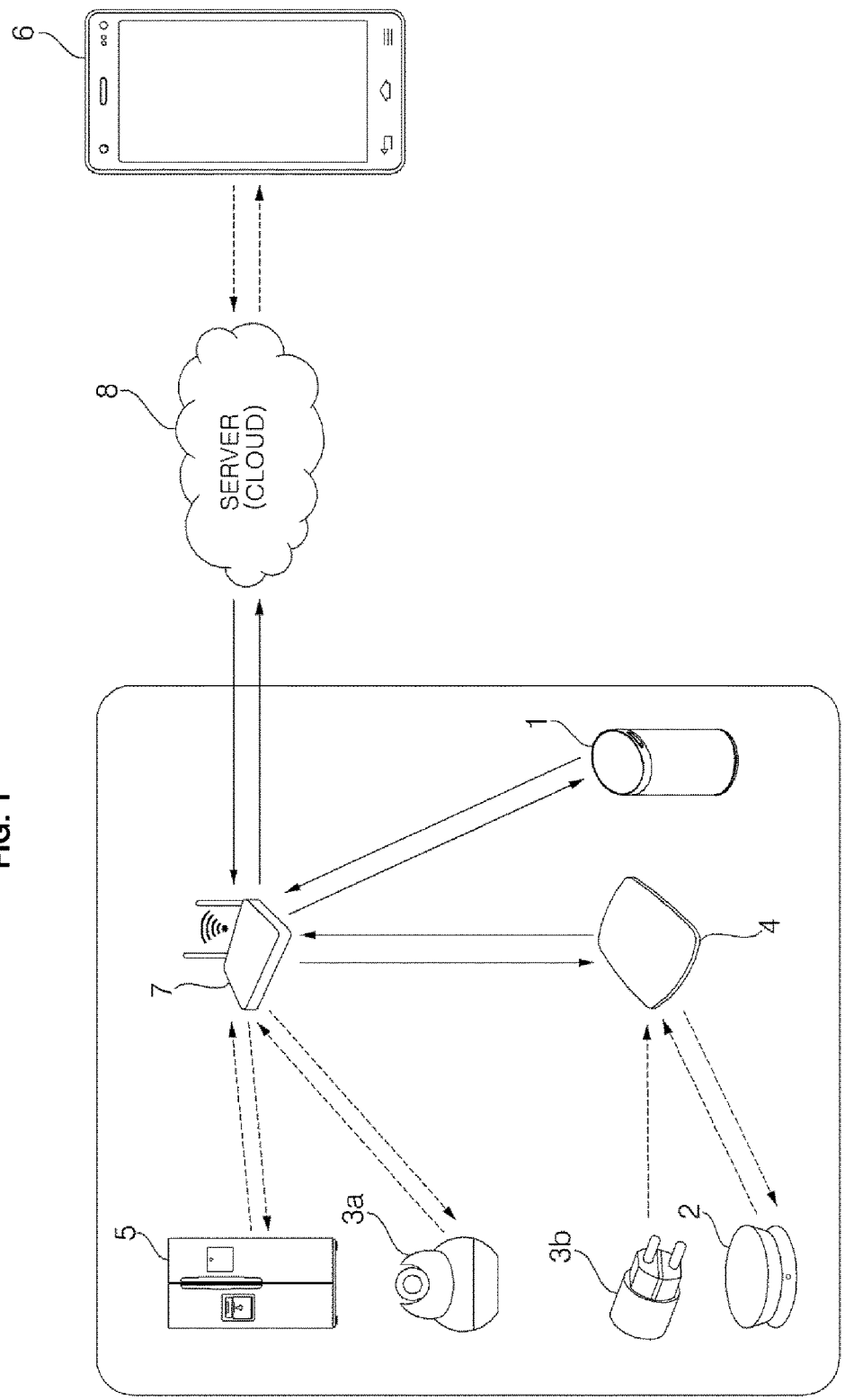
FIG. 1 illustrates a home network system according to one exemplary embodiment of the present disclosure.

FIG. 1 illustrates a network system according to one exemplary embodiment of the present disclosure. The network system may be a collection of devices used to construct a network via exchanged communications within a given space, such as a home, an office, or the like. As one exemplary embodiment of such a network system, FIG. 1 illustrates a home network system constructed in a home.

Referring to FIG. 1, the network system according to one exemplary embodiment of the present disclosure may include a hub 1, accessories 2, 3a and 3b, a gateway 4, an appliance 5, and an access point (AP) 7. Hereinafter, an example of a hub 1 having a sound output function is described, but in other example, hub 1 may have additional, fewer, or different functions. The hub 1 may also be referred to, herein, as a sound output apparatus or a sound output device. The hub 1 may also include a microphone (not illustrated) to detect sound conditions, such as voice input from a user. The hub 1 may include a voice recognition program and may use the voice recognition program to extract a command from the detected voice input. The hub 1, accessories 2, 3a and 3b, the gateway 4, the appliance 5, and/or the AP 7 may communicate to exchange messages and data based on wired networking technologies, such as Ethernet, or based on wireless networking technologies, such as Wi-Fi®, Bluetooth®, ZigBee®, or Z-wave®. It should be appreciated, however, that various other different networking and communication technologies are known and may be incorporated within the present disclosure.

Ethernet is a networking technology based on the 802.3 standards of the Institute of Electrical and Electronics Engineers (IEEE). Ethernet is commonly used in wired connections for local area network (LAN) within a space, such as a home, and is also used for wired connections on a larger scale for metropolitan area networks (MAN) and wide area networks (WAN). Ethernet commonly uses carrier sense multiple access with collision detection (CSMA/CD) for data transmission. Hereinafter, an "Ethernet module" or "Ethernet circuitry" is defined as a component that performs communications based on Ethernet technology.

Wi-Fi® is wireless communication technology based on the IEEE 802.11 standards. Wi-Fi® may be used to establish and configure wireless networks, such as a personal area network (PAN), a wireless LAN (WLAN), or a wireless WAN (WWAN). Wi-Fi® may be used to for wireless peer-to-peer (P2P) connections between devices. Hereinafter, a "Wi-Fi module" or "Wi-Fi circuitry" is defined as a component that performs wireless communication based on Wi-Fi technology.

Bluetooth® is a wireless connection technology for establishing wireless PANs and for wirelessly exchanging data over short distances (e.g., within a range of 10-15 meters) using ultra high frequency (UHF) radio waves, typically in a band from 2.4 to 2.485 GHz. Hereinafter, a "Bluetooth® module" or "Bluetooth® circuitry" is defined as a component that performs wireless communications based on Bluetooth® technology.

ZigBee® is a wireless network technology for forming PANs and for wirelessly exchanging data over short distances based on IEEE 802.15. ZigBee® uses relatively low-powered digital radio transmissions. In one example, a type of ZigBee® known as Radio Frequency for Consumer Electronics (RF4CE) may be used for the remote control of electronic devices. Hereinafter, a "ZigBee® module" or "ZigBee® circuitry" may be defined as a component that performs wireless communications based on a ZigBee technology.

Z-wave® is a wireless transmission protocol that uses source-routed mesh networks, and is commonly used for home automation and sensor networks. Z-wave® uses a physical layer, a MAC layer, a transmission layer, a routing layer, and an application layer defined in the International Telecommunication Union Telecommunication Standardization Sector (ITU-T) G.9959 standard. Z-wave® uses a frequency band around 900 MHz (e.g., 869 MHz in Europe and 908 MHz in the United States) and/or frequency band around 2.4 GHz, and provides speeds of approximately 9.6 kbps, 40 kbps and 200 kbps. Hereinafter, a "Z-wave module" or "Z-wave circuitry" is defined as a component that performs wireless communications based on a Z-wave technology.

Referring back to FIG. 1, accessories 2, 3A, and 3B may include various different sensors, such as a temperature sensor, a humidity sensor, a vibration sensor, a proximity sensor, and/or an infrared (IR) sensor, to collect data regarding the network location. In other examples, the accessories 2, 3a and 3b may include other types of sensors, such as an air quality sensor for detecting the composition of air within the network environment, a smart plug (e.g., a sensor for detecting whether electrical power is being provided to appliance 5 or other device within the network environment), a current transformers (CT) sensor (e.g., a sensor for detecting a current drawn by appliance 5 or other device within the network environment), a smart temperature regulator (i.e., a sensor for detecting ambient temperature conditions and identifying whether a climate control system is active within the network environment), and a water surface sensor to detect whether moisture is present.

The accessories 2, 3A, and 3B may be positioned at various locations within the network environment. In one example, some of the accessories 2, 3A, and 3B may be attached to the electronic appliance 5. For example, one of the accessories 2, 3A, and 3B may include a vibration sensor and may be attached to the appliance 5. For example, the appliance 5 is a clothes washing machine, the vibration sensor may sense vibrations generated during the operation of the washing machine, and the vibration sensor may generate and output a signal identifying a status of the washing machine (e.g., the signal may indicate whether the washing machine is active, and if so, may further indicate whether the washing machine is agitating laundry or spinning the laundry).

In another example, some of the accessories 2, 3A, and 3B may be separated from the electronic appliance 5 and may be positioned at other location within the network environment. For example, an accessory 2, 3A, or 3B including a motion detector (e.g. an IR motion sensor) may be attached to a wall and may be positioned to sense the opening or closing of a home door or a door on the appliance 5.

In certain examples, the accessories 2, 3A, and 3B may transmit information acquired by these sensors to the hub 1 via the network. Furthermore, signals for control of the sensors in the accessories 2, 3A, and 3B may be transmitted from the hub 1. For example, when an accessory 2, 3A, or 3B includes a sensor to detect a presence of a user (e.g., the above-described motion detector to sense when a house door or a door of an appliance 5 is opened), and when the user's presence is not detected during a threshold time period, hub 1 may generate and forward a notification to a preset terminal 6. In another example, the accessories 2, 3A, and 3B may forward the collected sensor data directly to the terminal 6.

In one example, some of the accessories (e.g., accessory 2) may further enable the remote control of the electronic appliance 5. For example, the accessory 2 may include an emitter that outputs an infrared (IR) control signal toward the electronic appliance 5, and the accessory 2 may be positioned so that the electronic appliance 5 is within a transmission range of emitter. The accessory 2 may generate and output the control signal (i.e., the IR control signal) based on an input control signal received via a network (e.g., from hub 1 or from terminal 6 through AP 7). In one example, the accessory 2 (or another of accessories 2, 3A, or 3B) may also include an IR sensor or receiver to detect when the IR control signal collides with and is reflected by an intervening object, such that the electronic appliance 5 does not receive the IR control signal.

The AP 7 may be a relay device for enabling wireless equipment to be connected to a network, and connects a home network to the Internet. The hub 1, the accessory 3b, gateway 4, and the electronic appliance 5 may be connected to the AP 7 using a wired connection (e.g., Ethernet) or a wireless method (e.g., Wi-Fi®, ZigBee®, or Z-wave®).

The gateway 4 may be function to connect devices using having different protocols and to enable communications therebetween, such as to connect devices that are not compatible with Wi-Fi® to the AP 7. Messages (or information) from the accessories 2 and 3b may be transmitted to the gateway 4, and the gateway 4 may then forward the message to the hub 1 via the AP 7. For example, the gateway 4 may convert a ZigBee (or Z-wave) signal, received from the accessories 2 and 3b, into a Wi-Fi signal and forward the resulting Wi-Fi signal to the AP 7 to be forwarded to the terminal 6 or the server 8. Similarly, messages carrying data or instructions from the hub 1 may be forwarded to the gateway 4 via the AP 7, and the accessories 2 and 3b may receive these hub messages from the gateway 4. In certain exemplary embodiments, the accessories 2, 3a and 3b and the hub 1 may communicate with the network (e.g., via AP 7) even when the network is disconnected from the Internet (e.g., when AP 7 is disconnected from server 8 and/or terminal 6).

The devices in the network may connect to the Internet via the AP 7, such as to connect to a remote computing device or server 8. Although a single server 8 is described herein, server 8 may include a group of computing device or a cloud. The server 8 may be associated, for example, with manufacturers, vendors, and/or service provides associated with the hub 1, the accessories 2, 3a and 3b, gateway 4, and/or the home appliance 5. The server 8 may store software and data and may, in response to receiving a request one of the devices in the network (e.g., from the hub 1), forward the software and/or data to the requesting device via the Internet. In one example, the server 8 may collect data from one or more devices in the network (e.g., accessories 2, 3a, and 3b) and may forward the collected data to another device in the network (e.g., to hub 1).

As shown in FIG. 1, the server 8 may also exchange data with a terminal 6, such as a smart phone, a tablet device, a personal computer (PC) or other device that may be coupled to the server. In one example, the server 8 and the terminal 6 may be connected through the Internet. For example, information transmitted from the hub 1 or the accessories 2, 3a and 3b may be stored in the server 8, and may be transmitted from the server 8 to the terminal 6. In addition, the server 8 may receive data from the terminal 6 or acquire data associated with the terminal 6 (e.g., from another server), and the server 8 may then transmit the information to one or more devices in the network (e.g., to the hub 1 or the accessories 2, 3a and 3b). In one example, the server 8 may forward control data from the terminal 6 such that the hub 1 or the accessories 2, 3a and 3b may be controlled via the mobile terminal 6.

Although terminal 6 is shown in FIG. 1 as being remote from the geographic location associated with hub 1, accessories 2, 3a and 3b, gateway 4, appliance 5, and AP 7, it should be appreciated that terminal 6 may be located proximate to one or more of these devices. For example, terminal 6 may be coupled to the AP 7 via a wired or wireless connection.

In one example, the terminal 6 may execute an application to provide a graphical user interface (GUI) to control or to access information from the hub 1 or the accessories 2, 3a and 3b. For example, the GUI in terminal 6 may present data collected by sensors in accessories 2, 3a and 3b. In another example, functions performed by the accessories 2, 3a and 3b may be expanded or changed by using an application installed on the terminal 6. In another example described below, the accessories 2, 3a and 3b may be controlled by the hub 1, or information collected by the accessories 2, 3a and 3b may be collected, processed, and used by the hub 1 alone, without involvement of the terminal 6.

In certain exemplary embodiments described above, messages forwarding data collected by sensors in the accessory 2, 3a and 3b may be forwarded via the network to the mobile terminal 6. An application installed in the mobile terminal 6 may analyze the received messages. For example, the application on the mobile terminal 6 may process sensor information regarding the opening or closing of the door or an operating state of the electronic appliance 5 (e.g. occurrence of the unbalance of the washing machine). In another example, the sensor data may be processed by another device (e.g., server 8), and results from processing the sensor data may be forwarded to terminal 6 to determine an appropriate action. For example, the terminal 6 may output a visual notification via a display or may output an audio notification via a speaker when a certain sensor conditions are detected (e.g., to prompt a user to check on the appliance 5 when an abnormal operation is detected, or to check a resident condition when the opening or closing of the door is not sensed for a long time).

Figure 2:
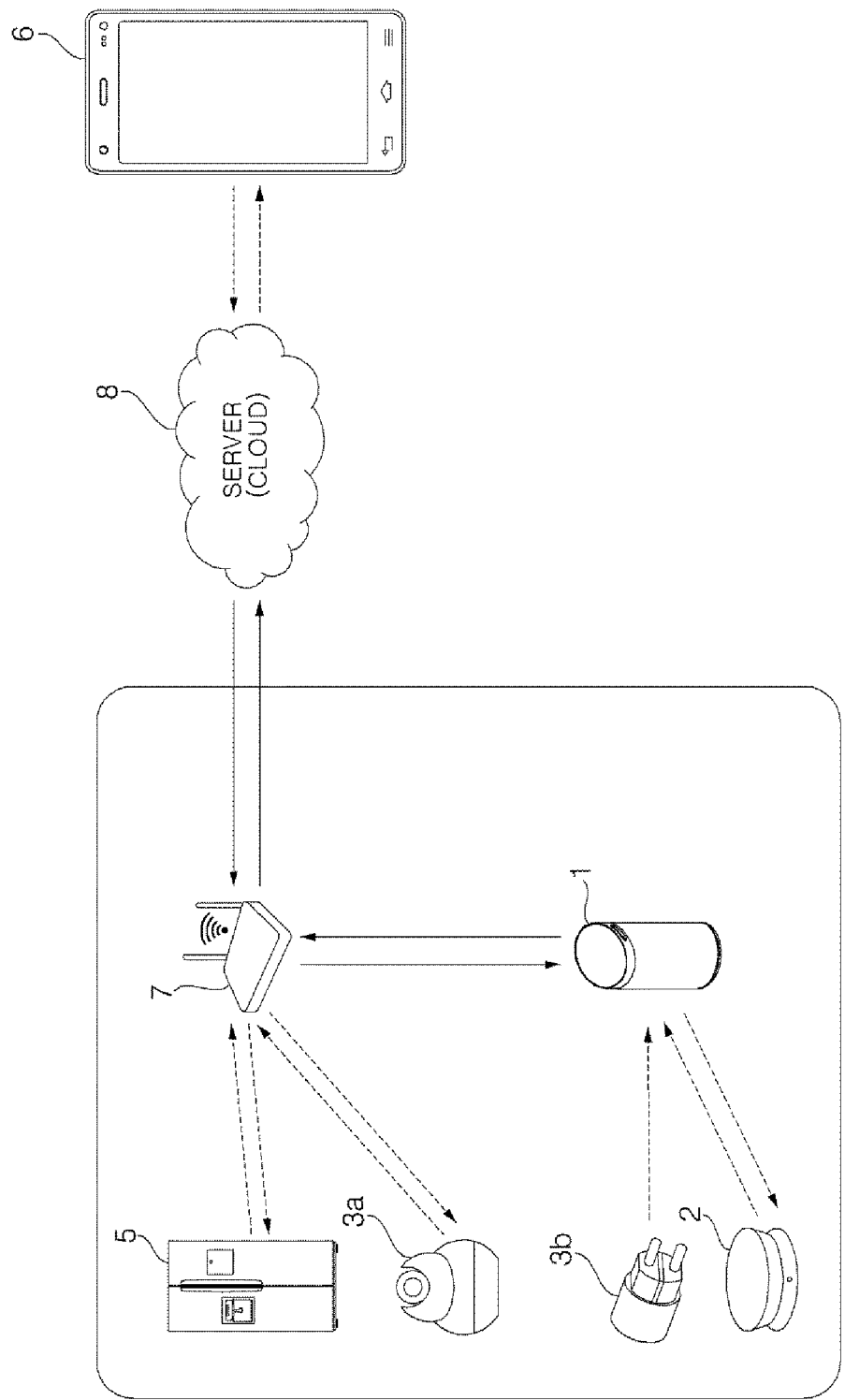
FIG. 2 illustrates a home network system according to another exemplary embodiment of the present disclosure.

FIG. 2 illustrates the home network system according to another exemplary embodiment of the present disclosure. In this embodiment, the home network system excludes the gateway 4, and instead, the hub 1 performs the above-described functions of the gateway 4 (i.e., to connect devices that use different communication technologies). The accessories 2 and 3b may directly communicate with the hub 1. For example, the accessories 2 and 3b and the hub 1 may include ZigBee modules and may communicate with each other using ZigBee. The hub 1 may then generate Wi-Fi signals based on the received ZigBee signals from the accessories 2 and 3b forward the generated Wi-Fi signals to AP 7 or another device. Similarly, the hub 1 may receive Wi-Fi signals forwarding data and/or instructions for the accessories 2 and 3b and may generate ZigBee signals forwarding the received data and/or instructions to the accessories 2 and 3b.

Referring to FIGS. 3 to 9, the hub 1 according to one exemplary embodiment of the present disclosure may include a cover (or upper portion) 10, a main body (or interior body) 40, a grille 20, and a base (or bottom portion) 30. A bottom surface of the main body 40 may be supported by the base 30, and the cover 10 may be coupled to a top portion of the main body 40. The grille 20 may have a vertically-elongated cylindrical shape, and portions of the main body 40 are positioned within the cylindrical shape such that lateral side portions of the main body 40 (i.e., portions of the main body 40 that extend between the cover 10 and the bade 30) are covered by the grille 20. In one exemplary embodiment, a portion of the main body 40 may extend above the upper end of the grille 20 such that that this portion is of the main body 40 is externally exposed. The grille 20 may include through-holes 20h that provide air passages to enable sound generated at the main body 40 to pass through grille 20 with minimal interference or distortion.

A porous filter (not illustrated) may be attached to the inner surface of the grille 20 or otherwise be positioned between the grille 20 and the main body 40 prevent dust or other contaminants from entering the grille 20 through the through-holes 20h. The filter may be formed of a material having fine holes, such as a piece of mesh or a nonwoven fabric. The filter may be attached to the inner surface of the grille 20 using an adhesive or a piece of double-sided tape. The filter also functions to block light such that speakers 43 and 44 (see FIG. 4) or other elements of the main body 40 are not externally visible through the through-holes 20h.

Figure 3:
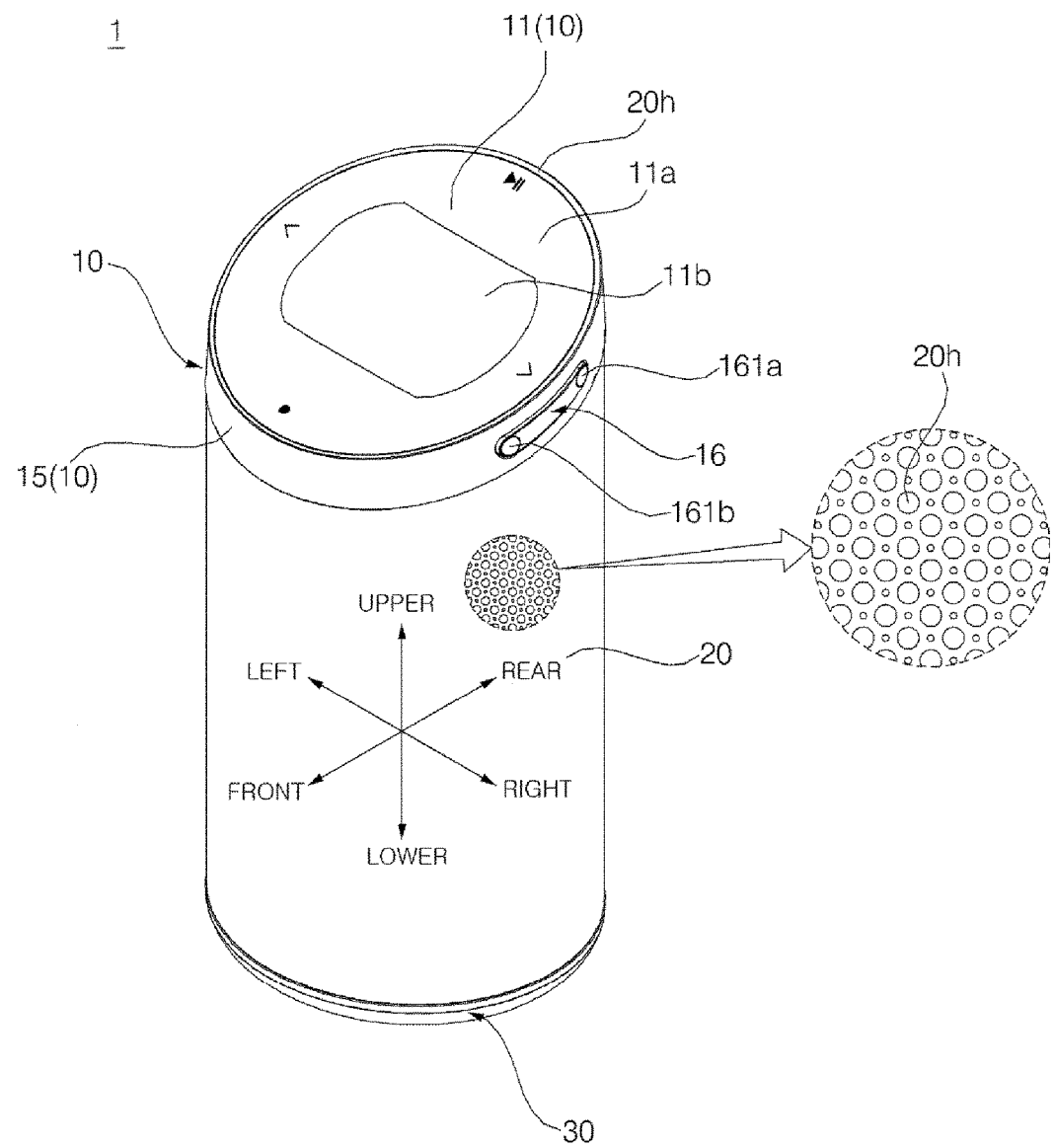
FIG. 3 is a perspective view illustrating a hub according to one exemplary embodiment of the present disclosure.

Although the through-holes 20h are shown in only a portion of the grille 20 in FIG. 3, it should be appreciated that the through-holes 20h may be formed substantially throughout the grille 20 (see, for example, FIG. 38), such that sound output from the speakers 43 and 44 may uniformly spread in all directions from the hub 1 through the through-holes 20h.

As shown in FIG. 8, the cover 10 may include a window 11, a window support 12, a display 13, a display printed circuit board (PCB) 14, and a cover housing 15. The window 11, the window support 12, the display 13, and the display PCB 14 may be positioned within an upper opening of the cover housing 15.

Figure 4:
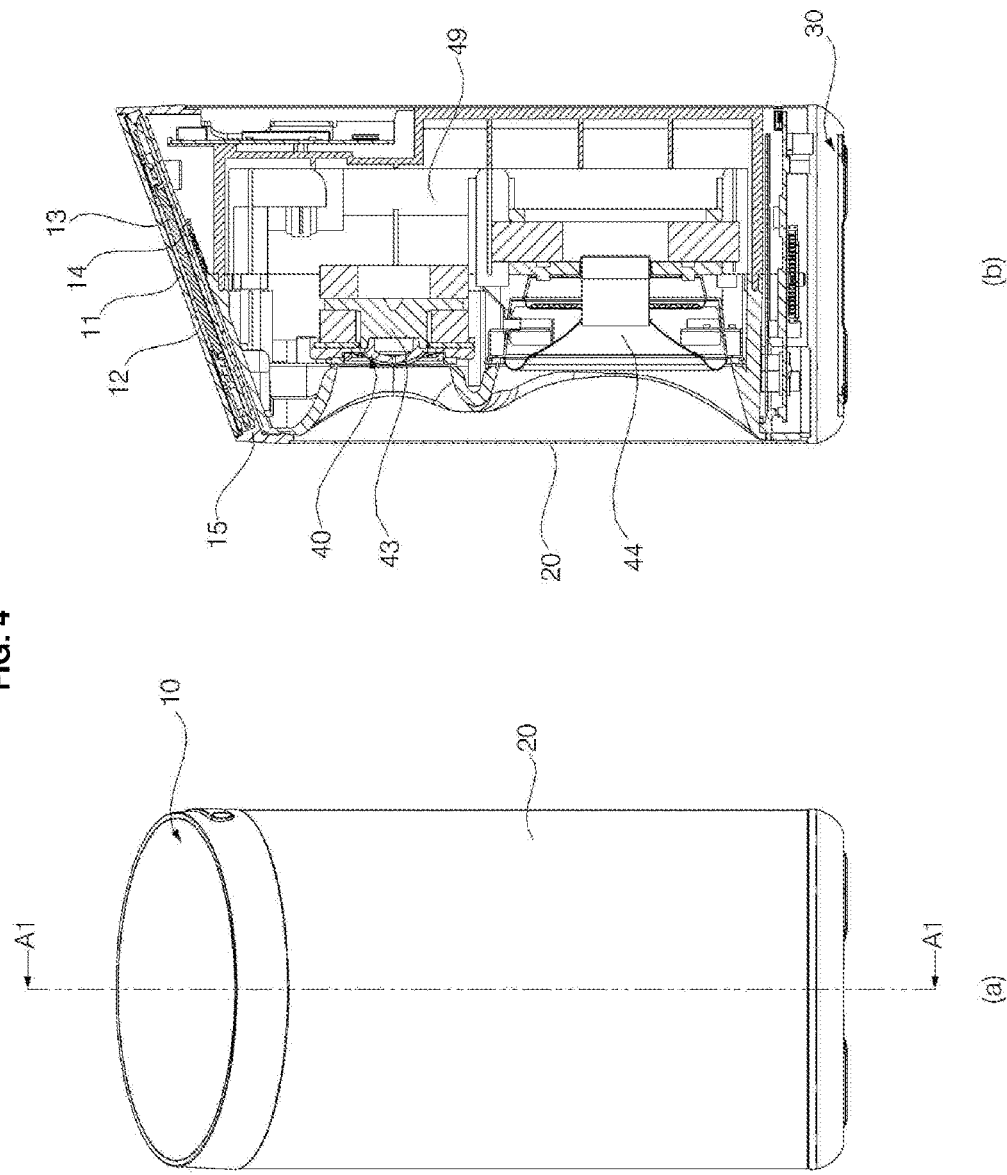
FIG. 4 is a front view and a sectional view of the hub taken along line A1-A1.
Figure 5:
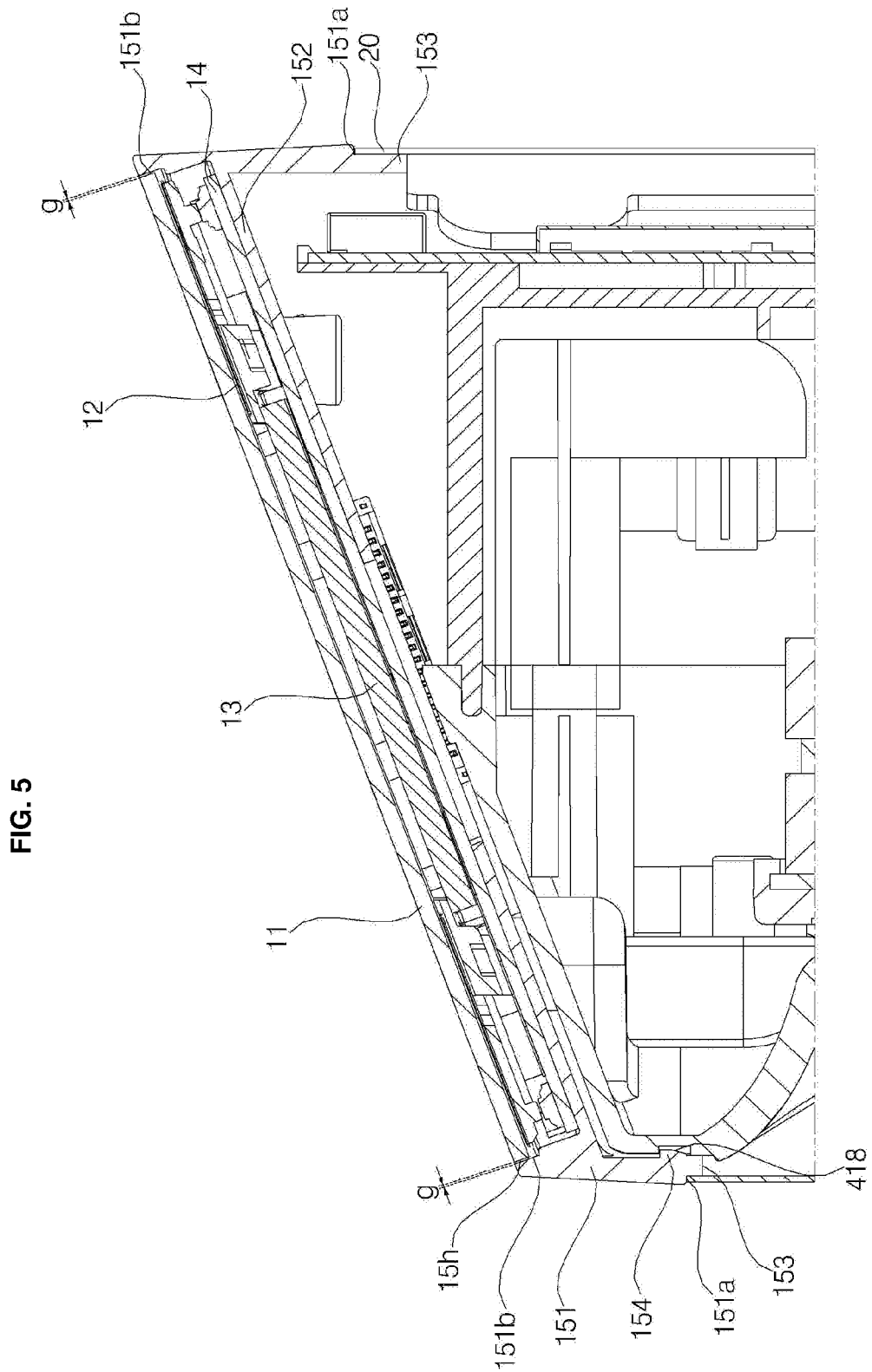
FIG. 5 is an enlarged view of a portion of FIG. 4.

Referring to FIGS. 4 and 5, the cover housing 15 may be coupled to the top of the main body 40. The cover housing 15 may be formed of a synthetic resin, plastic, metal, ceramic, or other material. The cover housing 15 may have a cylindrical shape and may include a sidewall 151 and a partition 152 that extends from the inner surface of the sidewall 151 to divide the inside of the sidewall 151 into upper and lower regions. An upper end of the sidewall 151 defines an opening 15h formed in the upper surface of the cover housing 15. The display PCB 14, the display 13, the window support 12, and the window 11 may be disposed on the partition 152 (see FIGS. 19 and 20 with regard to a detailed configuration of the cover housing 15).

A lower end 151a of the sidewall 151 may abut an upper end of the grille 20, and a fine gap may be present between the sidewall 151 and the grille 20 to provide manufacturing tolerance. Despite the gap, the outer surface of the sidewall 151 and the outer surface of the grille 20 may combine to define a substantially continuous outer contour in the upper portion of hub 1.

An upper-end holding portion 153 may extends downward from the lower end 151a of the sidewall 151 and may contact a rear surface of an upper portion of the grille 20. The upper-end holding portion 153 and the grille 20 may be coupled without using separate fastening members, such as bolts. Instead, the upper-end holding portion 153 is inserted (or fitted) into an interior space of an opening in the upper end of the grille 20. This coupling may be realized via interference-fit using the elasticity and the restoring force of the grille 20 or the upper-end holding portion 153. For example, a circumference of an interior surface of the grille 20 may be slightly smaller than a circumference an external portion of the upper-end holding portion 153 such that the grille 20, when positioned over the upper-end holding portion 153, applies a compression force against the upper-end holding portion 153.

The upper-end holding portion 153 may be located inside the lower end of the sidewall 151 (e.g, the outer surface of the cover housing 15 may be indented from the lower end 151a of the sidewall 151 to thereby form the outer surface of the upper-end holding portion 153). As such, the lower end of the sidewall 151 may be provided with a surface 157 that extends from the outer surface of the sidewall 151 to the upper-end holding portion 153 so as to be positioned opposite the upper end of the grille 20.

The cover housing 15 may include a protrusion 154, which protrudes from the inner surface of the sidewall 151, and the main body 40 may include a protrusion insertion groove 418. The protrusion 154 may be inserted into the protrusion insertion groove 418 to couple the cover housing 15 and the main body 40. The protrusion 154 may be prevented from being removed from the protrusion insertion groove 418 by the elasticity of the cover housing 15.

The upper end of the grille 20 may maintains its cylinder shape because the outer surface of the upper-end holding portion 153 may contact the inner surface of the grille 20 to prevent the upper end of the grille 20 from being unintentionally deformed. For example, the grille 20 may be formed of a thin sheet of a deformable material, such as a metal, but the upper end of the grille 20 is internally supported by the upper-end holding portion 153 and may hold a shape of exterior surface of the upper-end holding portion 153.

The cylindrical grille 20 is initially manufactured (i.e., before insertion onto the upper-end holding portion 153) by rolling a metal panel so as to form a substantially circular cross-sectional shape. When the upper-end holding portion 153 has an elliptical or other non-circular form along the lower end 151a of the sidewall 151, insertion of the upper end of the grille 20 into the upper-end holding portion 153 may cause the grille 20 to be deformed into a shape corresponding to the shape of the upper-end holding portion 153 (e.g., into an elliptical shape when the holding portion 153 has the elliptical shape) and may remain in the deformed state. Thus, if the shape of the upper-end holding portion 153 slightly varies during manufacturing, the upper end of the grille 20 may be deform to accommodate these variances while providing a reliable coupling between the upper-end holding portion 153 and the upper end of the grille 20.

Figure 6A:
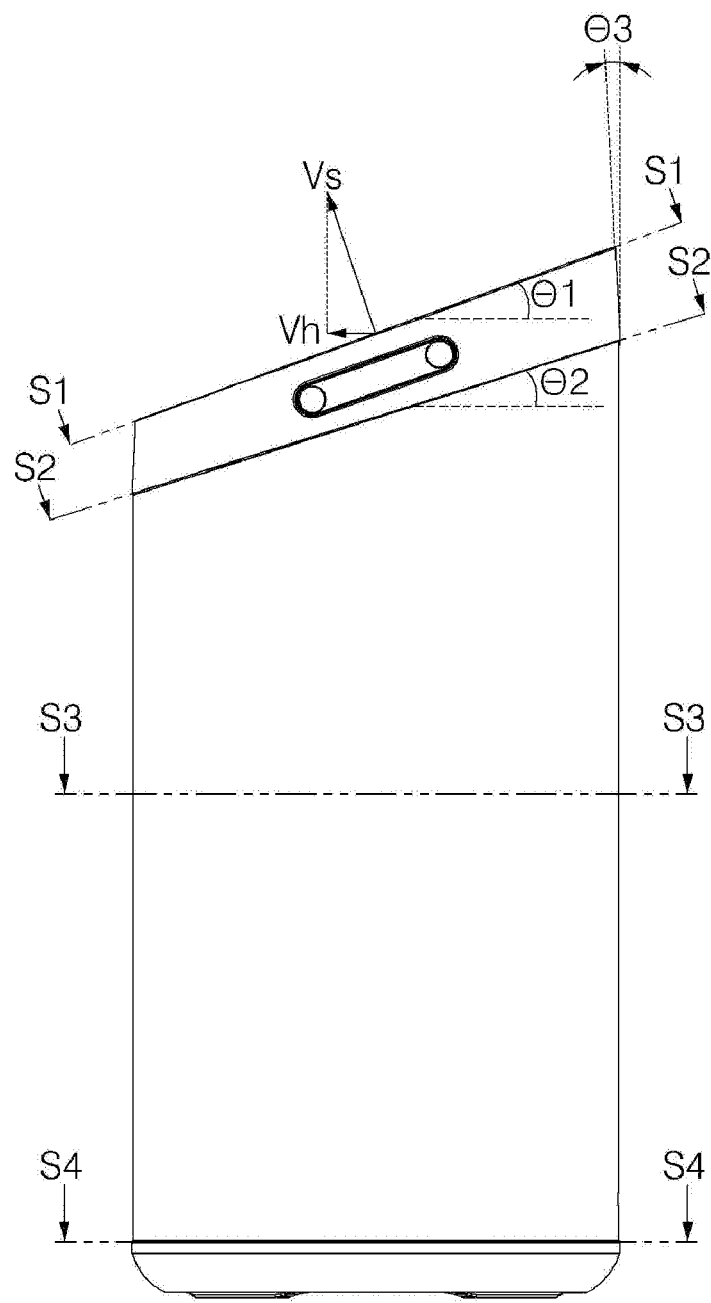
FIG. 6A is a right side view of the hub.
Figure 6B:
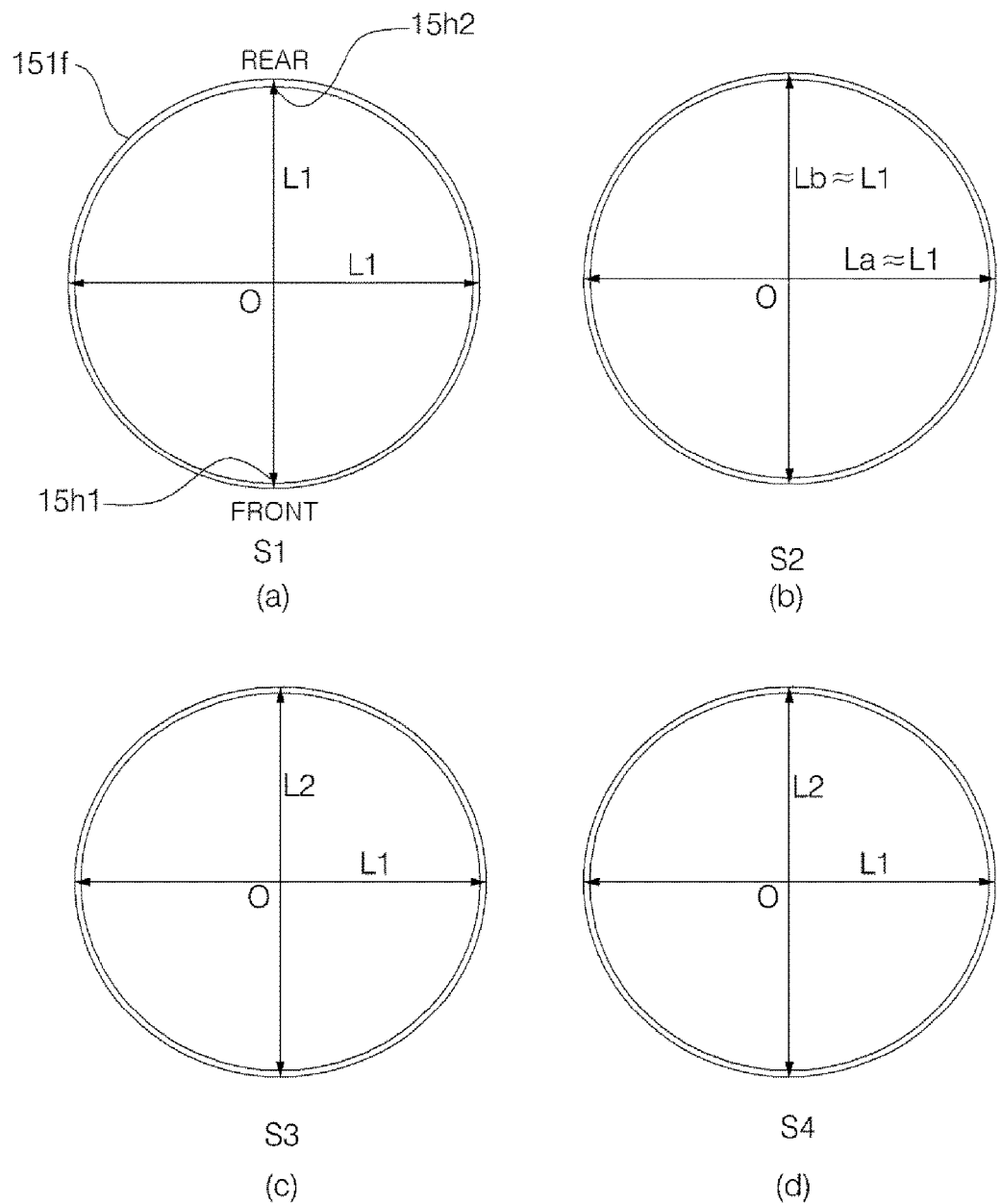
FIG. 6B illustrates cross-sections of a grille taken from respective portions illustrated in FIG. 6A.

Referring now to FIGS. 6A and 6B, the window 11 may be formed in a circular shape with a radius r. The window 11 may be inclined in cover housing 15 at a predetermined angle (which is designated by θ1 in FIG. 6A and is hereinafter referred to as a "first angle") relative to the horizontal plane. In the following discussion, a vector Vh may correspond to a horizontal plane extending from a top surface of window 11, and a normal vector Vs may project orthogonally with respect to the inclined upper surface of the window 11 (i.e., the normal Vs differs from vertical by the first angle θ1). The perceived shape of the window 11 when viewed from above (i.e., when orthogonally projected on the horizontal plane) is an ellipse having a short radius r cos θ1 in the front-to-rear direction (i.e., between the highest and lowest portions of the window 11 when positioned on in the cover housing 15) and a long radius r in the left-to-right direction (orthogonal to the front-to-rear direction along the top surface of window 11). Thus, for a unified external appearance of the hub 1, the grille 20 may have a cross-sectional shape corresponding to an ellipse in which the ratio of the short radius to the long radius is cos θ1:1). To achieve this-cross sectional shape for the upper portion of grille 20, the upper-end holding portion 153 may also have a shape corresponding to the ellipse, such that the grille 20 is deformed into the shape corresponding to the ellipse of the upper-end holding portion 153 when positioned on the upper-end holding portion 153.

The inclination angle θ1 of the window 11 relative to the horizontal plane may be determined relative an expected position of user's eyes during a typical use of the hub 1. For example, the hub 1 may be expected to be positioned at a height of approximately 1 m during typical use, such as being positioned on a kitchen countertop or a dining table. Based on the expected height position of the hub 1, the inclination angle (or top slope of the hub 1) may be selected so that the eyes of a user of typical height in front of the hub 1 are positioned at an angle close to 90 degrees with respect to the upper surface of the window 11. In this example, the inclination angle may be approximately 20 degrees, without being limited thereto.

A display panel 131 may be inclined at a predetermined angle relative to the horizontal plane so that a resulting displayed screen faces forward and upward. The display panel 131 may be inclined similar to angle θ1 of the window 11. A window support plate 121, which will be described later, may also be inclined at a substantially same angle as the display panel 131 (or the window 11).

More specifically, referring to FIGS. 6A and 6B, the upper end of the sidewall 151 of the cover housing 15 may have a circular shape with an outer diameter L1, and the lower end 151a of the sidewall 151 may be inclined at an angle θ2 relative to the horizontal plane (θ2 being less than first angle θ1, and referred to hereinafter as a "second angle") to form a shape having a diameter La in the left-to-right direction and a diameter Lb in the front-to-rear direction. The outer surface of the sidewall 151 may be inclined at a predetermined third angle θ3 relative to the vertical axis such that a first shape acquired by orthogonally projecting the cross section 51 (i.e., a top surface of glass 11) on the horizontal plane and a second shape acquired by orthogonally projecting the cross section S2 (i.e., at the joint between the cover housing 15 and the grille 20) on the horizontal plane may not accurately coincide with each other. However, La may be substantially close to L1 when θ3 is a relatively small angle (preferably, 5 degrees or less). It may be assumed hereinafter that La=L1. In addition, when the difference between θ1 and θ2 is sufficiently small (preferably, 5 degrees or less), Lb may also be close to L1, and thus it may also assumed hereinafter that Lb=L1.

Here, third angle θ3 is the angle between the outer surface of the sidewall 151 and the vertical axis and may vary along the periphery of the sidewall 151. In another example, third angle θ3 may have a substantially constant value (i.e., remain with 10% of a particular angle) over the outer surface of the sidewall 151.

Referring to the cross sections S3 and S4 in FIG. 6B, the grille 20 may have an elliptical shape having a long outer diameter L1 in the left-to-right direction and a short outer diameter L2 in the front-to-rear direction, such that L1>L2. If it is assumed that La=L1 and Lb=L1, as mentioned above, L2 may equal L1 cos θ1. Thus, the outer shape of the grille 20 orthogonally when projected on the horizontal plane may be an ellipse, with a diameter L2 in the front-to-rear direction and a longer diameter L1 in the left-to-right direction. As a result, even when the window 11 is inclined, hub 1 may have a unified elliptical or circular outer shape when viewed from above.

The sidewall 151 may be located above the grille 20 and may define an external appearance of the cover 10. The upper-end holding portion 153 may be inserted into and substantially hidden by the grille 20. Thus, upper-end holding portion 153 may not influence the external appearance of the hub 1.

Figure 21:
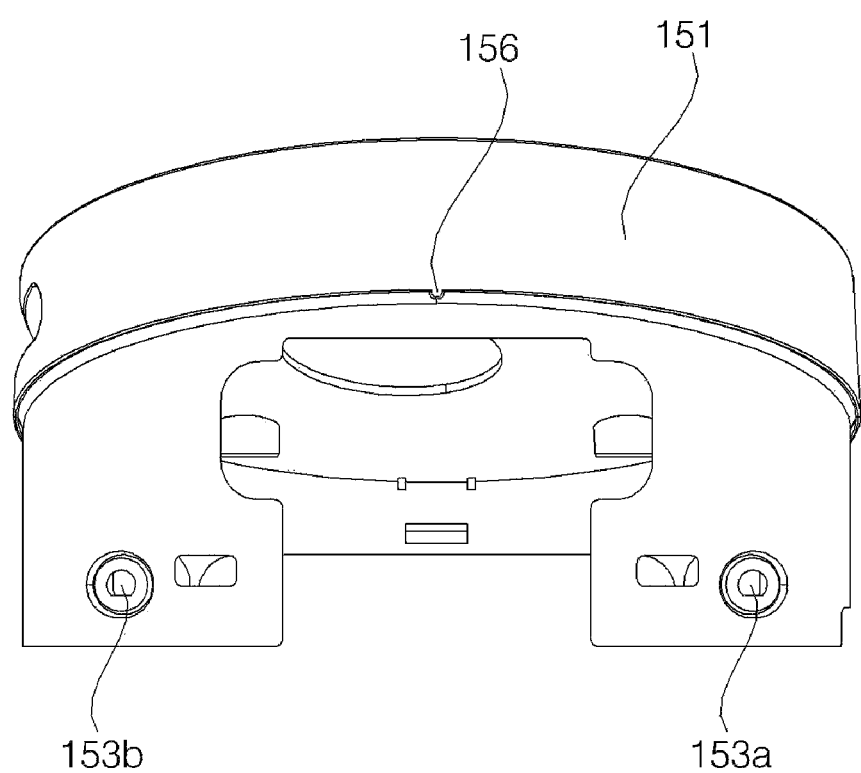
FIG. 21 is a rear view of the cover housing.

A positioning protrusion 156 may protrude from the lower end of the sidewall 151, and the grille 20 may have a positioning recess 26 (see FIG. 38) formed in the upper end thereof. The positioning protrusion 156 may be inserted into positioning recess 26 (see FIG. 21) when the grille 20 is install onto the upper-end holding portion 153 to correctly orient the grille 20 relative to the cover 10.

The window 11 may be located in the opening 15h of the cover housing 15. The window 11 may be a transparent plate having a constant thickness, and the side surface (or the outer circumferential surface) of the window 11 may be orthogonal to the upper and lower surfaces of the window 11.

The cover housing 15 may include an inner opening-defining surface 151b, which extends downward from the upper end of the cover housing 15 and parallel to the direction that the upper surface of the window 11 faces (i.e. the direction in which the normal vector Vs extends in FIG. 6A). The inner surface portion 151b at the upper end of the sidewall 151 may define the opening 15h. The opening-defining surface 151b may have a cylindrical shape that extends along the periphery of the opening 15h, and the window 11 may be located within the opening 15h so as to be surrounded by the opening-defining surface 151b. The upper end of the cover housing 15 may extend substantially to match a plane defining the upper surface of the window 11, such that the upper surface of the hub 1 is a substantially smooth plane.

Furthermore, the opening-defining surface 151b may be parallel to the vector Vs at any position. That is, even if the cover housing 15 is cut along an arbitrary plane parallel to the vector Vs, the opening-defining surface 151b may remain parallel to the vector Vs in the cut cross section. Because the opening-defining surface 151b and the side surface of the window 11 remain parallel to each other, a substantially constant gap g may be maintained between the window 11 and opening-defining surface 151b when the center of the window 11 and the center of the opening-defining surface 151b are aligned with each other along the vector Vs. As such, when viewing the hub 1 from above, the constant gap g may be maintained between the window 11 and the upper end of the cover housing 15. The gap g may be set to a minimum width that allows a side surface of the window 11 to avoid contacting the opening-defining surface 151b when the window 11 is pressed, (e.g., to operate contact switches 181a, 181b, 181c and 181d positioned under the window 11).

When the cover housing 15 is cut along an arbitrary vertical plane, the outer surface of the sidewall 151 may be parallel to the normal vector Vs, or may be gradually farther downward from the normal vector Vs. When the cover housing 15 is injection-molded, the cover housing 15 is discharged vertically downward from a first mold, which forms the sidewall 151. Thus, in order to allow the cover housing 15 to be easily separated from the first mold, the outer surface of the sidewall 151 needs to have the shape described above.

When the cover housing 15 is extends in an arbitrary vertical plane, the outer surface of the sidewall 151 may be parallel to the normal vector Vs, or may taper to extend gradually out farther downward from the window 11. When the cover housing 15 is injection-molded, the cover housing 15 may be discharged vertically downward from a first mold to form the sidewall 151. To easily separate the cover housing 15 from the first mold, the outer surface of the sidewall 151 may taper inward, as described above. To form the opening 15h in the upper surface of the cover housing 15, a second mold configured to be inserted into the opening 15h may be used. When the second mold is moved after the first mold is removed, the cover housing 15 may be separated from the second mold. In one example, a movement of the second mold may be in the same direction as the normal vector Vs.

Referring to FIGS. 8 and 15 to 18, the display PCB 14 may be disposed on the upper surface of the partition 152 and under a lower side of the display 13 to provide support to the display 13. The display PCB 14 includes a circuit that is electrically connected to the display 13, and the display 13 is connected to the circuit via a connector 132. Four contact switches 181a, 181b, 181c and 181d may be included on the upper surface of the PCB 14 at front and rear positions and left and right positions about the display 13.

The display PCB 14 may have a cross shape that extends forward and rearward and leftward and rightward from the center thereof when viewed from above. More specifically, the display PCB 14 may include a board 140 provided with a circuit, and a first board arm 145, a second board arm 146, a third board arm 147, and a fourth board arm 148, which extend, respectively, forward, rearward, leftward, and rightward from the approximately center of the board 140. The board 140 has an approximate cross shape, but the shape of the board 140 may not be symmetrical.

The board 140 of the display PCB 14 may be provided with a through-hole 140h for the passage of a support boss 122b formed on the window support 12, which will be described in other sections of the disclosure. The through-hole 140h may be formed for example, in the first board arm 145.

Figure 15:
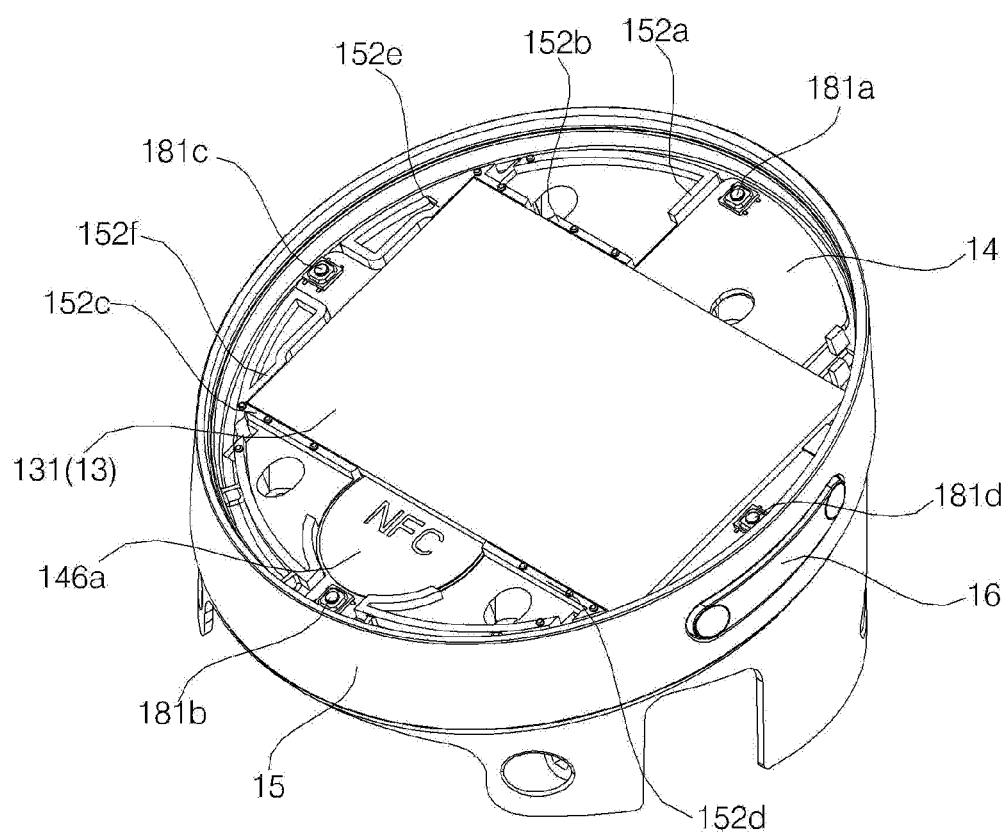
FIG. 15 illustrates an assembly of FIG. 9 after the removal of the window support.
Figure 16:
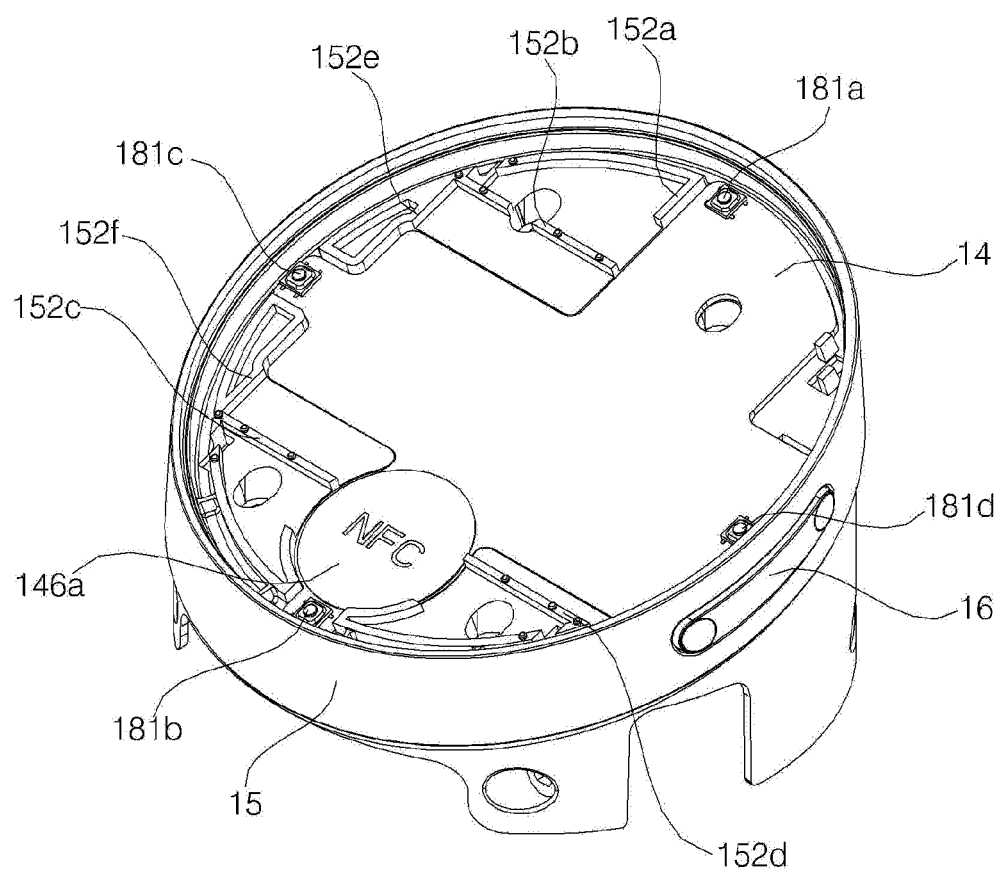
FIG. 16 illustrates the assembly of FIG. 15 after the removal of the window support.

Referring to FIGS. 15 and 16, a rib 152a may be formed on the upper surface of the partition 152 of the cover housing 15 so as to protrude from a portion that comes into contact with the periphery of the display PCB 14. The rib 152a may not have a shape corresponding to the entire periphery of the display PCB 14, and instead, the rib 152a may come into contact with a portion of the periphery of the display PCB 14. In another embodiment, a plurality of ribs 152a may be formed along the periphery of the display PCB 14. For example, the ribs 152a may be formed on with portions that come into contact with sides of the board arms 145, 146, 147 and 148 (i.e. sides extending outward from the center of the board 140).

A first contact switch 181a, a second contact switch 181b, a third contact switch 181c and a fourth contact switch 181d may be provided on the respective board arms 145, 146, 147 and 148. The contact switches 181a, 181b, 181c and 181d may be electrically connected to the circuit formed on the board 140.

Figure 7:
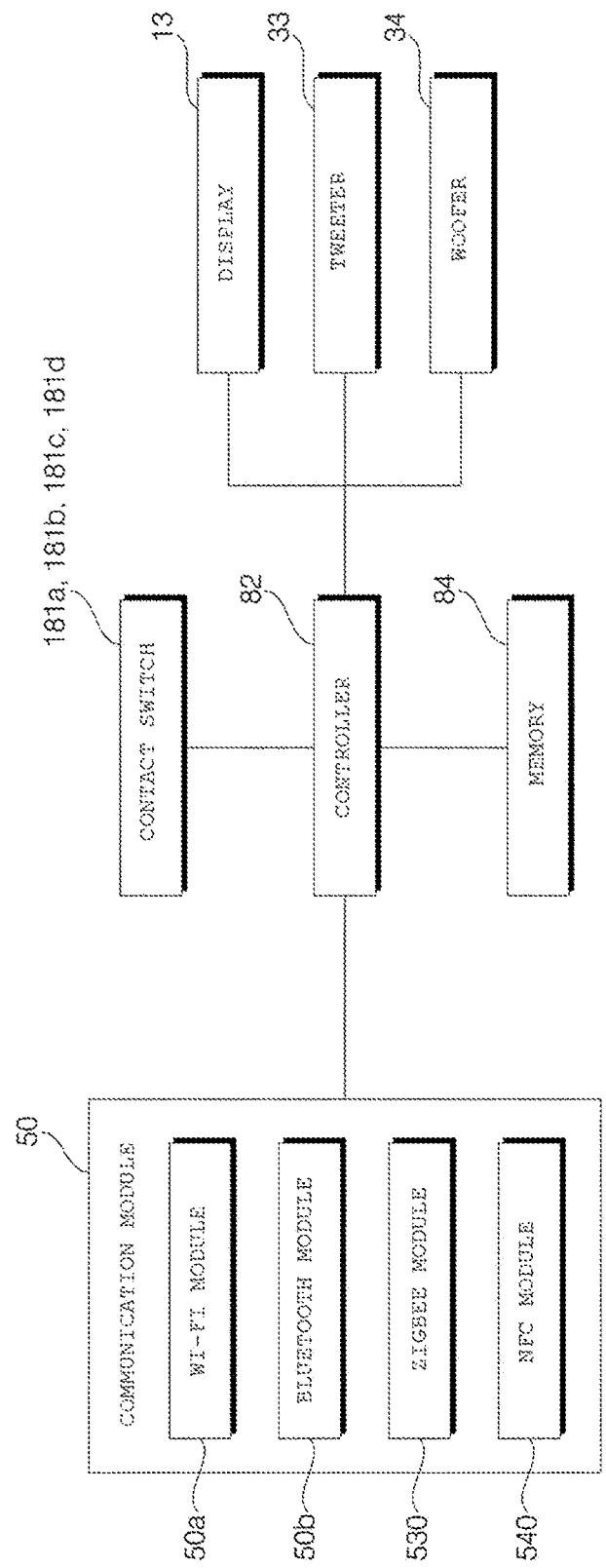
FIG. 7 is a block diagram illustrating the control relationship between major elements constituting the hub.

In one example, a near field communication (NFC) module 540 or other radio frequency identification (RFID) circuitry may be positioned on the display PCB 14 (see FIG. 7). The NFC module 540 may enable NFC communication, and may be positioned on an NFC mounting portion 146a formed on the second board arm 146. NFC is a type of radio frequency identification (RFID) technology and is a non-contact-type communication technology that uses the frequency band of 13.56 MHz. NFC provides relatively good security and is relatively inexpensive due to the short communication distance. NFC may not require a dongle (reader) used for other types of RFID because the NFC can perform both data reading and writing functions. NFC also does not require pairing between appliances.

The display 13 is a device for presenting an image upon receiving electrical signals, and may be connected to the circuit of the display PCB 14 so as to present the image in response to a control signal input through the circuit. The display 13 may include a display panel 131 for generating the image and a connector 132 for connecting the display panel 131 and the circuit of the display PCB 14 (see FIG. 8). The display panel 131 may be attached to the upper surface of the display PCB 14 using an adhesive member (e.g. a piece of double-sided tape 171 (see FIG. 17)).

The display PCB 14 may be connected to a main PCB 48, which will be described later, through a cable, wire, circuit line, or other connection (not illustrated). As such, a controller for the display 13 may be mounted on any one of the display PCB 14 or the main PCB 48. Hereinafter, the display 13 will be described as being controlled by a controller 82 (see FIG. 7) mounted on the main PCB 48, by way of example. A side surface of the main body 40 may include a vertically elongated groove 429 for receiving the cable.

A variety of pieces of information may be displayed on the screen of the display panel 131. The controller 82 may control the driving of the display panel 131 and the general operations of electric elements in the hub 1, based on programs stored in a memory 84. A user interface (UI) may be displayed via the display panel 131. This interface is realized via the execution of a program.

The interface may display playback information related to content being output by the speakers 43 and 44. For example, various information, such as playback/stop/selection menus of music, playback states, the title of a song, singer/record information, lyrics, and output volume, may be displayed.

When the hub 1 includes a communication module 50, the UI may display information exchanged through the communication module 50. For example, the interface may display a menu for controlling the accessories 2, 3a and 3b, which communicate with the communication module 50, or may display information processed based on the information transmitted from the accessories 2, 3a and 3b. For instance, the interface may display the network connection state of the communication module 50 or other information, such as, for example, the temperature, humidity, and brightness sensed by sensors provided in the accessory 2. In addition, the interface may display a menu for controlling the output of the speakers 43 and 44. For example, the interface may display a menu for selecting a song or recording album to be output via the speakers 43 and 44, information related to the recording album or song (e.g. the title of the song, the recording album name, or the singer), or the volume of audio output.

The menus displayed on the interface may be manipulated via the contact switches 181a, 181b, 181c and 181d. The processing the output signals of the respective contact switches 181a, 181b, 181c and 181d may be determined by a program stored in the memory 84. For example, menus options displayed on the interface at left and right positions may be selected in response to operating signals of the first and second contact switches 181a and 181b, and the menus displayed on the interface at upper and lower positions may be selected in response to operating signals of the third and fourth contact switches 181c and 181d.

The user may use a Bluetooth module 50b to communicate with an external device, such as a smart phone, a tablet computer, or a laptop computer. As such, various kinds of data, such as music and images, may be acquired from the external device and stored in the memory 84. In particular, the controller 82 may control the speakers 43 and 44 so that music stored in the memory 84 is output, and various functions, such as the selection, playback, and stoppage of music, may be realized via the contact switches 181a, 181b, 181c and 181d.

Figure 18:
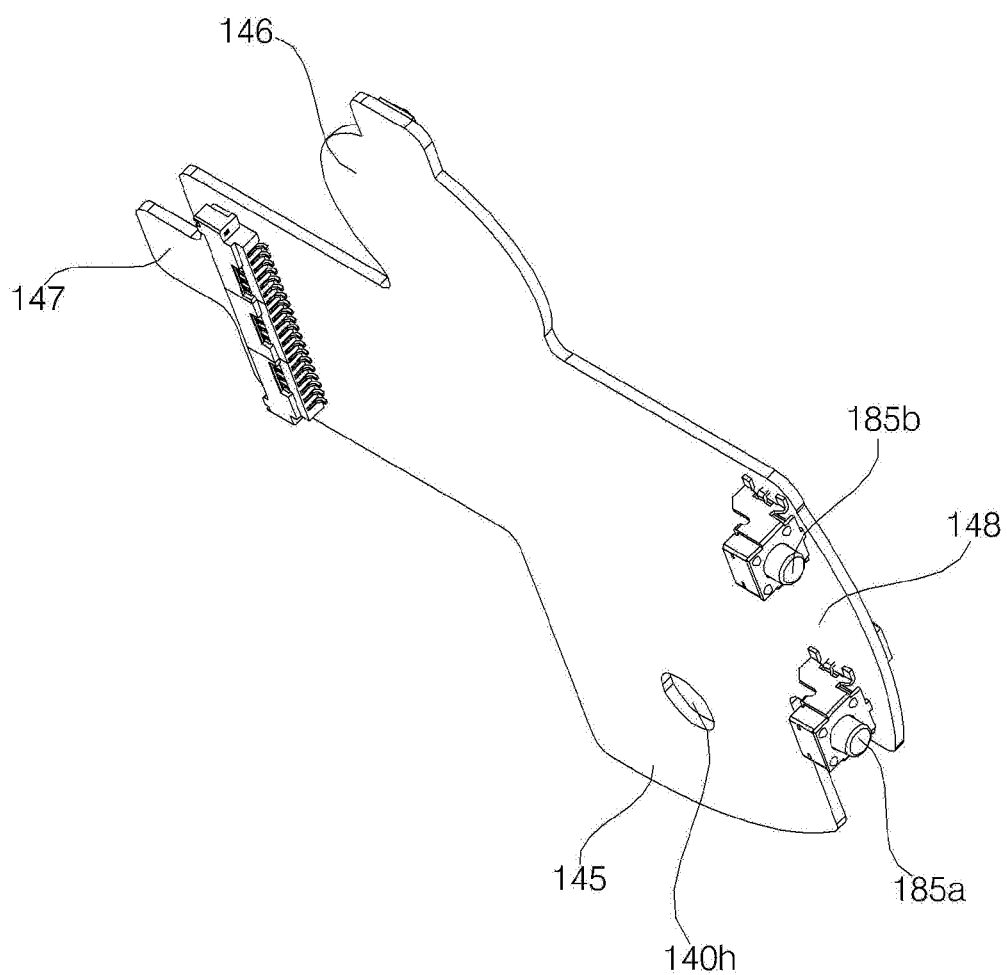
FIG. 18 is a perspective view illustrating the lower surface of the display PCB.

Referring to FIG. 18, a pair of volume adjustment switches 185a and 185b may be provided on the lower surface of the board 140. The volume adjustment switches 185a and 185b function to enable a user to adjust the volume of the speakers 43 and 44 provided in the main body 40. The volume adjustment switches 185a and 185b may be configured as respective contact switches, and may be connected to the circuit of the display PCB 14. The volume adjustment switches 185a and 185b may include a first volume adjustment switch (or a volume-increasing switch) 185a for increasing the volume of the speakers 43 and 44 whenever it is pushed or otherwise selected by the user, and a second volume adjustment switch (or a volume-decreasing switch) 185b for decreasing the volume of the speakers 43 and 44 whenever it is pushed or otherwise selected by the user. The volume adjustment switches 185a and 185b may be disposed, for example, on the fourth board arm 148 of the display PCB 14. Operable terminals (i.e., parts to be pushed for switching) of the volume adjustment switches 185a and 185b may protrude toward the sidewall 151 of the cover housing 15 to be contacted by a user.

Figure 19:
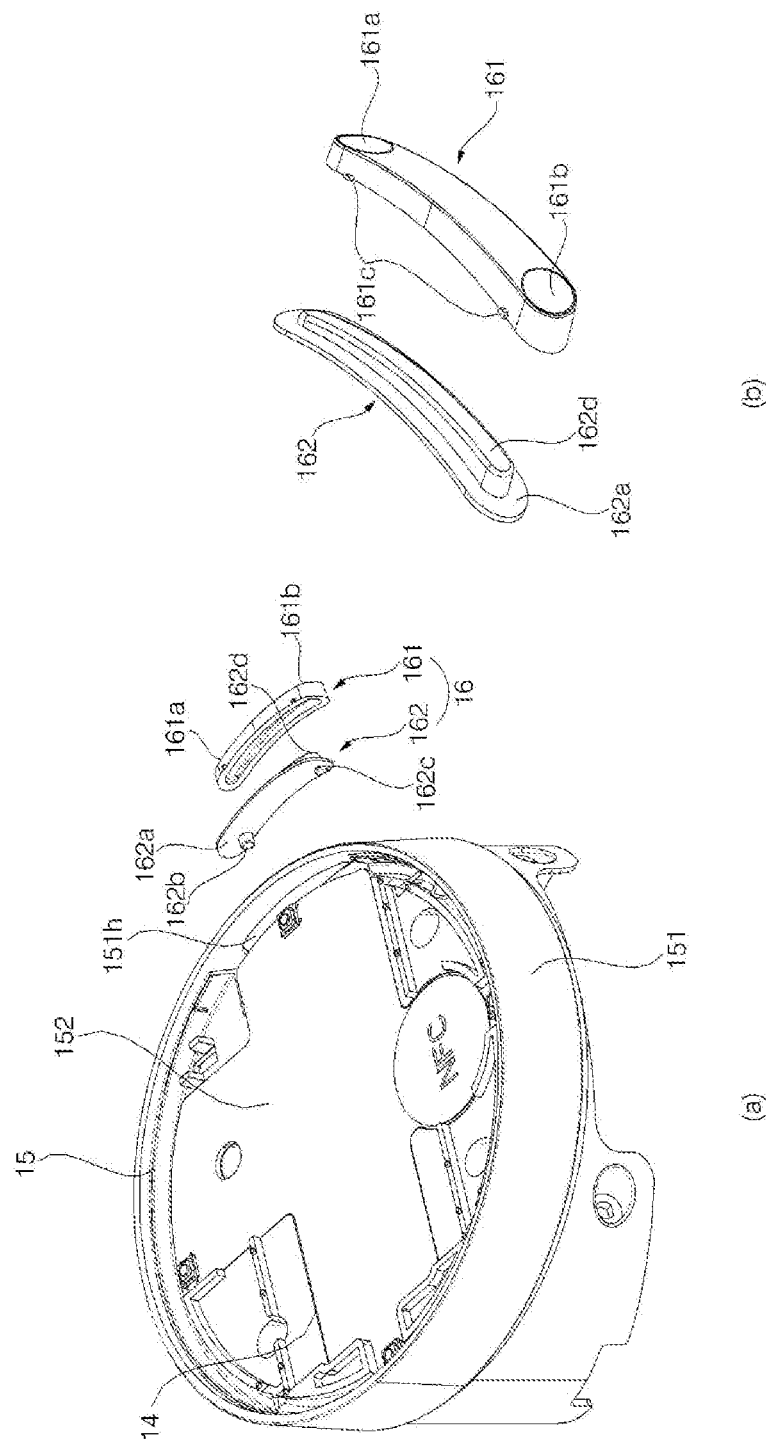
FIG. 19 is an exploded perspective view of the cover and a volume button.
Figure 20:
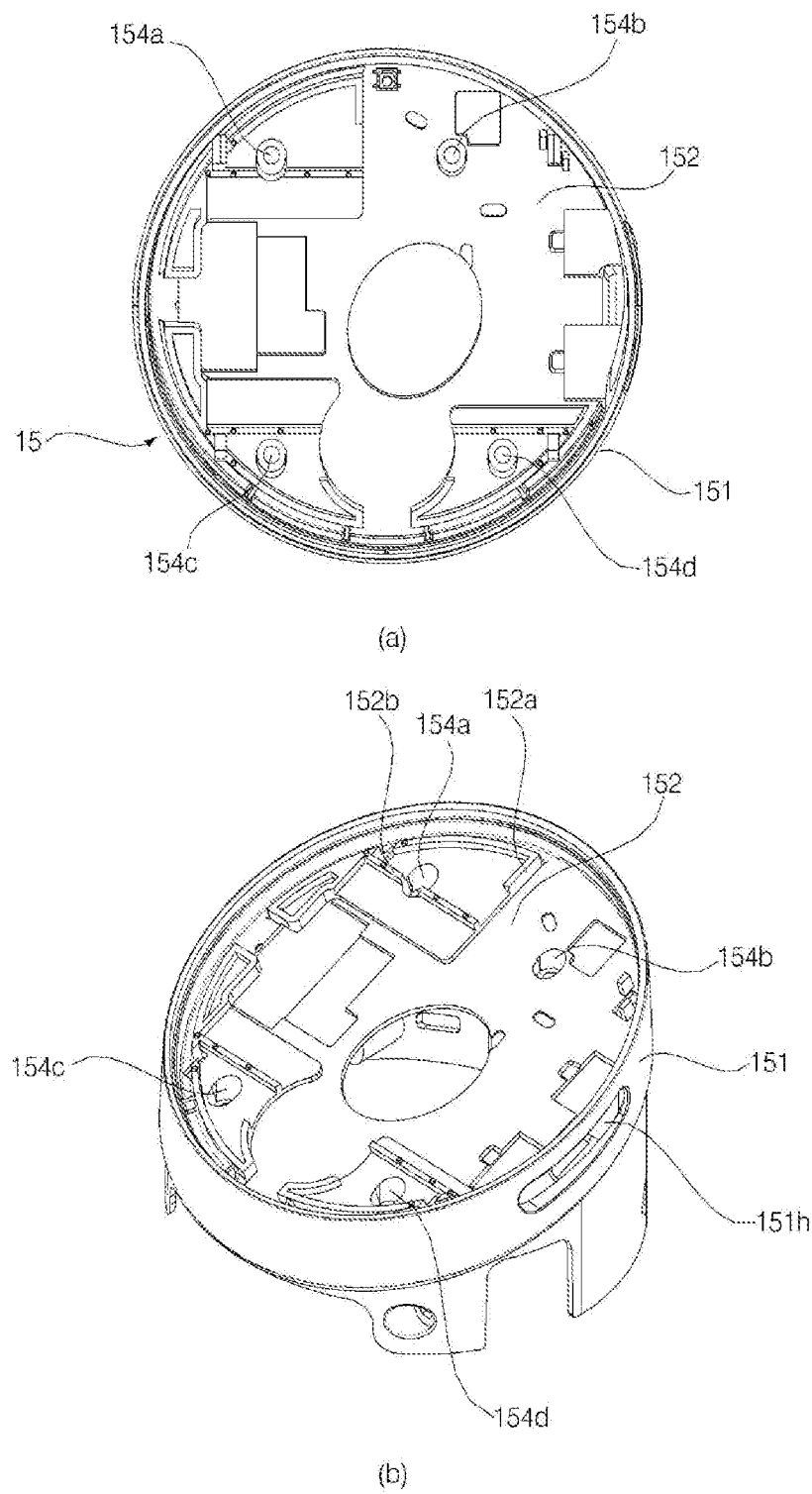
FIG. 20 is a plan view and a perspective view of a cover housing.

Referring to FIGS. 19 and 20, the sidewall 151 of the cover housing 15 may be provided with an opening 151h for the installation of a volume button 16. The volume button 16 may include a dome 161 and an elastic pad 162.

The elastic pad 162 may be formed as a single element of an elastic material, such as rubber or plastic. The elastic pad 162 may a plate form that extends a long length in the circumferential direction of the sidewall 151. The elastic pad 162 may include a support portion 162a located inside the cover housing 15, a pair of switch-operable protrusions 162b and 162c protruding from the inner surface of the support portion 162a, and a dome fixing protrusion 162d protruding from the outer surface of the support portion 162a so as to be exposed outward through the opening 151h. The support portion 162a may be larger than the opening 151h and is generally not removed outward from the cover housing 15 through the opening 151h.

The dome 161 may be formed of a synthetic resin, plastic, ceramic, or other material and may have has a groove formed in one surface thereof to receive the dome fixing protrusion 162d. The dome fixing protrusion 162d may be interference-fitted into the groove to be coupled to the dome 161 by the elasticity or the restoring force of the constituent material of the dome fixing protrusion 162d. In another example, the dome 161 and the dome fixing protrusion 162d may be coupled to each other using an adhesive member, such as a piece of double-sided tape.

The dome 161 may include an anti-separation protrusion 161c protruding from the upper surface and/or the lower surface thereof. The anti-separation protrusion 161c may be located inside the cover housing 15 and may contact the periphery of the opening 151h to prevent the dome 161 from being separated from the cover housing 15 through the opening 151h. Although FIG. 19 depicts a pair of anti-separation protrusions 161c formed on each of the upper surface and the lower surface of the dome 161 in one exemplary embodiment, the present disclosure is not limited thereto.

When the elastic pad 162 is positioned in the opening 151h, the switch-operable protrusions 162b and 162c may be located at respective positions corresponding to the first volume adjustment switch 185a and the second volume adjustment switch 185b. When a volume-increasing manipulation portion 161b or a volume-decreasing manipulation portion 161b of the dome 161 is pressed, the switch-operable protrusions 162b and 162c of the elastic pad 162 operate the volume-increasing switch 185a or the volume-decreasing switch 185b, thereby enabling the volume of the speakers 43 and 44 to be adjusted.

Referring to FIGS. 8 to 14, the window support 12 may have an approximately circular shape and may be disposed above the display 13. The window support 12 may be an injection-molded component formed of a synthetic resin, plastic, or other material and, thus, formed as a single element. The window support 12 may have an opening 12h, such that the screen 131 of the display 13 is exposed through the opening 12h to present a generated image when the display 13 is positioned under the window support 12.

The opening 12h may be formed at a position corresponding to the display panel 131, which is located below the window support 12. The opening 12h may be slightly smaller than the display panel 131 so that window support 12 convers wires and/or circuitry located at a periphery of the display panel 131. The screen generated on the display panel 131 may be substantially visible through the opening 12h.

The display panel 131 may have a rectangular shape in which a left-to-right length is longer than a front-to-rear length when viewed by a user. As such, the opening 12h may also have a corresponding shape in which the left-to-right length of the opening 12h is longer than its front-to-rear length, so as to correspond to the shape of the display panel 131.

The window support 12 may include the window support plate 121, which defines the opening 12h and supports the window 11 disposed on the upper surface thereof. The window support 12 may include manipulation protrusions 126a, 126b, 126c and 126d and a plurality of support bosses 122a, 122b, 122c and 122d, which protrude downward from the lower surface of the window support plate 121 (i.e., away from glass 11).

The support bosses 122a, 122b, 122c and 122d may vertically extend downward from the window support 12. When the window 11 in inclined, the window support plate 121 may also be inclined substantially at the first angle θ1 relative to a horizontal plane to support the inclined window 11. In this situation, the support bosses 122a, 122b, 122c and 122d may not extend perpendicular to the window support plate 121 and, instead, may extend at a complementary angle 90-θ1 from the window support plate 121. In other words, the support bosses 122a, 122b, 122c and 122d may extend in a substantially vertical direction from the inclined window support plate 121.

Figure 9:
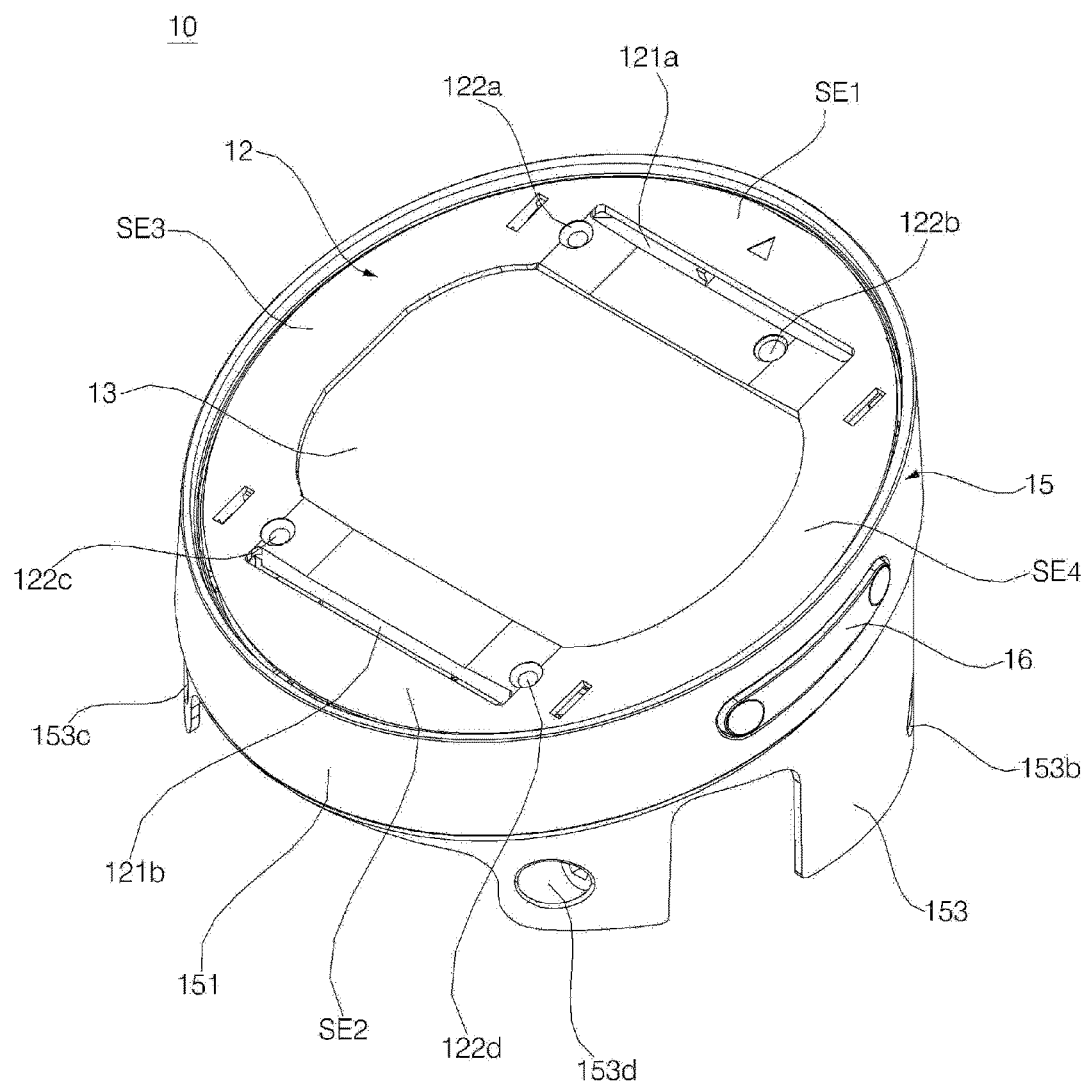
FIG. 9 illustrates the cover after the removal of a window.

Hereinafter, the window support plate 121, as illustrated in FIG. 9, may be divided into a first area SE1 located at the rear side of the opening 12h, a second area SE2 located at the front side of the opening 12h, a third area SE3 located at the left side of the opening 12h, and a fourth area SE4 located at the right side of the opening 12h. At least one of the support bosses 122a, 122b, 122c and 122d may be provided in each of the first area SE1 and the second area SE2. To enable the window support plate 121 to be stably supported without shaking, the four support bosses 122a, 122b, 122c and 122d may be formed, and among these, the first support boss 122a and the second support boss 122b may be located in the first area SE1, and the third support boss 122c and the fourth support boss 122d may be located in the second area SE2.

The support bosses 122a, 122b, 122c and 122d may be coupled to the cover housing 15 so as to support the window support plate 121. Additionally, the window support plate 121 may be spaced apart from the display PCB 14. At least one of the support bosses 122a, 122b, 122c and 122d may pass through one of four regions, which are divided by the board arms 145, 146, 147 and 148, to thereby be coupled to the partition 152, and at least one of the other support bosses 122a, 122b, 122c and 122d may pass through the through-hole 140h formed in the board arm 145 to thereby be coupled to the partition 152.

Figure 17:
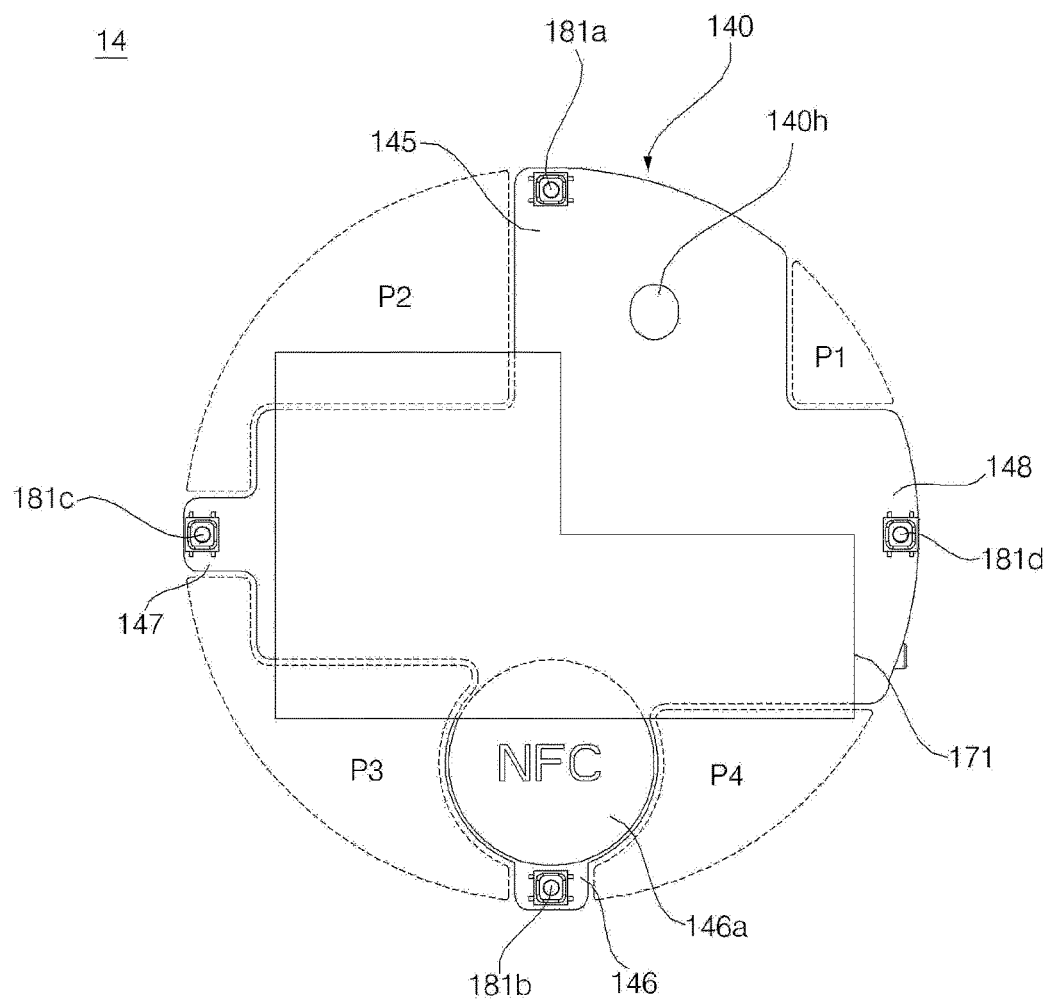
FIG. 17 is a plan view of a display PCB.

Referring to FIG. 17, the inside of the cover housing 15 may be divided into four regions P1, P2, P3 and P4 by the four board arms 145, 146, 147 and 148 having the cross shape. Hereinafter, the four divided regions P1-P4 may be are ordered so that P1 is defined as a first quadrant region, P2 is defined as a second quadrant region, P3 is defined as a third quadrant region, and P4 is defined as a fourth quadrant region.

The first support boss 122a, the third support boss 122c, and the fourth support boss 122d may respectively pass through the second quadrant region P2, the third quadrant region P3, and the fourth quadrant region P4 to thereby be coupled to the partition 152, and the second support boss 122b may pass through the through-hole 140h formed in the first board arm 145 to thereby be coupled to the partition 152.

The support bosses 122a, 122b, 122c and 122d and the partition 152 of the cover housing 15 may be directly coupled such that the support bosses 122a, 122b, 122c and 122d contact and are affixed are to the partition 152. For example, the support bosses 122a, 122b, 122c and 122d may be coupled to insertion bosses 154a, 154b, 154c and 154d formed on the partition 152. The partition 152 of the cover housing 15 may have the first insertion boss 154a, the second insertion boss 154b, the third insertion boss 154c, and the fourth insertion boss 154d, which are located at positions respectively corresponding to the first support boss 122a, the second support boss 122b, the third support boss 122c and the fourth support boss 122d. The insertion bosses 154a, 154b, 154c and 154d may protrude downward from the partition 152, and may extend parallel to the respective corresponding support bosses 122a, 122b, 122c and 122d.

The first support boss 122a, the second support boss 122b, the third support boss 122c and the fourth support boss 122d may be respectively inserted into the first insertion boss 154a, the second insertion boss 154b, the third insertion boss 154c and the fourth insertion boss 154d. The lower ends of the insertion bosses 154a, 154b, 154c and 154d may include fastening holes to receive fastening bolts 19 or other connector. The bolts 19 may pass upward through the respective fastening holes of the insertion bosses 154a, 154b, 154c and 154d and fastened to the support bosses 122a, 122b, 122c and 122d.

Referring to FIGS. 15 to 17, the cover housing 15 may include one or more ribs 152a, 152b, 152c, 152d, 152e and 152f, which protrude upward from the partition 152. At least one of the ribs 152a, 152b, 152c, 152d, 152e and 152f may contact the periphery of the display panel 131. The display PCB 14 is positioned on the upper surface of the partition 152 (i.e., between the partition 152 and the display panel 131), the ribs 152b, 152c, 152d, 152e or 152f may be positioned to avoid contact with the display PCB 14 and extend to support the periphery of the display panel 131. Accordingly, the regions P1, P2, P3 and P4, divided by the display PCB 14, may function as paths that pass the ribs 152b, 152c, 152d, 152e and 152f around the display PCB 14. Thus, the ribs 152b, 152c, 152d, 152e and 152f may pass through the regions P1, P2, P3 and P4 (divided by the board arms 145, 146, 147 and 148 of the display PCB 14) to contact with the edge of the display panel 131. The ribs 152b, 152c, 152d, 152e and 152f may function to position and secure the display panel 131.

The display panel 131 may have a rectangular shape, and at least one of four sides of the display panel 131 may come into contact with the ribs 152b, 152c, 152d, 152e and 152f. Each of a pair of parallel sides of the display panel 131 may come into contact with a rib. In an exemplary embodiment, the horizontal sides (or the sides extending in the left-to-right directions) of the display panel 131 come into contact with the ribs 152b, 152c and 152d. The ribs 152b, 152c and 152d may extend a long length along the horizontal sides of the display panel 131.

The ribs 152b, 152c and 152d may respectively pass through different regions among the four regions P1, P2, P3 and P4, which are divided by the board arms 145, 146, 147 and 148. In the exemplary embodiment, the rib 152b passes through the second quadrant region P2, the rib 152c passes through the third quadrant region P3, and the rib 152d passes through the fourth quadrant region P4, whereby the ribs 152b, 152c and 152d come into contact with the rear side (the upper horizontal side in the drawing), the left side, and the front side (the lower horizontal side in the drawing) of the display panel 131.

In some exemplary embodiments, a rib may be additionally formed to pass through the first quadrant region P1 and/or the fourth quadrant region P4 and contact with the right side of the display panel 131. One rib (e.g. the rib 152b), which comes into contact with any one side of the display panel 131, and another rib (e.g. the rib 152c), which comes into contact with another side of the display panel 131 may respectively pass through different regions (e.g. the regions P2 and P3) among the regions P1, P2, P3 and P4, which are divided by the board arms 145, 146, 147 and 148.

The window support plate 121 may be bent about the respective support bosses 122a, 122b, 122c and 122d when pressure is applied by a user (i.e., the user presses portions of the window 11 to input commands to the hub 1). The window support plate 121 may be elastically restored to an original shape when the applied pressure is removed.

The first manipulation protrusion 126a, the second manipulation protrusion 126b, the third manipulation protrusion 126c, and the fourth manipulation protrusion 126d of the window support 12 may be provided at positions respectively corresponding to the first contact switch 181a, the second contact switch 181*b*, the third contact switch 181*c*, and the fourth contact switch 181*d*, which are provided on the display PCB 14. As such, when pressure is applied to any one of the first area SE1, the second area SE2, the third area SE3 and the fourth area SE4 of the window support 2 through the window 11, the manipulation protrusion (e.g. the first manipulation protrusion 126*a*), which falls in the area to which the pressure is applied (e.g. the first area SE1), operates the contact switch located therebelow (e.g. the first contact switch 181*a*).

The window support 12 may further include a first tab 125*a*, a second tab 125*b*, a third tab 125*c* and a fourth tab 125*d*, which extend downward from the window support plate 121. The tabs 125*a*, 125*b*, 125*c* and 125*d* may protrude in the direction perpendicular to the bottom surface of the window support plate 121. Tab insertion recesses may be formed in the upper surface of the partition 152 of the cover housing 15 at positions corresponding to the tabs 125*a*, 125*b*, 125*c* and 125*d*.

The window 11 may be a circular plate. The window 11 may be attached to the upper surface of the window support plate 121 of the window support 12 using, for example, a piece of double-sided tape or an adhesive. To allow a user to view the screen displayed on the display 13 through the window 11, at least a portion of the window 11 over the display 13 may be formed of transparent material, such as acrylic, plastic, or glass. The entire window 11 may not be transparent. For example, a peripheral surface area of the window 11 may be opaque so that a user sees only the screen of the display panel 131 exposed through the opening 12*h* of the window support 12 but does not see the window support 12. In this example, only a predetermined area 11*b* of the window 11, which approximately corresponds to the opening 12*h*, may be transparent. The remaining area 11*a* of the window may be colored opaque or translucent, or a non-transparent film or other material (e.g., the double-sided tape used to couple the window 11 to the upper surface of the window support plate 121) may be attached to a surface of the remaining area 11*a* of window 11 (see FIG. 3).

As previously described, the window 11 may be formed of a clear elastic material such as acrylic or plastic. The window 11 may be bent or otherwise be deformed when a user applies pressure within a given range to a top surface of the window (e.g., the user touches the window 11 to input commands to the hub 1). The bending of window 11 may enable a smoother operation of the contact switches 181*a*, 181*b*, 181*c* and 181*d*. The window 11 may return to the original shape when the applied pressure is removed. In another example, the window support plate 121 and not window 11 bends in response to the user pressure, such that the window 11 moves in response to pressure based on the bending of the window support plate 121.

The opening 12*h* on the window support plate 121 has a longer horizontal length (or left-to-right length) than the vertical length (or front-to-rear length). Consequently, the third area SE3 and the fourth area SE4, which correspond to the left and right sides of the opening 12*h*, may not be suitable positions for the support bosses 122*a*, 122*b*, 122*c* and 122*d*. Due to the circular shape of the window 11, the distance from the periphery of the opening 12*h* to the third manipulation protrusion 126*c* or the fourth manipulation protrusion 126*d* in the third area SE3 and the fourth area SE4 may be shorter than the distance from the periphery of the opening 12*h* to the first manipulation protrusion 126*a* in the first area SE1 or the second manipulation protrusion 126*b* in the second area SE2. Since the third manipulation protrusion 126*c* and the fourth manipulation protrusion 126*d* may be relatively closer to the support boss when the support boss is formed in the third area SE3 or the fourth area SE4, a user may need to apply relatively larger pressure to the window support plate 121 in order to operate the third manipulation protrusion 126*c* and the fourth manipulation protrusion 126*d*. To enable more uniform contact pressures, the first support boss 122*a* and the second support boss 122*b* may be formed in the first area SE1, and the third support boss 122*c* and the fourth support boss 122*d* may be formed in the second area SE2.

When viewed from the top side, the first manipulation protrusion 126*a* may be located outside (i.e., radially further from a center of window support plate 121) the first support boss 122*a* and the second support boss 122*b* within the cover housing 15. Similarly, the second manipulation protrusion 126*b* may be located outside the third support boss 122*c* and the fourth support boss 122*d* within the cover housing 15.

Figure 10A:
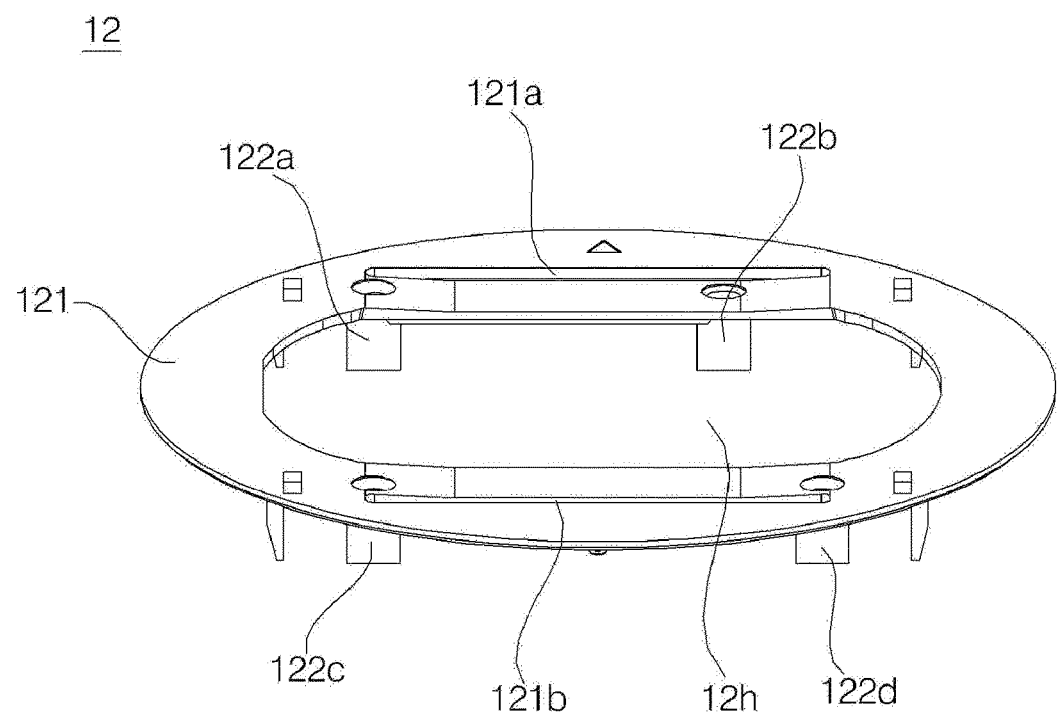
FIG. 10A is a perspective view illustrating the upper surface of a window support.
Figure 10B:
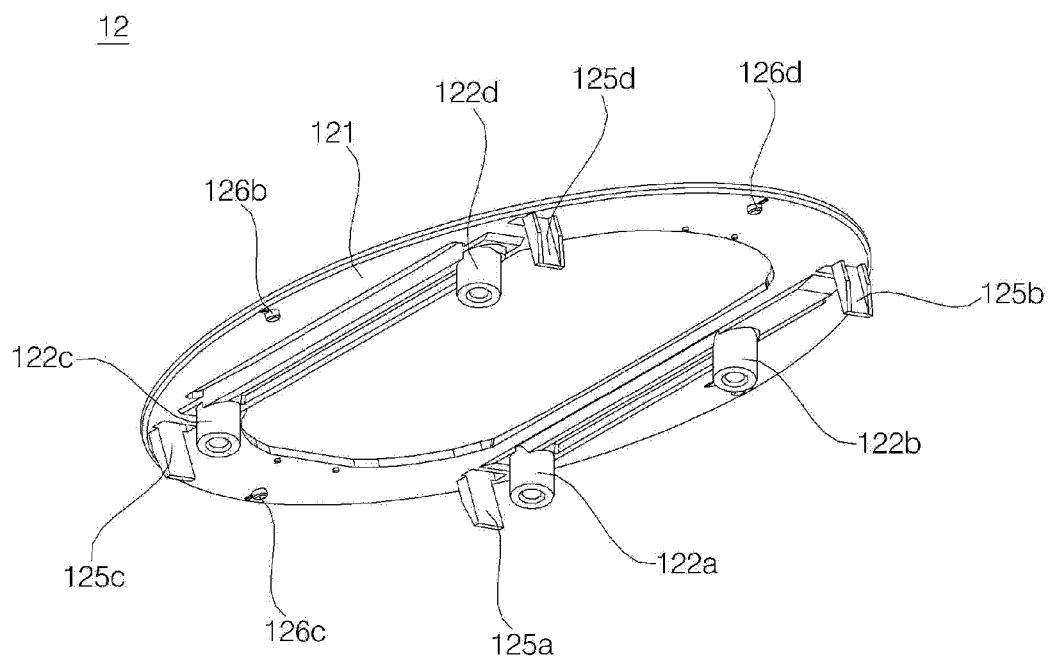
FIG. 10B is a perspective view illustrating the lower surface of the window support.
Figure 10C:
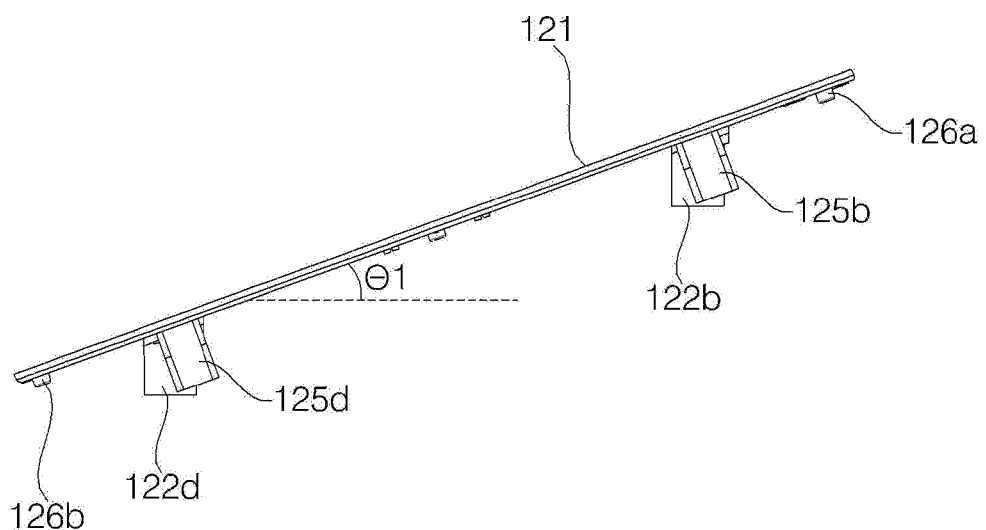
FIG. 10C is a right side view of the window support.
Figure 10D:
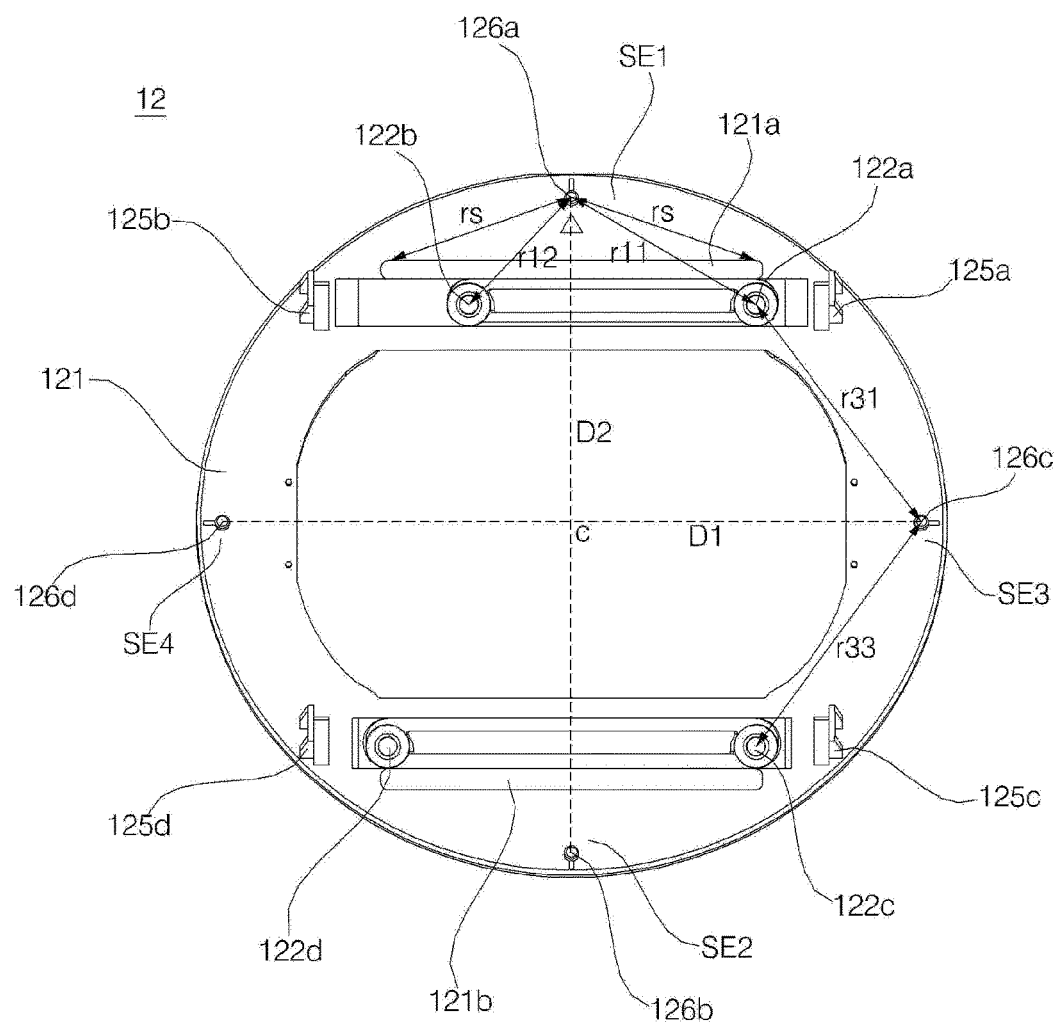
FIG. 10D is a bottom view of the window support.
Figure 11:
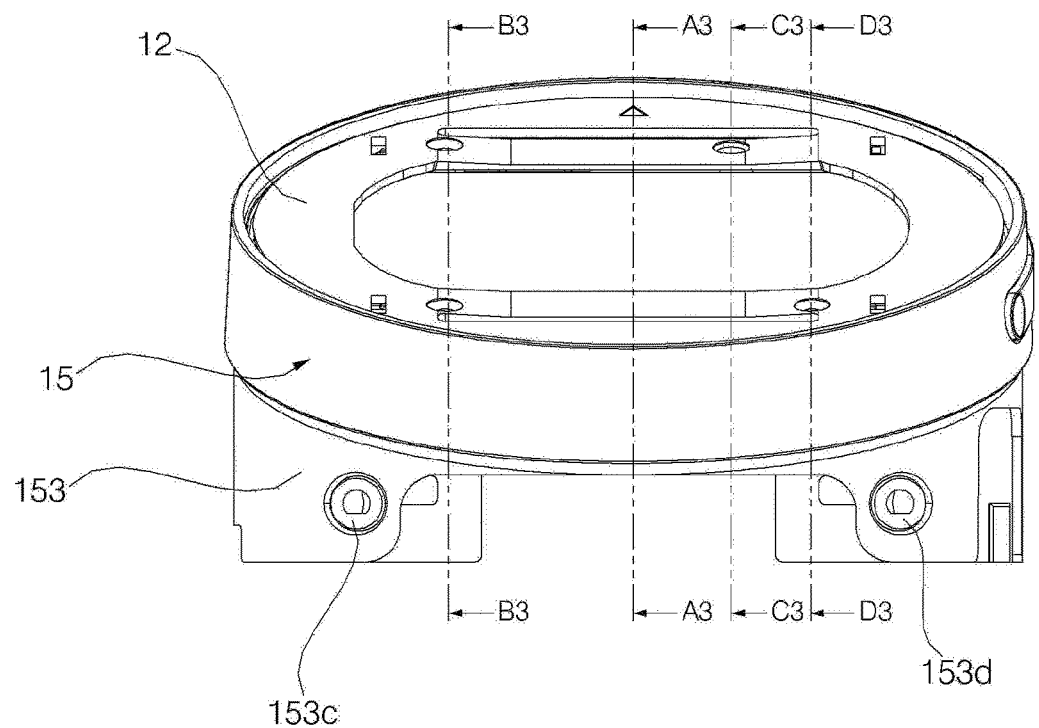
FIG. 11 is a front view of the cover illustrated in FIG. 9.
Figure 12A:
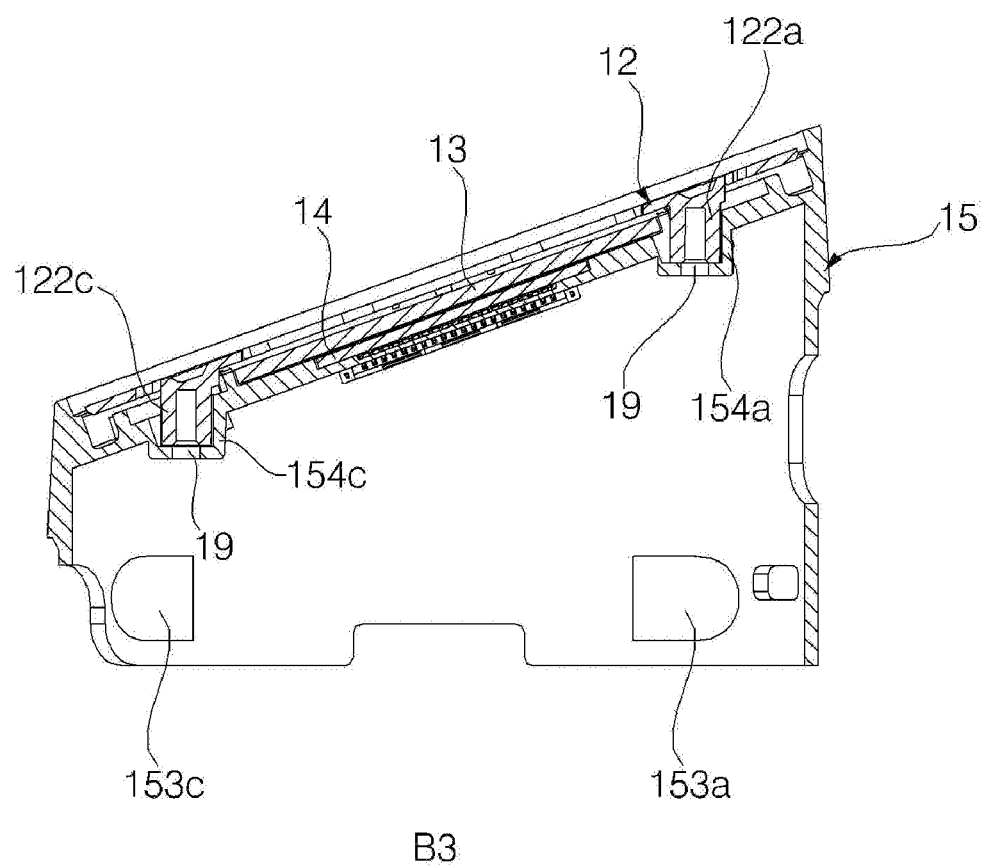
FIG. 12A is a sectional view taken along line B3-B3 of FIG. 11.
Figure 12B:
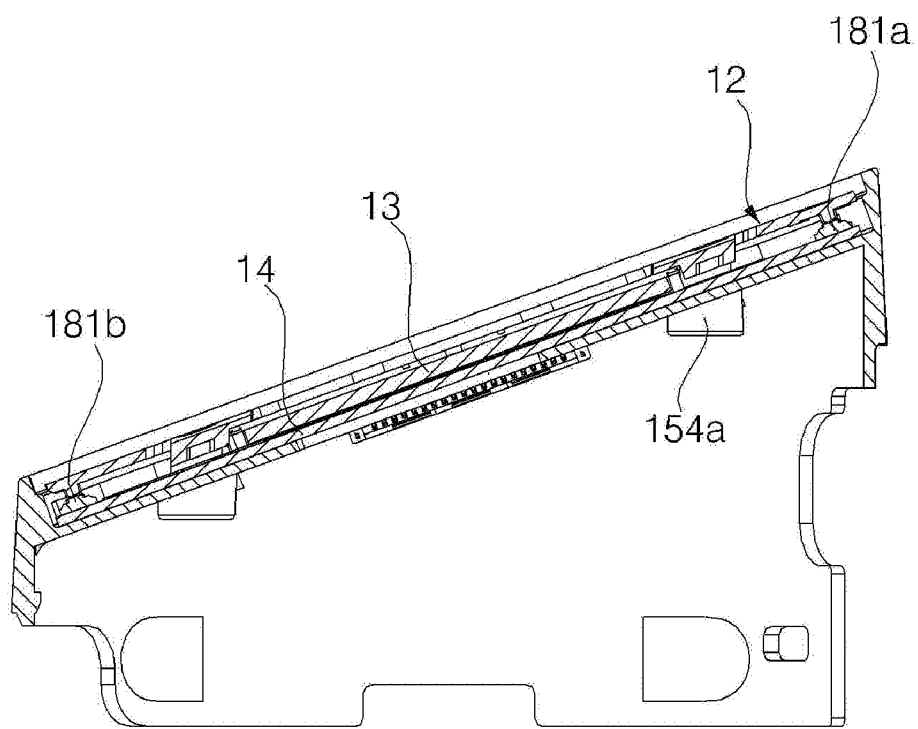
FIG. 12B is a sectional view taken along line A3-A3 of FIG. 11.
Figure 12C:
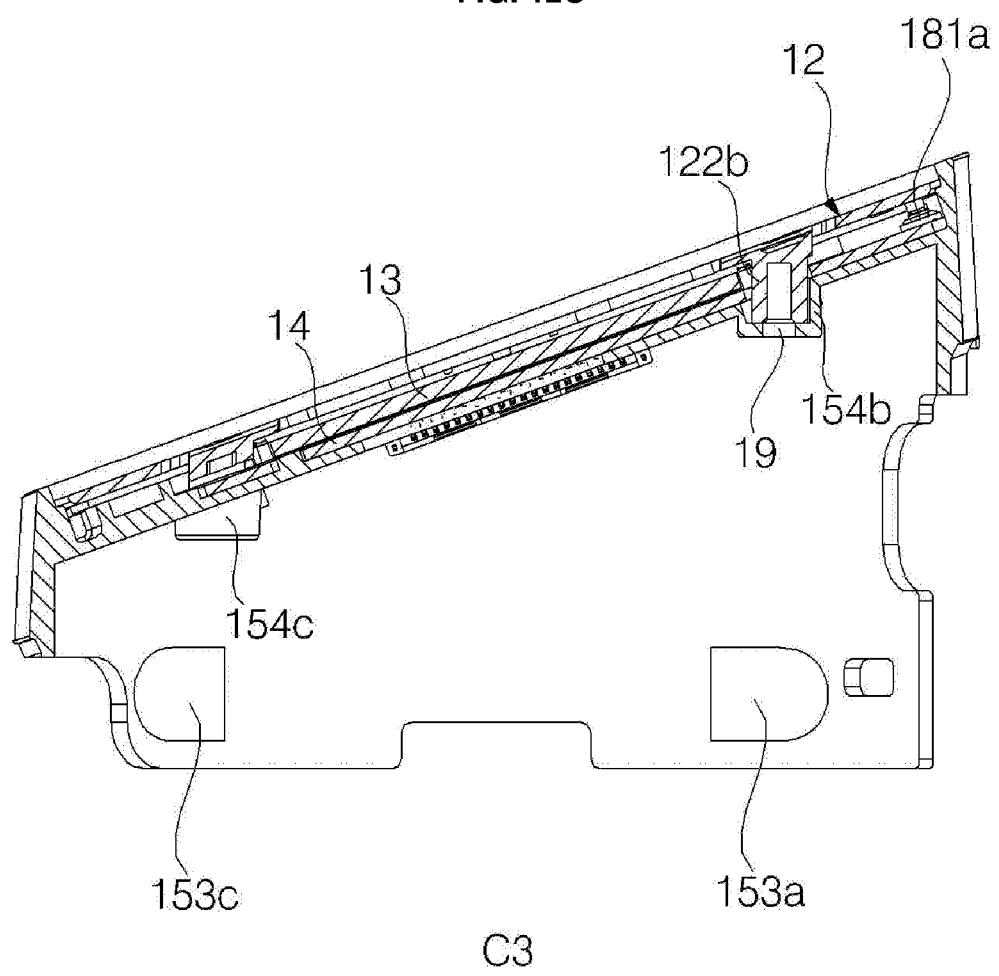
FIG. 12C is a sectional view taken along line C3-C3 of FIG. 11.
Figure 12D:
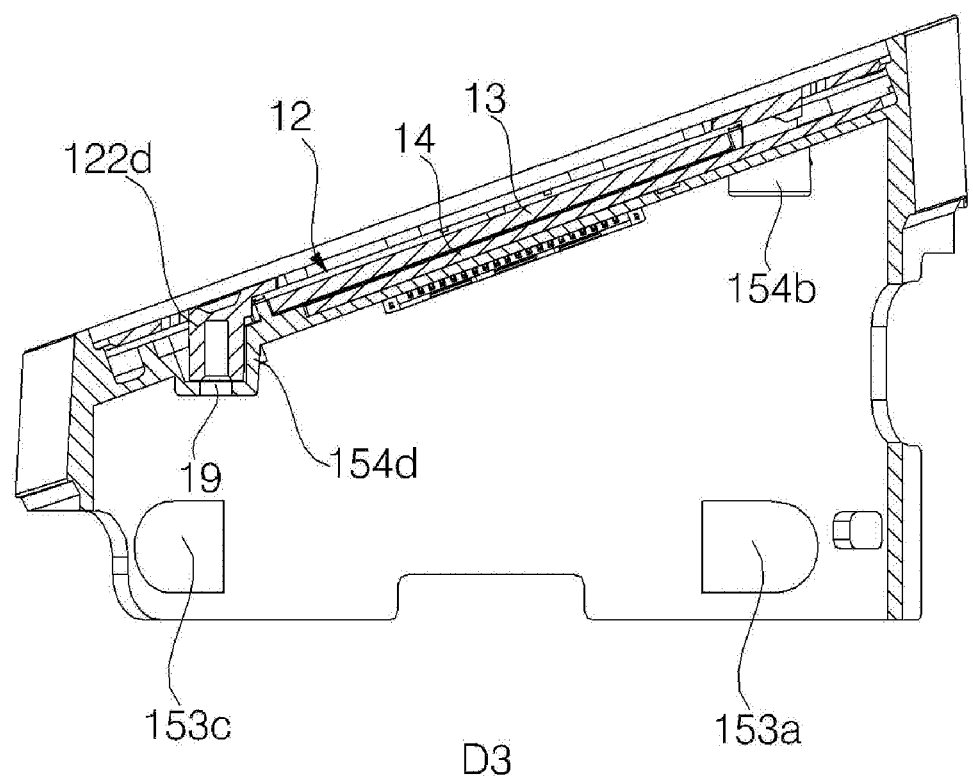
FIG. 12D is a sectional view taken along line D3-D3 of FIG. 11.
Figure 13:
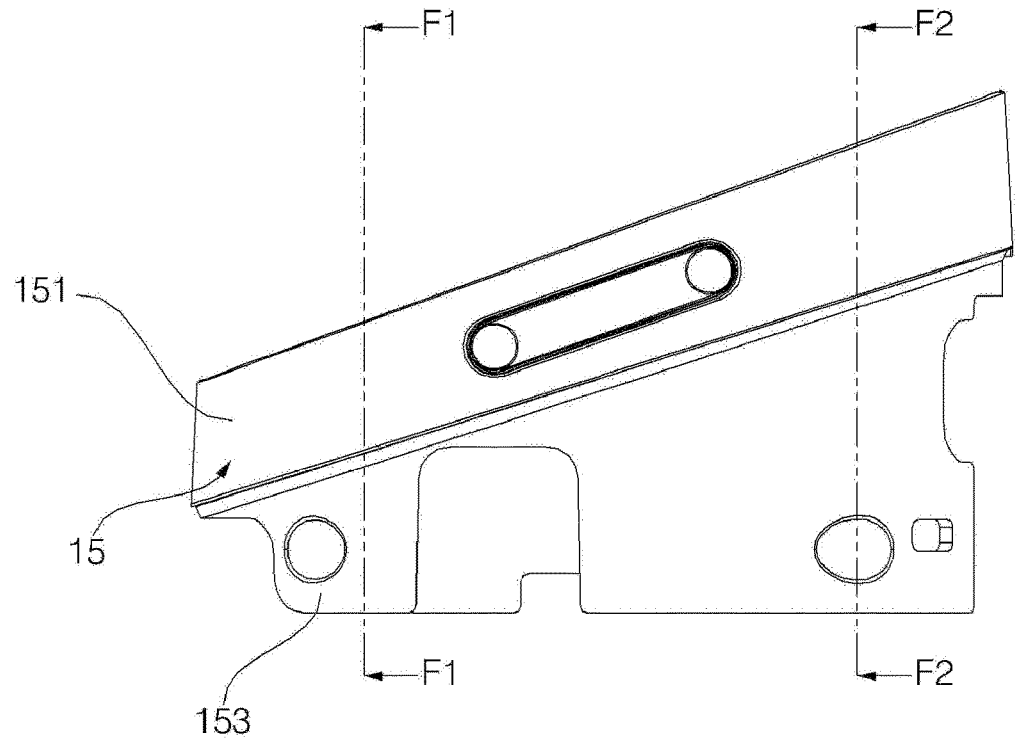
FIG. 13 is a right side view of the cover.
Figure 14A:
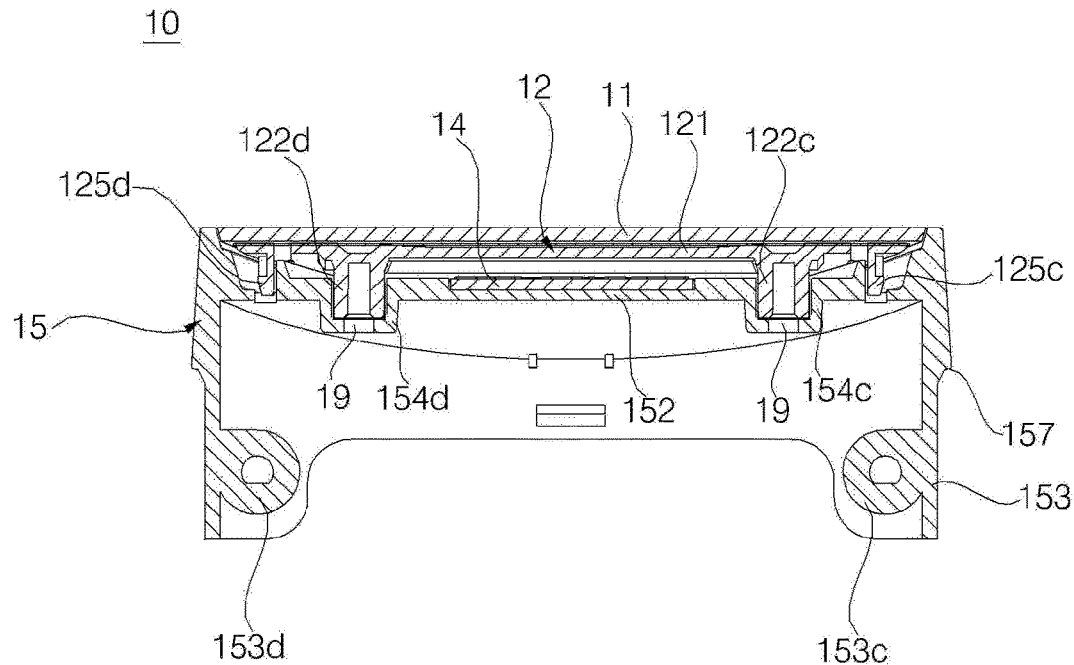
FIG. 14A is a sectional view taken along line F1-F1 of FIG. 13.
Figure 14B:
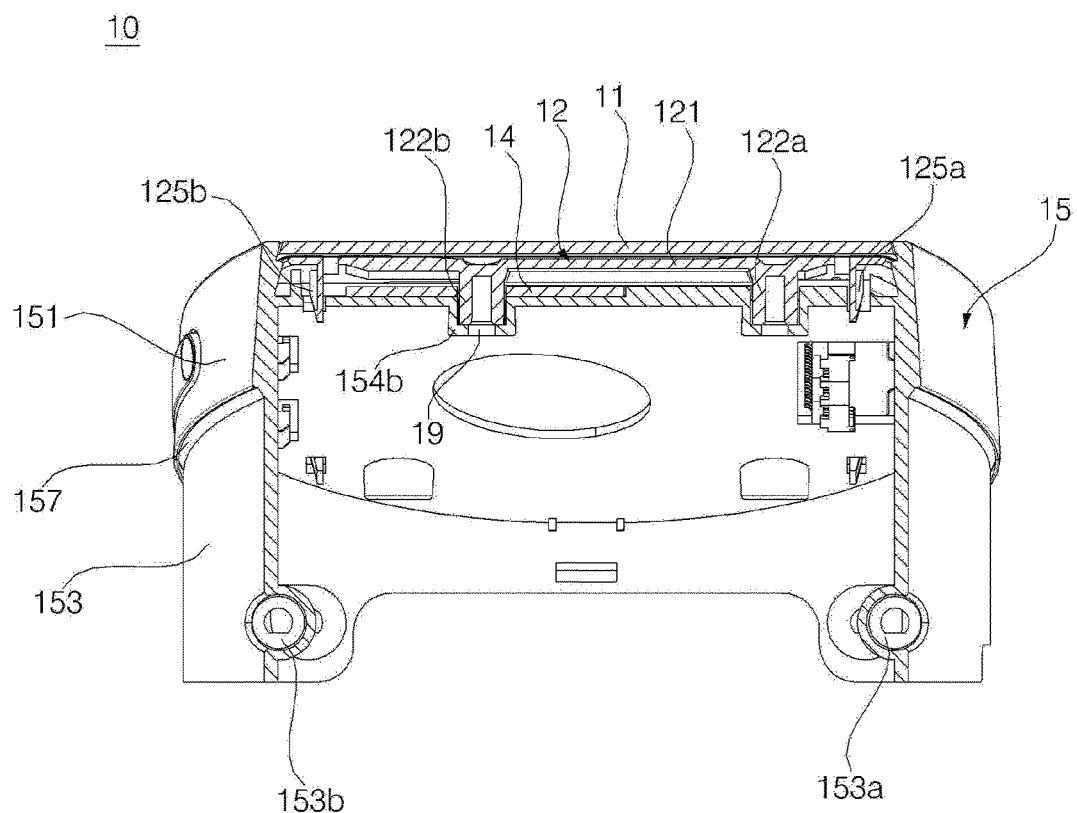
FIG. 14B is a sectional view taken along line F2-F2 of FIG. 13.

In another example, the first area SE1 and the second area SE2 may have slits 121*a* and 121*b* positioned between the manipulation protrusions 126*a* and 126*b* and the support bosses 122*a*, 122*b*, 122*c* and 122*d*. Referring to FIG. 10D, when the support bosses 122*a*, 122*b*, 122*c* and 122*d* are located in the first area SE1 or the second area SE2, the support bosses 122*a*, 122*b*, 122*c* and 122*d* may be closer to the first manipulation protrusion 126*a* or the second manipulation protrusion 126*b* than the third manipulation protrusion 126*c* or the fourth manipulation protrusion 126*d*. For example, when pressure is applied to the first area SE1 of the window support plate 121, the window support plate 121 may be bent about the first support boss 122*a* and the second support boss 122*b*. When the pressure is applied by the user, the first manipulation protrusion 126*a* may have a pivoting radius (or moment arm) r11 with respect to the first support boss 122*a* and a pivoting radius r12 with respect to the second support boss 122*b*. In an exemplary embodiment, r12 may be shorter than r11 because the first manipulation protrusion 126*a* is closer to the second support boss 122*b* than the first support boss 122*a*. In addition, when the distance from the third manipulation protrusion 126*c* to the first support boss 122*a* is r31 (r31>r11>r12), and the distance from the third manipulation protrusion 126*c* to the third support boss 122*c* may be r33 that substantially corresponds to r31.

The manipulation performance of each manipulation protrusion 126*a*, 126*b*, 126*c* or 126*d* may be affected by the distance to the closest support boss. Without slit 121*a* or 121*b*, when r31 is greater than r12 as in the above example, the third area SE3 is bent more easily than the first area SE1 even if similar pressures are applied to the first area SE1 and the third area SE3. This would cause the third manipulation protrusion 126*c* to be moved downward more easily than the first manipulation protrusion 126*a* such that the third contact switch 181*c* is activated with less user pressure than the first contact switch 181*a*. Similarly, the operation of the second contact switch 181*b* may require more activation pressure from a user than the third contact switch 181*c* or the fourth contact switch 181*d*. The differences in the activation pressures for the different contact switches 181*a*-*d* are generally undesirable and may lead to errors when receiving user inputs.

To solve this problem, the first slit 121*a* and the second slit 121*b* are formed respectively in the first area SE1 and the second area SE2 of the window support plate 121. In the respective areas SE1 and SE2, the slits 121*a* and 121*b* are located between the support bosses 122*a*, 122*b*, 122*c* and 122*d* and the manipulation protrusions 126*a*, 126*b*, 126*c* and 126*d*.

To provide more uniform activation pressures, the first slit 121a and the second slit 121b may be formed respectively in the first area SE1 and the second area SE2 of the window support plate 121. In the respective areas SE1 and SE2, the slits 121a and 121b may be located between the support bosses 122a, 122b, 122c and 122d and the manipulation protrusions 126a, 126b, 126c and 126d.

As illustrated in FIG. 10D, a diameter that passes the center c of the window support plate 121 and extends in the left-to-right direction may be referred to as a horizontal diameter D1, and the diameter that passes the center c of the window support plate 121 and extends in the front-to-rear direction may be referred to as a vertical diameter D2. In this context, the first support boss 122a and the second support boss 122b may be positioned in the first area SE1 in the direction substantially parallel to the horizontal diameter D1, and the third support boss 122c and the fourth support boss 122d may be positioned in the second area SE2 in the direction substantially parallel to the horizontal diameter D1. In addition, the first slit 121a and the second slit 121b may respectively extend in the direction substantially parallel to the horizontal diameter D1.

When the slits 121a and 121b are included in window support plate 121, the window support plate 121 may be bent at positions close to opposite ends of the slits 121a and 121b when the first area SE1 or the second area SE2 is pressed. In particular, because the window support plate 121 bends mainly in a narrow area between the ends of the slits 121a and 121b and the outer circumference of the window support plate 121, the window support plate 121 may be bent more with less user force than when the slits 121a and 121b are not included in the window support plate 121.

In addition, the distance between the manipulation protrusions 126a and 126b and the portions of the window support plate 121 in which the bending occurs may be increased when the slits 121a and 121b are present. For example, with respect to the first manipulation protrusion 126a, the distance rs to one end of the first slit 121a becomes longer than the distance r2 to the second support boss 122b because the pivoting radius of the force applied to a bending portion of the first area SE1 increases. This increased length contributes to more efficient downward movement of the first manipulation protrusion 126a.

Because the slits 121a and 121b are formed between the support bosses 122a, 122b, 122c and 122d and the manipulation protrusions 126a and 126b, the bending of the window support plate 121 in the first area SE1 and the second area SE2 is substantially more greatly affected by the position and shape of the slits 121a and 121b than the position of the support bosses 122a, 122b, 122c and 122d. Accordingly, when the first slit 121a and the second slit 121b are substantially symmetrically provided, the manipulation performance of the first contact switch 181a and the second contact switch 181b may be equalized even when the support bosses 122a, 122b, 122c and 122d of the first area SE1 and the second area SE2 are asymmetrically positioned.

Referring to FIGS. 3 to 5, the main body 40 may be supported by the base 30 located therebelow, and may be coupled at the upper end thereof to the cover housing 15. The main body 40 may include speaker cases 41 and 42 for forming a cavity 49 therein, and one or more speakers 43 and 44 may be placed in the cavity 49. In an exemplary embodiment, two speakers 43 and 44 may be provided at upper and lower positions in the speaker cases 41 and 42. The speaker 43 located at the upper position may be a tweeter for outputting high-pitched sound, and the speaker 44 located at the lower position may be a woofer for outputting low-pitched sound.

Referring to FIGS. 22 to 25, the speaker cases 41 and 42 may include a front case 41 and a rear case 42, which define the cavity 49 therebetween. The front case 41 may be provided with a pair of upper and lower sound output ports, which are open forward in order to expose vibrating plates (e.g. membranes) of the tweeter 43 and the woofer 44 respectively.

A plurality of case-coupling bosses 411 may be formed on the inner surface of the front case 41 so as to protrude rearward. In the exemplary embodiment, two case-coupling bosses 411 may be formed on left and right sides at the same constant height to form a pair, and a pair of such case-coupling bosses 411 is formed at three different heights, so that the case-coupling bosses 411 may be formed at six places in total, without being limited thereto.

The rear case 42 may include insertion bosses 421 at positions corresponding to the case-coupling bosses 411 of the front case 41. Bolts or other connectors may be inserted from the rear side of the rear case 42 to pass through the respective insertion bosses 421 to thereby be fastened to the case-coupling bosses 411.

A pair of fastening bosses 153c and 153d may be indented rearward at left and right positions in the front surface of the upper-end holding portion 153 of the cover housing 15 (see FIGS. 11 to 14), and a pair of fastening bosses 153a and 153b in the rear surface of the upper-end holding portion 153 may be indented forward at left and right positions. Corresponding to the fastening bosses 153a, 153b, 153c and 153d formed in the cover housing 15, a first boss-insertion recess 415 and a second boss-insertion recess 416 may be formed in the front case 41 of the main body 40, and a third boss-insertion recess 425 and a fourth boss-insertion recess 426 may be formed in the rear case 42.

Figure 22:
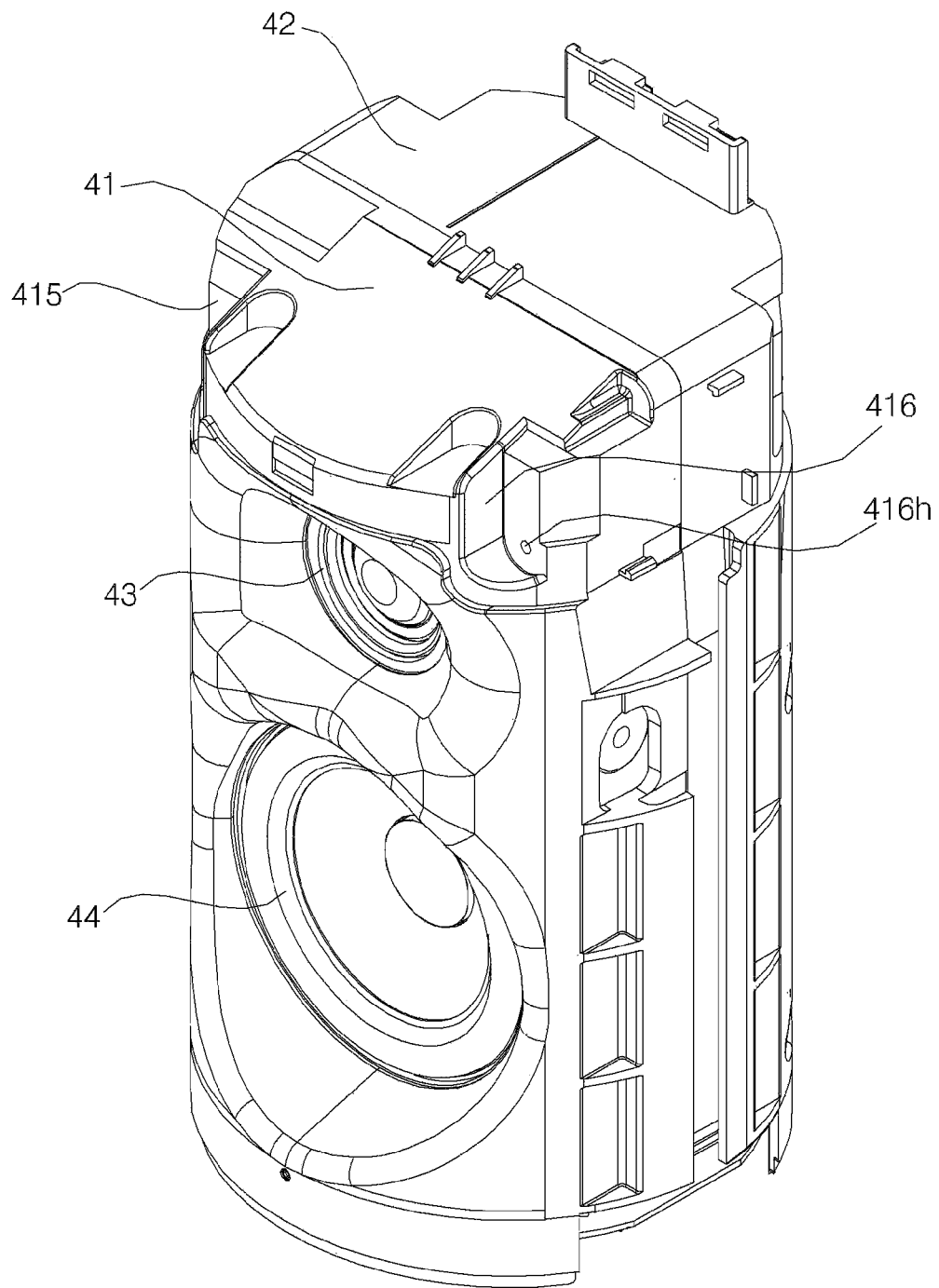
FIG. 22 is a perspective view illustrating the upper surface of a main body.
Figure 23:
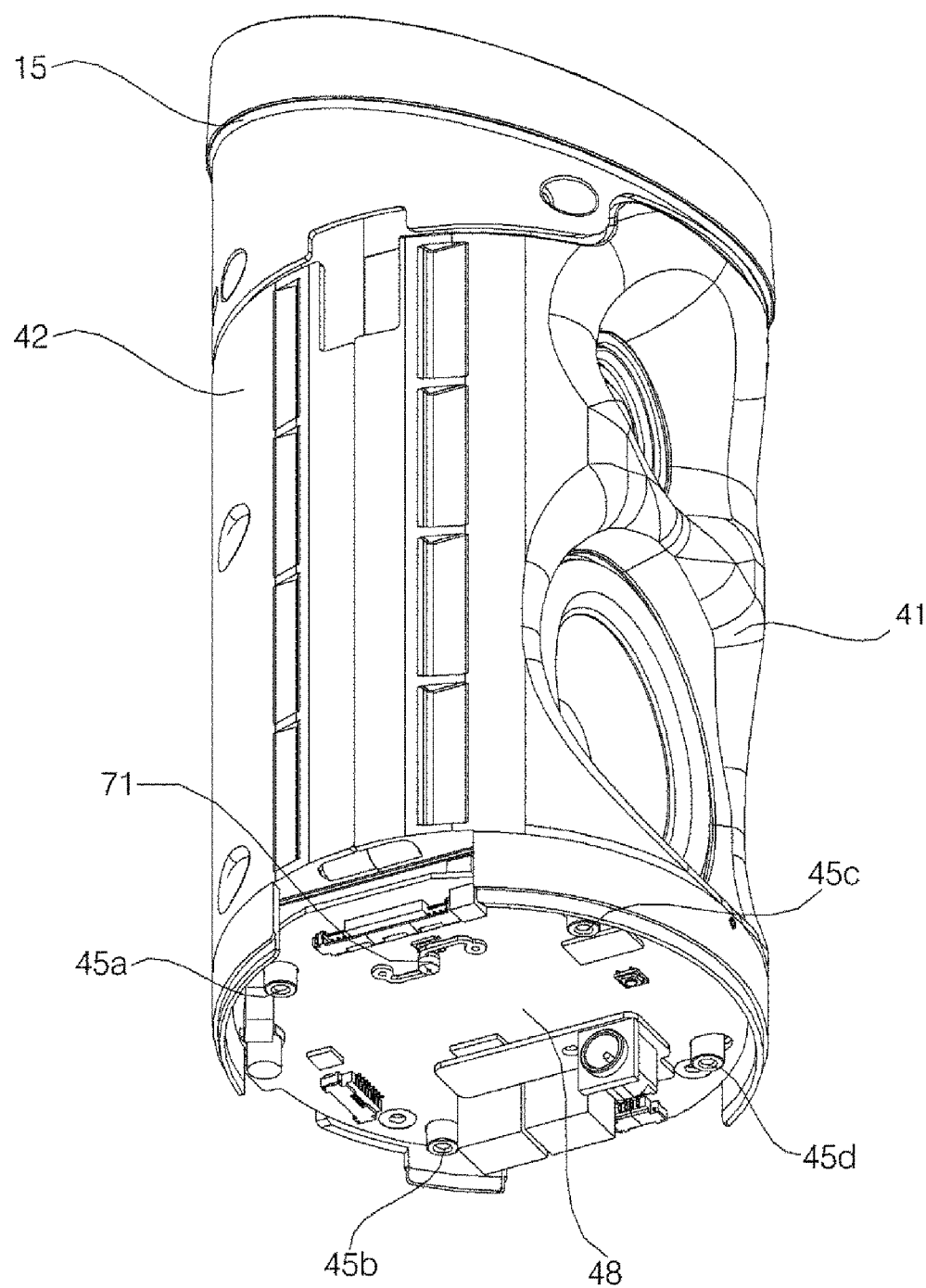
FIG. 23 is a perspective view illustrating the lower surface of the main body.
Figure 24:
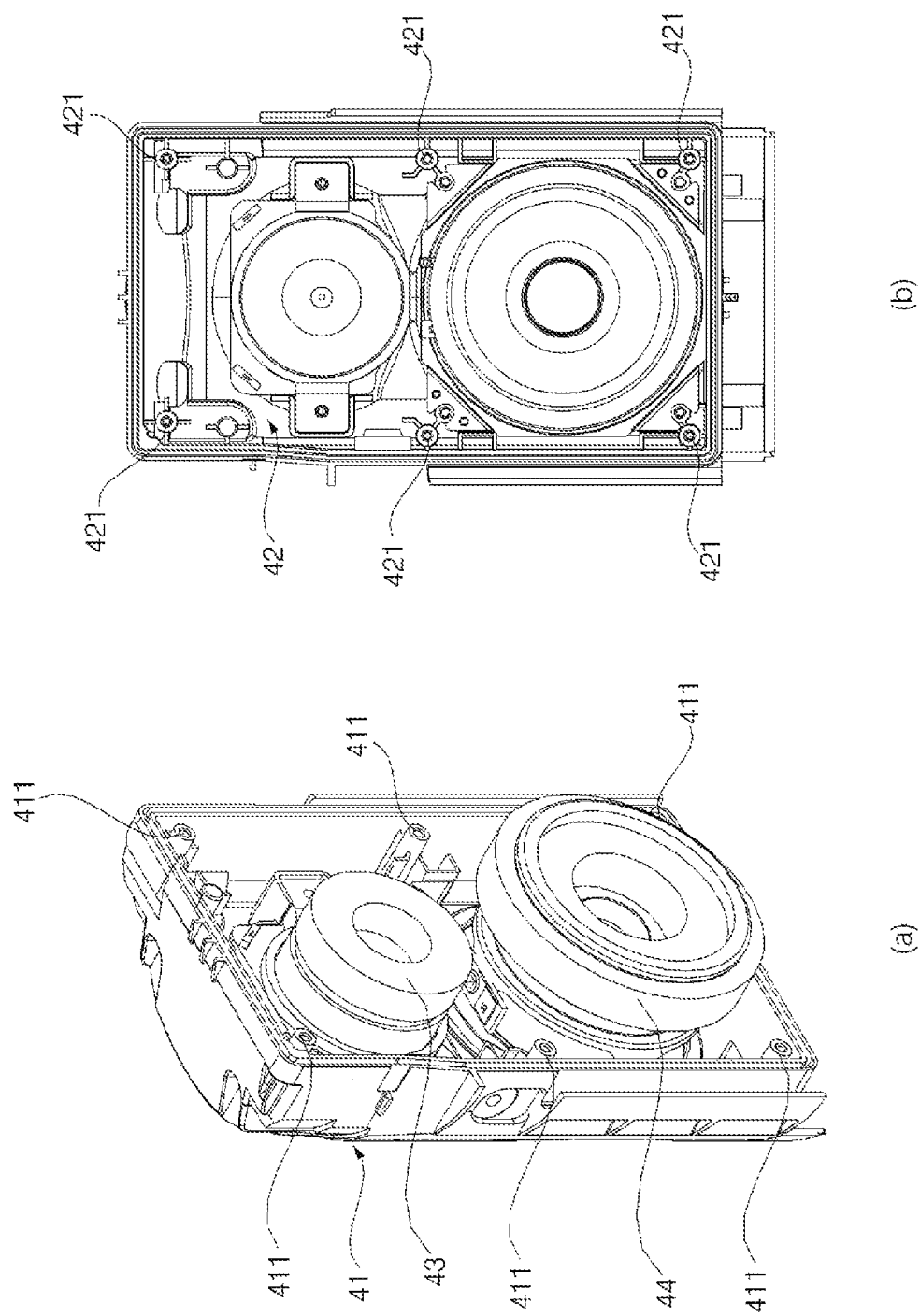
FIG. 24 illustrates a front case and a rear case.
Figure 25:
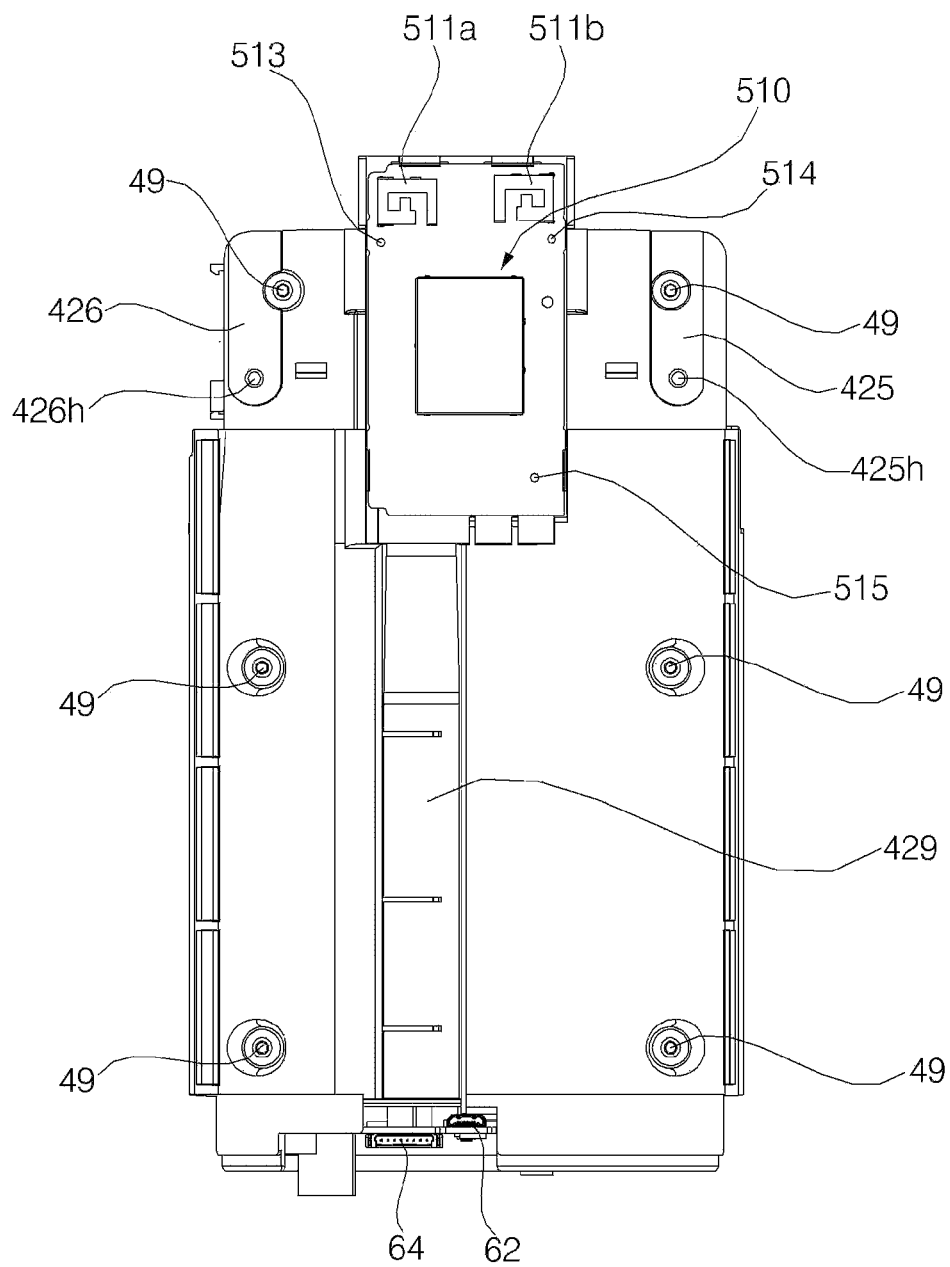
FIG. 25 illustrates the rear surface of the main body.

Referring to FIG. 22, each of the first boss-insertion recess 415 and the second boss-insertion recess 416 may be indented rearward from the front surface of the front case 41 (i.e. the surface facing the front side of the hub 1). The upper end of each recess 415 and 416 may be open to allow the fastening boss 153c or 153d to be inserted thereinto from the top side. Referring to FIG. 25, each of the third boss-insertion recess 425 and the fourth boss-insertion recess 426 may be indented forward from the rear surface of the rear case 42 (i.e. the surface facing the rear side of the hub 1). The upper end of each recess may be open to allow the fastening boss 153a or 153b to be inserted thereinto from the top side.

Each of the boss-insertion recesses 415, 416, 425 and 426 may have a fastening hole for the passage of a bolt or other connector. For example, a fastening hole 416h may be formed in the second boss-insertion recess 416 and a fastening hole 415h may also be formed in the first boss-insertion recess 415. Similarly, fastening holes 425h and 426h (see FIG. 25) may also be formed in the other boss-insertion recesses 425 and 426.

When inserted into the respective corresponding boss-insertion recesses 415, 416, 425 and 426, the fastening bosses 153a, 153b, 153c and 153d may reach positions corresponding to the fastening holes 415h, 416h, 425h and 426h. Bolts or other connectors may pass through the respective fastening holes 415h, 416h, 425h and 426h to thereby be fastened to the fastening bosses 153a, 153b, 153c and 153d.

Figure 26:
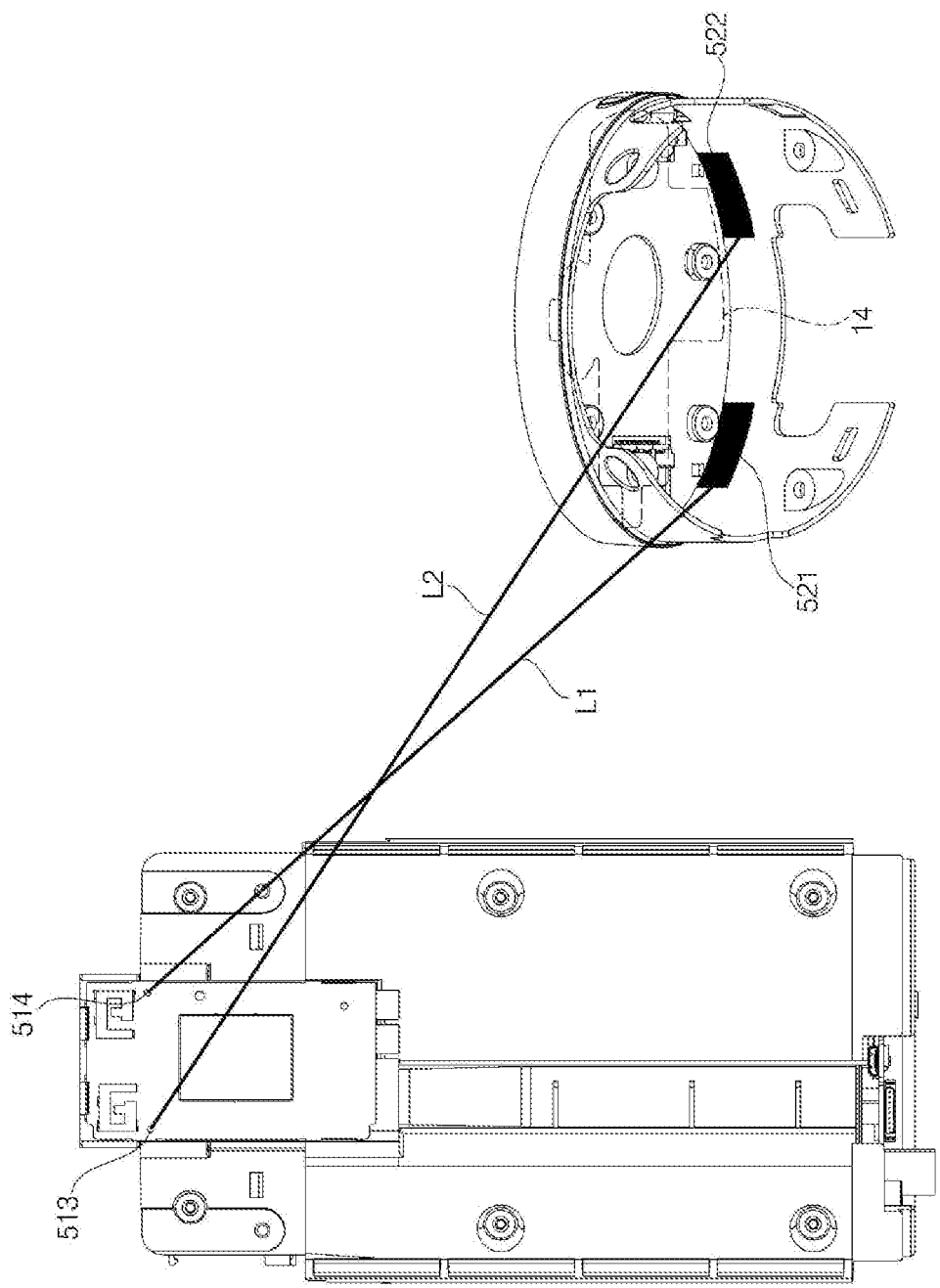
FIG. 26 is a view illustrating the positions of antennas connected to a Wi-Fi module.
Figure 27:
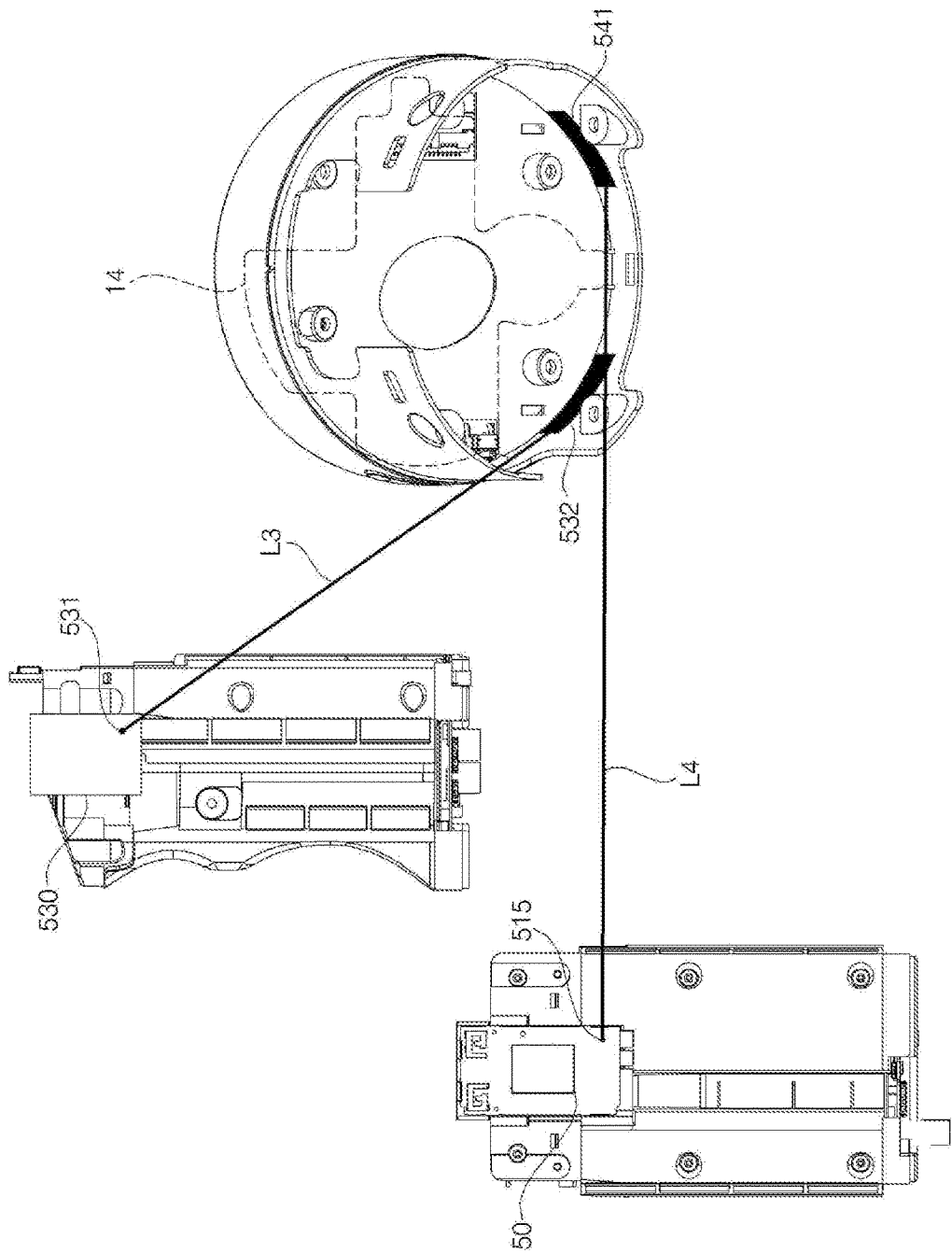
FIG. 27 is a view illustrating the position an antenna connected to a Bluetooth module and the position of an antenna connected to a ZigBee module.

Referring to FIGS. 25 to 27, at least one communication module 50 may be placed on the main body 40. The communication module 50 may be connected to the circuit of the main PCB 48 and/or the display PCB 14, and may be controlled by the controller 82. In one embodiment, the communication module 50 may include a Wi-Fi module 50a, a Bluetooth module 50b, and a ZigBee module 530. However, the present disclosure is not limited thereto, and other types of communication modules may be included in the main body, such as a Z-wave module or an NFC module (shown in FIG. 8 as being included in display PCB 14).

A module assembly 510 including the Wi-FI module 50a and the Bluetooth module 50b may be placed on the rear portion of the main body 40. For example, the module assembly 510 may be positioned on or coupled to the rear case 42. The module assembly 510 may be coupled to or separated from the rear case 42. In other example, the Wi-FI module 50a and the Bluetooth module 50b may be separately provided so as to be independently coupled to or separated from the main body 40.

The module assembly 510 may include a pair of antennas 511a and 511b for transmitting and receiving signals. In other example, the module assembly 510 may be coupled by a wire or cable to one or more of the antennas 521 or 522 (see FIGS. 25 to 27) positioned apart from the module assembly 510.

The module assembly 510 may include a first antenna-connection terminal 513 and a second antenna-connection terminal 514 of the Wi-Fi module 50a, and an antenna-connection terminal 515 of the Bluetooth module 50b. In addition, a first antenna 521 and a second antenna 522 may be provided at the rear left and right positions on the inner surface of the sidewall 151 of the cover housing 15. The first antenna 521 may be connected to the first antenna-connection terminal 513 via a conductive line L1, and the second antenna 522 may be connected to the second antenna-connection terminal 514 via a conductive line L2.

Each of the first antenna 521 and the second antenna 522 may be formed by coupling a conductor having a predetermined pattern to a thin film, and a conductive line L1 or L2 may be connected to the conductor. Each of the first antenna 521 and the second antenna 522 may be attached to the sidewall 151 of the cover housing 15 by a piece of double-sided tape or other connecting method.

As previously described, at least a portion of the sidewall 151 of the cover housing 15 may be externally exposed and located above the grille 20 and, thus, is not surrounded by the grille 20. Therefore, the first antenna 521 and the second antenna 522 may be attached to a portion of the sidewall 151 extending above the grille 20. Signal interference caused by the metal grille 20 may be reduced through this positioning to enable more accurate transmission and reception of signals.

In addition, the sidewall 151 may be shaped so that a distance between the upper end thereof and the partition 152 gradually increases away from the front end of the hub 1. In this configuration, the rear portion of the sidewall 151 may be positioned further from the display PCB 14 (which is mounted on the partition 152) than the front portion of the sidewall 151. Accordingly, the first antenna 521 and the second antenna 522 may be spaced farther away from the display PCB 14 when positioned on the rear portion of the sidewall 151 to reduce signal interference caused by a magnetic field generated by current flowing in the circuit of the display PCB 14.

The ZigBee module 530 may be provided on one of the left and right sides of the main body 40, and a third antenna 532 may be connected to the antenna connection terminal 531 of the ZigBee module 530 via a conductive line L3. A fourth antenna 541 may be connected to the antenna connection terminal 515 of the Bluetooth module 50b via a conductive line L4 and may be positioned on the inner surface of the front portion of the sidewall 151 of the cover housing 15. Each of the third antenna 532 and the fourth antenna 541 is formed by coupling a conductor having a predetermined pattern to a thin film, and the conductive line L3 or L4 may be connected to the conductor. Each of the third antenna 532 and the fourth antenna 541 may be attached to the sidewall 151 of the cover housing 15 by a piece of double-sided tape or other connection method.

Figure 28:
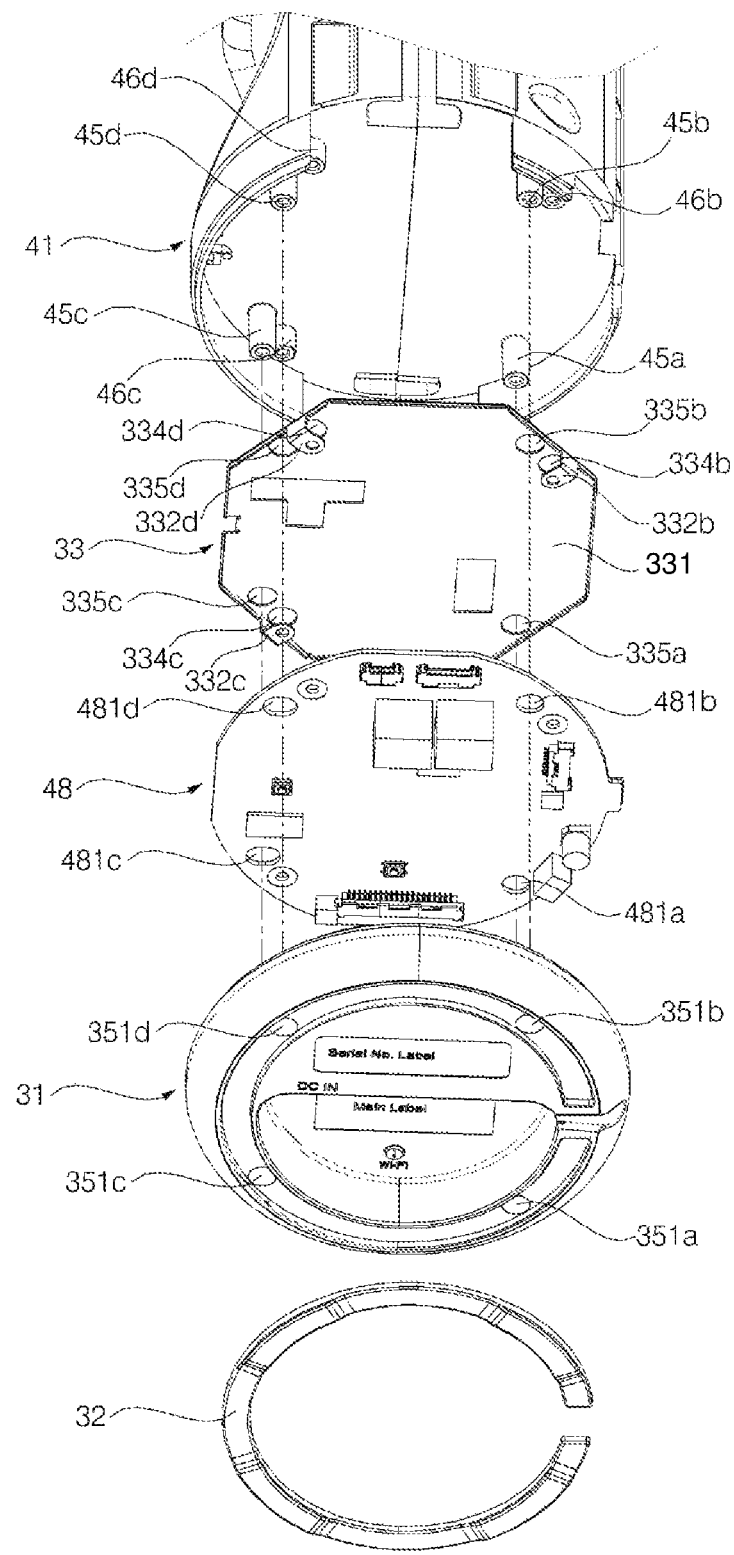
FIG. 28 is an exploded perspective view of the main body, a radiator, a main PCB, a base body, and a support rubber.
Figure 29:
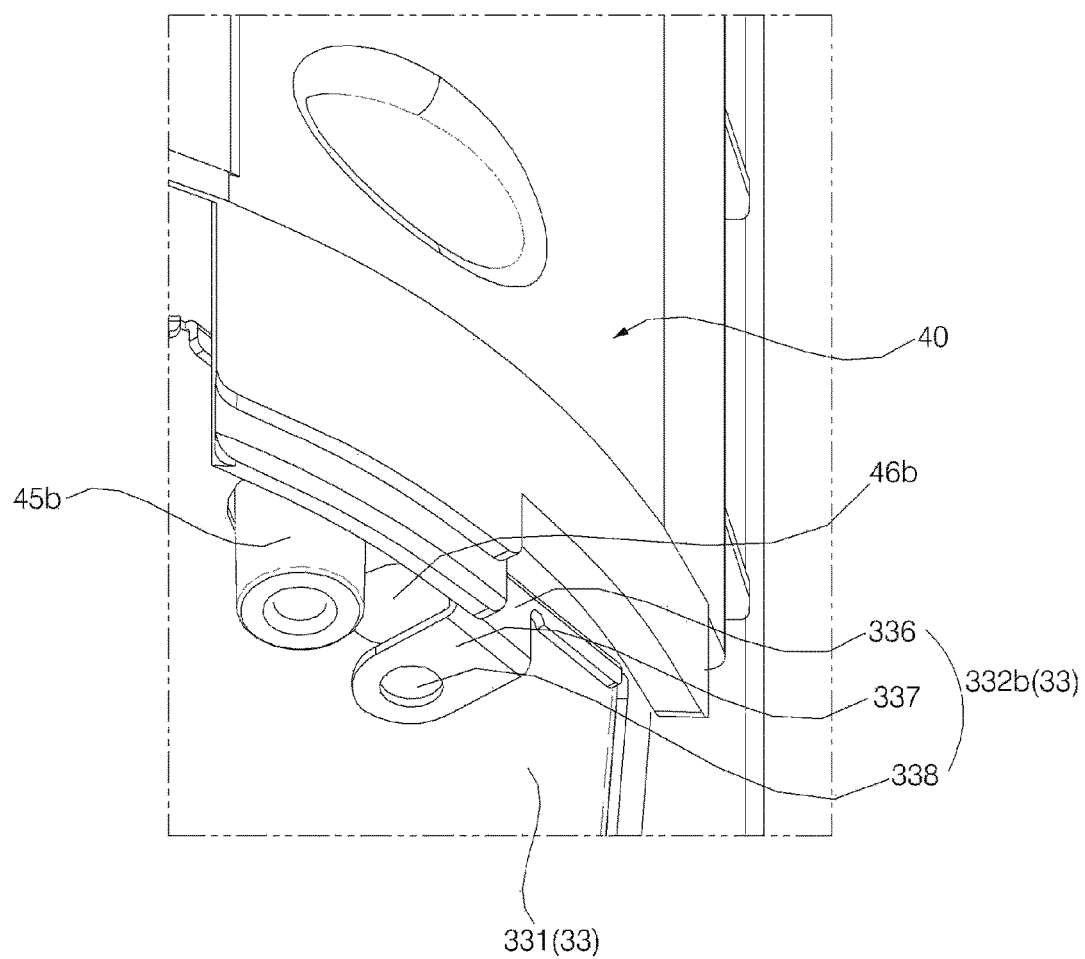
FIG. 29 is an enlarged perspective view illustrating a support tap of the radiator.
Figure 30:
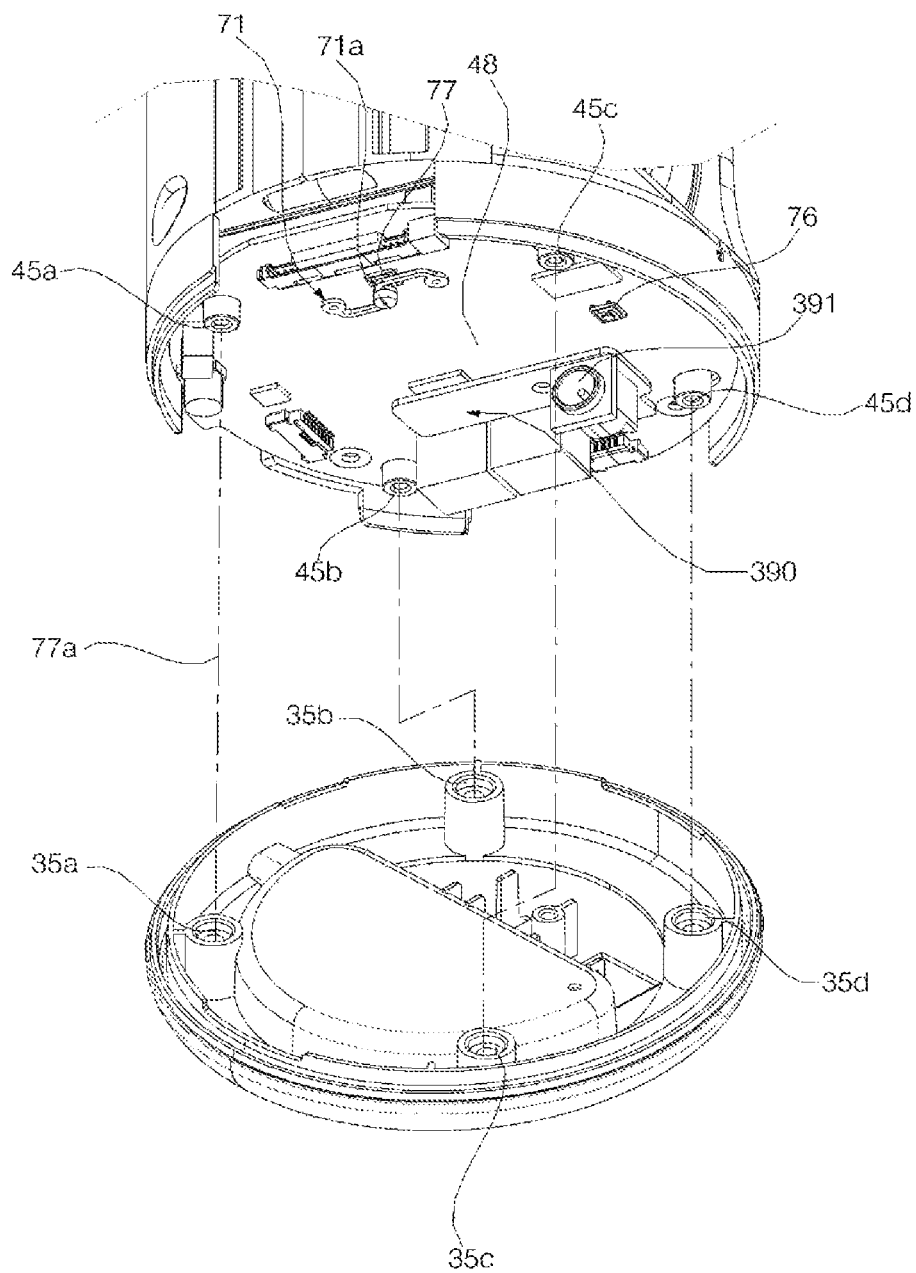
FIG. 30 is a view illustrating the coupling structure of the main body and a base.
Figure 31:
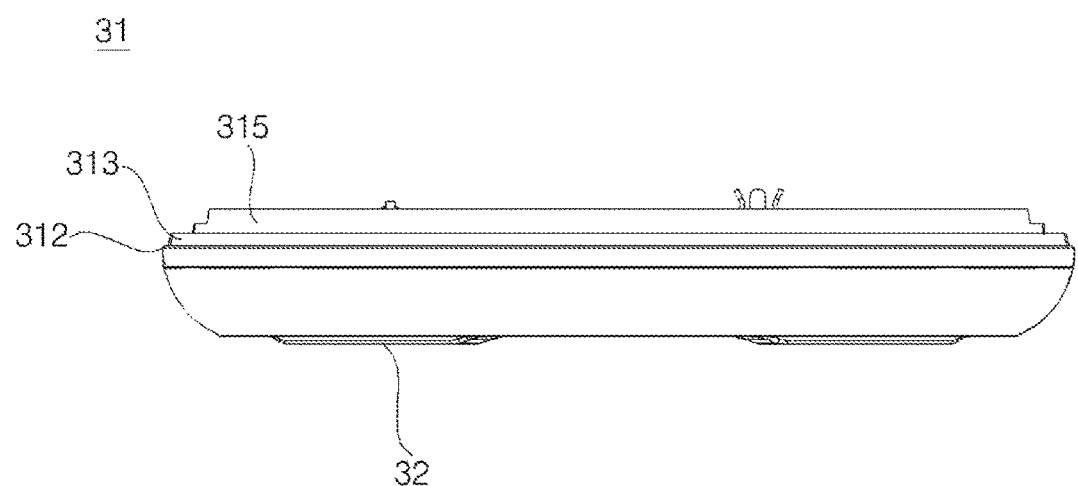
FIG. 31 is a front view of the base.

Referring to FIGS. 28 and 29, the main PCB 48 may be located in the space between the main body 40 and the base 30. The main PCB 49 may control the general operations of the hub 1. For example, the controller (or processor) 82, a USB port 62, a data transmission port 64, various switches 76 and 77, and a receptacle 390 may be mounted on the main PCB 48. The main PCB 48 may be electrically connected to various electric devices, such as the communication modules 50a and 530, the display PCB 14, the tweeter 43, and the woofer 44.

A radiator 33 may be placed between the main PCB 48 and the main body 40. The radiator 33 may dissipate heat, discharged upward from the main PCB 48 to an upper space (i.e. the space between the lower surface of the main body 40 and the radiator 33).

A plurality of fastening bosses 45a, 45b, 45c and 45d may extend from the lower surface of the main body 40. The first fastening boss 45a and the second fastening boss 45b may extend from the lower surface of the rear case 42, and the third fastening boss 45c and the fourth fastening boss 45d may extend from the lower surface of the front case 41. The fastening bosses 45a, 45b, 45c and 45d may be coupled to the base 30. The fastening bosses 45a, 45b, 45c and 45d may be formed respectively in four quadrants in the lower surface of the main body 40.

The base 30 may be provided with insertion bosses 35a, 35b, 35c and 35d at positions respectively corresponding to the fastening bosses 45a, 45b, 45c and 45d. The fastening bosses 45a, 45b, 45c and 45d may be inserted into the respective insertion bosses 35a, 35b, 35c and 35d, and then may be fastened to bolts or other connectors, which pass upward through the respective insertion bosses 35a, 35b, 35c and 35d.

A plurality of radiator coupling bosses 46b, 46c and 46d may protrude from the lower surface of the main body 40. The radiator support bosses 46b, 46c and 46d may be positioned close to the fastening bosses 45a, 45b, 45c and 45d. Although the radiator support bosses 46b, 46c and 46d, in the exemplary embodiment, may be formed in three of the four quadrants the lower surface of the main body 40, the quantity and the positioning of the radiator support bosses 46a, 46b, 46c and 46d is not limited thereto.

The radiator 33 may be formed as from planar metal plate or sheet and may include aluminum, stainless steel, or other metal materials. The radiator 33 may include a horizontal flat portion 331 and a plurality of support tabs 332b, 332c and 332d extending from the periphery of the flat portion 331.

The flat portion 331 may include through-holes 335a, 335b, 335c and 335d (hereinafter referred to as "fastening-boss through-holes") for the passage of the fastening bosses 45a, 45b, 45c and 45d. The flat portion 331 may also include through-holes 334b, 334c and 334d for the passage of the support bosses 46b, 46c and 46d (hereinafter referred to as "support-boss through-holes").

Referring to FIG. 29, the support bosses 46b, 46c and 46d may be coupled respectively to the support tabs 332b, 332c and 332d at the upper side of the main PCB 48. Each of the support tabs 332b, 332c and 332d may include a vertical portion 336 extending downward from the flat portion 331, and a horizontal portion 337 horizontally bent from the vertical portion 336. The horizontal portion 337 of each support tab 332b, 332c and 332d may be provided with a fastening hole 338 for the passage of a bolt (or other connector). For example, the bolt may pass upward through the fastening hole 338 and fasten to one of the support bosses 46b, 46c and 46d.

When the support bosses 46b, 46c and 46d are fastened to the support tabs 332b, 332c and 332d, the flat portion 331 may be spaced apart from the lower surface of the main body 40 located thereabove. The flat portion 331 may be also spaced apart from the main PCB 48 located therebelow. Because the flat portion 331 is spaced apart from the lower surface of the main body 40, the flat portion 331 does not vibrate or generate noise when the main body 40 vibrates due to the output of the speakers 43 and 44.

The main PCB 48 may have through-holes 481a, 481b, 481c and 481d at positions respectively corresponding to the through-holes 335a, 335b, 335c and 335d of the radiator 33. The fastening bosses 45a, 45b, 45c and 45d may be longer than the support bosses 46b, 46c and 46d, and may respectively pass through the through-holes 335a, 335b, 335c and 335d of the radiator 33 and the through-holes 481a, 481b, 481c and 481d of the main PCB 48 to thereby be inserted into the insertion bosses 35a, 35b, 35c and 35d of the base 30.

Referring to FIGS. 28 to 34, the base 30 may include a base body 31 having an open upper surface and defining a predetermined space therein. The insertion bosses 35a, 35b, 35c and 35d may protrude upward from the inner surface of the base body 31. A base bottom portion 310 of the base body 31 may include fastening holes 351a, 351b, 351c and 351d, which are positioned to communicate with (i.e., provide a path to) the insertion bosses 35a, 35b, 35c and 35d.

When the main body 40 and the radiator 33 are coupled together, the fastening bosses 45a, 45b, 45c and 45d may pass through the fastening-boss through-holes 481a, 481b, 481c and 481d formed in the main PCB 48. Then, respective fastening bosses 45a, 45b, 45c and 45d may be inserted into the insertion bosses 35a, 35b, 35c and 35d formed in the base 30. Thereafter, bolts or other connectors may be inserted into the fastening holes 351a, 351b, 351c and 351 from the bottom side of the base 30 and fastened to the fastening bosses 45a, 45b, 45c and 45d inside the insertion bosses 35a, 35b, 35c and 35d to couple the base 30 to the body 40.

The base body 31 may include a support rubber (or pad) 32 fixed to the lower surface of the base body 31. The hub 1 may have a relatively small size to allow the user to position the hub 1 on a surface, such as a table or a shelf. The support rubber 32 may be positioned provided underneath the base body 31. The support rubber 32 may be formed from rubber, plastic, or other deformable material and may cause friction against the surface to deter an unintended movement of the hub 1.

A rubber insertion groove 318 may be formed in the base bottom portion 310 of the base 30. The rubber insertion groove 318 may extend along the predetermined circumference of the base bottom portion 310. The rubber insertion groove 318 may take the form of an arc, which extends from one end 318a to the other end 318b at a constant curvature, and the fastening holes 351a, 351b, 351c and 351d may be located in the rubber insertion groove 318.

The support rubber 32 is inserted into the rubber insertion groove 318. The upper surface of the support rubber 32 may be attached to the bottom of the rubber insertion groove 318 by a piece of double-sided tape or other connection method. In another example, the support rubber 32 may be friction fitted within the rubber insertion groove 318.

The support rubber 32 may include a rubber main body 321 that extends in a long length corresponding to a length of the rubber insertion groove 318. Support protrusions 322 may extend down from the rubber main body 321 and toward the outside of the rubber insertion groove 318. When the support bosses 322 are placed on a floor or other surface, the hub 1 may be positioned upright (i.e., such that the base 30 contacts the surface), and the base body 31 may be spaced apart from the surface by a distance corresponding to a protrusion height of the support protrusions 322.

The support protrusions 322 may be spaced along of the rubber main body 321. For example, the support protrusions 322 may be symmetrically provided about the center of the base bottom portion 310 of the base body 31. Although four support protrusions 322 are positioned at an interval of 90 degrees in the exemplary embodiment shown in FIG. 36, the number of support protrusions 322 and the spacing of the support protrusions 322 are not limited thereto.

The base body 31 may include a base outer wall portion 311 extending upward from the periphery of the base bottom portion 310. The outer diameter of a lower portion of base outer wall portion 311 may be smaller than the outer diameter of the lower end of the grille 20. The outer diameter of the base outer wall portion 311 may gradually increase upward such that the outer diameter of the upper end of the base outer wall portion 311 may substantially correspond to the outer diameter of the lower end of the grille 20, such that a smooth transmission is formed at intersection of the base outer wall portion 311 and the grille 20.

The base body 31 may include a lower-end holding portion 313 extending upward from the base outer wall portion 311 so as to be coupled to the grille 20. The lower-end holding portion 313 may be inserted (or fitted) into an opening formed in the lower end of the grille 20. In this way, an interior surface at the lower end of the grille 20 may be interference-fitted to an exterior surface of the lower-end holding portion 313 using the elasticity or the restoring force of the grille 20 or the lower-end holding portion 313. Thus, the lower-end holding portion 313 and the grille 20 may be coupled without using fastening members, such as bolts.

Figure 32:
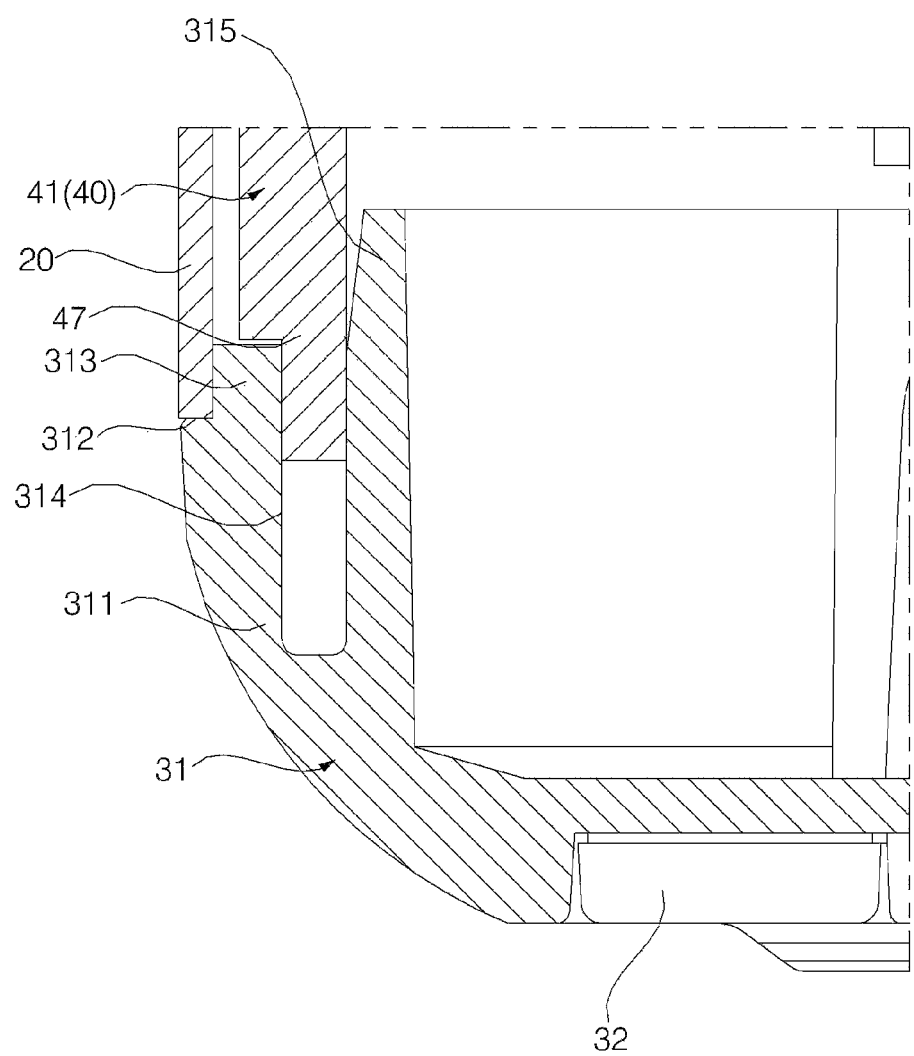
FIG. 32 is a sectional view illustrating the coupling structure of the main body, the grille, and a speaker case.
Figure 33:
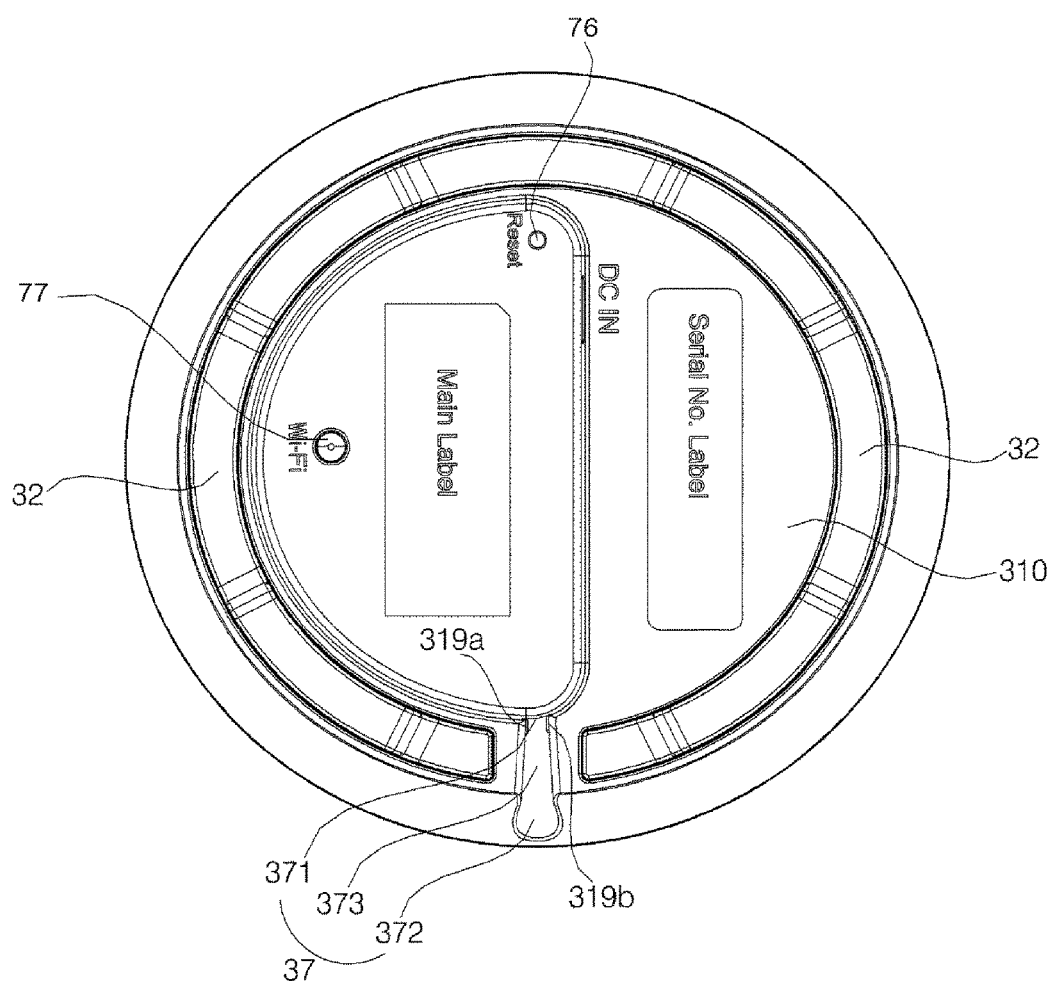
FIG. 33 is a view illustrating the lower surface of the base.
Figure 34:
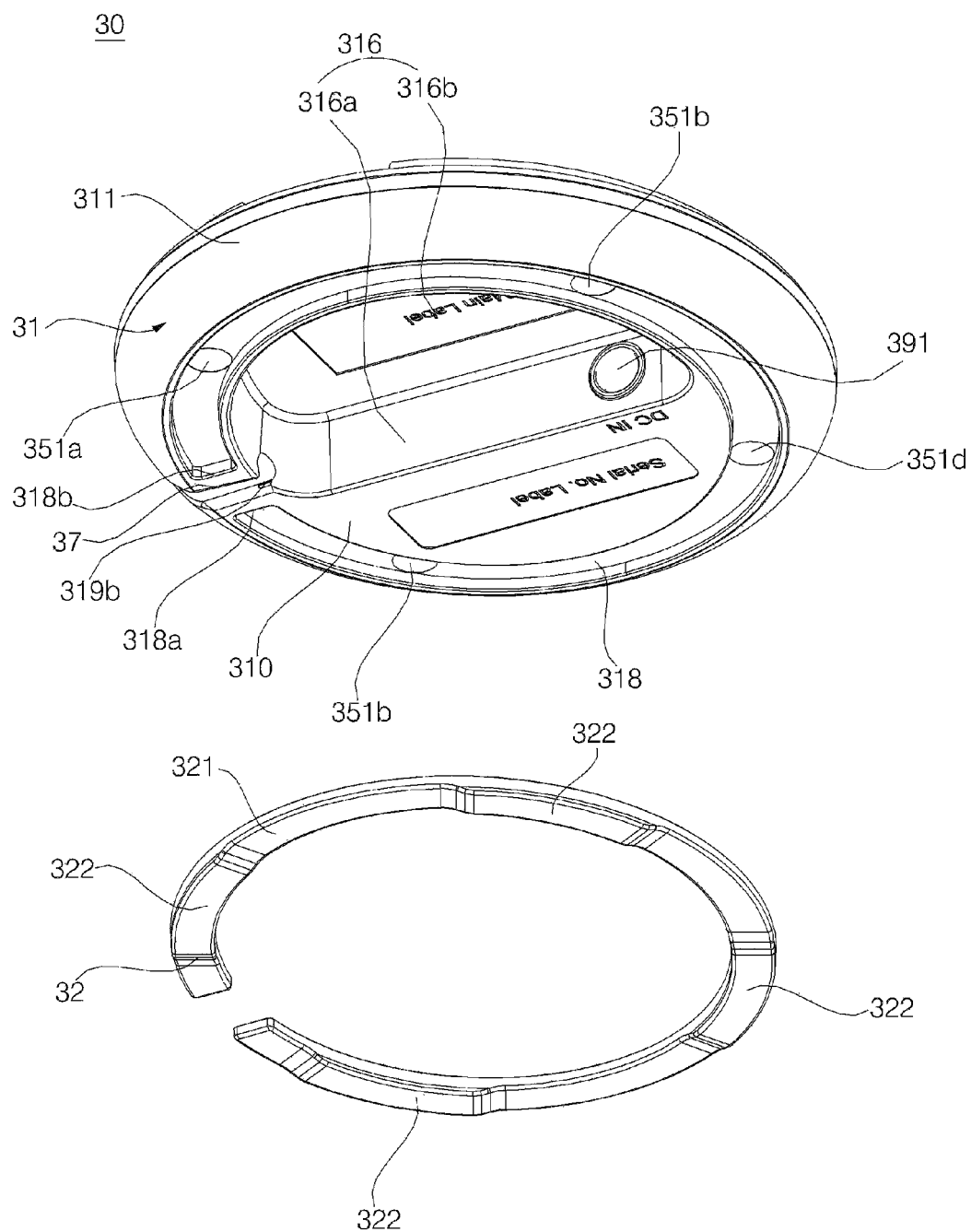
FIG. 34 is an exploded perspective view of the base.
Figure 35:
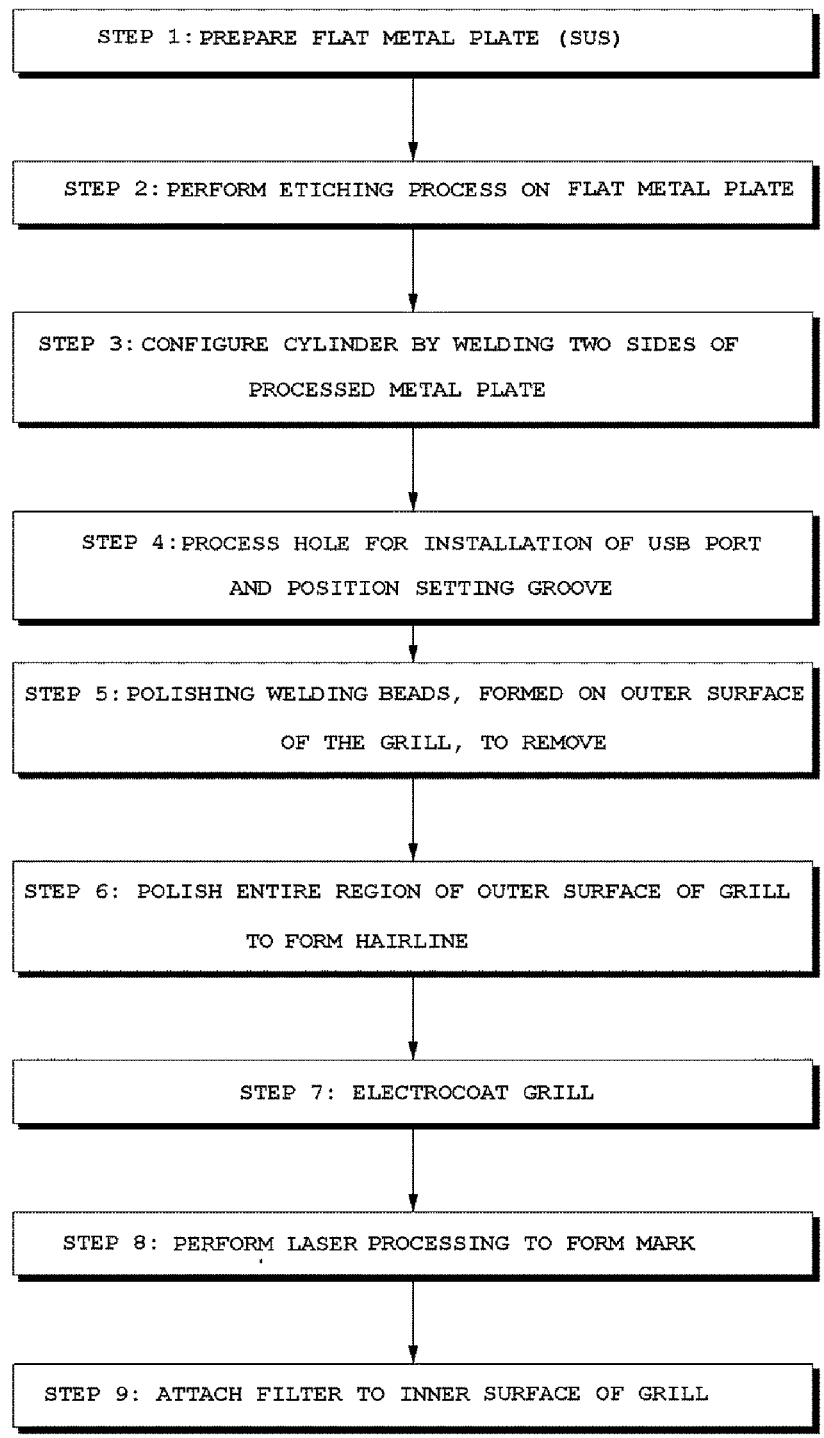
FIG. 35 is a flowchart illustrating a method of manufacturing a hub according to one exemplary embodiment of the present disclosure.

Referring to FIG. 32, the lower-end holding portion 313 may be located inside the upper end of the base outer wall portion 311 such that the outer surface of the base body 31 is indented from the upper end of the outer wall portion 311 to form the outer surface of the lower-end holding portion 313. The upper end of the outer wall portion 311 may include a surface 312, which extends from the outer surface of the outer wall portion 311 to the lower-end holding portion 313 and faces the lower end of the grille 20. The lower end of the grille 20 may be placed on the surface 312. The surface 312 may be formed on the upper end of the base outer wall portion 311 to have a shape corresponding to the lower end of the grille 20, and the width of the surface 312 may substantially correspond to the thickness of the grille 20.

The outer surface of the lower-end holding portion 313 may contact the inner surface of the grille 20 such that the lower-end holding portion 313 supports the lower end of the grille 20. For example, when the grille 20 is formed of a metal material, the grille 20 may be deformed so as to correspond in shape to the shape of the lower-end holding portion 313. Therefore, the lower end of the grille 20 may remain in the shape corresponding to the lower-end holding portion 313 even if pressure (e.g., a user's grip) is applied to the exterior surface of a lower portion of grille 20.

The grille 20 may be formed as a cylinder by rolling a metal panel to have a circular cross-sectional shape. If the lower-end holding portion 313 extends in an elliptical form along the upper end of the outer wall portion 311, the cylindrical grille 20 may be deformed in an elliptical shape so as to correspond to the shape of the lower-end holding portion 313 when the lower end of the grille 20 is fitted onto the lower-end holding portion 313. Furthermore, the grille 20 may remain in the deformed shape while coupled to the lower-end holding portion 313.

An annular rib 315 may protrude upward from an inner surface of the base body 31. The rib 315 may be formed inside the lower-end holding portion 313. The main body 40 may include an insertion rib 47, which protrudes downward from the lower surface of each of the cases 41 and 42. The insertion rib 47 may be inserted into a groove 314 between the lower-end holding portion 13 and the rib 315.

The base bottom portion 310 of the base body 31 may have a recess 316. The recess 316 may be surrounded by the rubber insertion groove 318. The recess 316 may include a recess side portion 316a extending upward from the periphery of an opening formed in the bottom surface, and a recess bottom portion 316b extending horizontally from the recess side portion 316a so as to form the bottom of the recess 316 (i.e., when the hub 1 is positioned upside down such that a user is viewing the bottom surface of the base 30).

Although not illustrated, the hub 1 may include an adaptor for receiving external commercial alternating current (AC) power, converting the AC power to DC power, and supplying the DC power for the operation of the hub 1. The adaptor may be accommodated in the recess 316, and an output terminal for the adapter may be connected by a cord to a socket 391 in the recess side portion 316a. A receptacle 390 associated with the socket 391 may be located on the lower surface of the main PCB 48. The receptacle 390 may electrically connect the socket 391 to the main PCB 48 such that power is provided by the adapter to the main PCB 48.

A cord-fixing groove 37 may be formed in the base body 31. The cord-fixing groove 37 may be formed between both the ends 318a and 318b of the rubber insertion groove 318. The cord-fixing groove 37 extends from an inner opening 371 formed in the recess side portion 316a to an outer opening 372 formed in the base outer wall portion 311. The cord-fixing groove 37 may further include a cord insertion slot 373, which is formed in the lower surface of the base bottom portion 310 and extends to connect the inner opening 371 and the outer opening 372. The cord-fixing groove 37 may have an inner diameter which is greater than a width of the cord insertion hole 373. Because the cord typically has an outer coating that is somewhat elastic, the cord may be slightly deformed to pass through the cord insertion hole 373. Once the cord has been inserted into the cord-fixing groove 37, the cord returns to an original shape thereof and is held within the cord-fixing groove 37 by the cord insertion hole 373. In one example, the outer opening 372 may be greater in diameter than the inner opening 371, and the cross section of the cord-fixing groove 37 may gradually decrease in size between the outer opening 372 and the inner opening 371.

Insertion-hole-reducing protrusions 319a and 319b may be formed on the inner surface of the cord-fixing groove 37. The insertion-hole-reducing protrusions 319a and 319b may be formed on at least one of opposite portions defining the cord insertion hole 373. Because the width of the cord insertion hole 373 may be reduced in the portion in which the insertion-hole-reducing protrusions 319a and 319b are formed, the insertion-hole-reducing protrusions 319a and 319b help to prevent the cord from being separated from the cord-fixing groove 37.

A Wi-Fi reset switch 77 may be provided on the lower surface of the main PCB 48. The Wi-Fi reset switch 77 may be configured as a contact switch and may be exposed through the aperture formed in the base bottom portion 310 within the recess 316. When the Wi-Fi reset switch 77 is pushed, the controller 82 may initialize (reset) the Wi-Fi module 50a.

A hub reset switch 76 may be located on the lower surface of the main PCB 48. The hub reset switch 76 may be configured as a contact switch, and may be exposed through the aperture formed in the base bottom portion 310 within the recess 316. When the hub reset switch 76 is pushed, the controller 82 may be reinitialized or reset.

Referring to FIGS. 35 to 38, as described above, the hub 1 may include the cylindrical metal grille 20 having the through-holes 20h (see FIG. 3). The main body 40 with the speaker 43 and/or 44 may be placed within the grille 20 (see FIG. 22). The cover 10 may be coupled to the top of the main body 40 and may have the upper surface for displaying the interface screen (see FIG. 3). The base 30 may be positioned below the main body 40 to support the main body 40 (see FIG. 3).

Hereinafter, the grille 20 may be formed as a cylinder is defined as a main shape 600. The main shape 600 includes an upper end 610 forming a circular opening in a plane PN2 inclined at a predetermined angle (θ2, see FIG. 6A) relative to the horizontal plane PN1. The main shape 600 further includes a lower end 620 acquired by orthogonally projecting the upper end 610 on the horizontal plane PN1. The lower end 620 may have an elliptical corresponding to the shape of the base 30. The main shape 600 may correspond to an exterior surface of the grille 20 having the cross sections, as illustrated in FIGS. 6A and 6B.

To manufacture the hub 1, first, a flat metal panel 710 is prepared (Step 1). The metal panel 710 may be a stainless steel (SUS) panel or may be formed of another material, such as aluminum, a different metal or even include non-metallic materials such as a plastic or ceramic. Although the flat metal panel 710 may have a substantially rectangular shape in an exemplary embodiment, the shape of flat metal panel 710 is not limited solely to the rectangular shape. For example, flat metal panel 710 may be formed in a rhombus shape and the angled sides may be connected to form the cylinder main shape 600 with an angled seam.

Thereafter, the metal panel 710 may be processed to have a shape corresponding to the outer surface of the main shape 600 and to include the through-holes 20h therein (Step 2). This processing may include etching the metal panel 710. For example, peripheral portions of the metal panel 710 may be removed (e.g., cut or etched away) to form a desired shape. For example, a shaped metal panel 720, which has the form illustrated in FIG. 36 (portion c), may be acquired by corroding the region designated by diagonal lines in FIG. 36 (portion b). In the illustrated example, the shaped metal panel 720 may have a curved upper surface, and when the shaped metal panel 720 is formed into a cylinder form, the curved upper surface may form an inclined plane. Furthermore, a region of the metal panel 710 may be etched or otherwise processed (e.g., drilled) to form the through-holes 20h.

Figure 37:
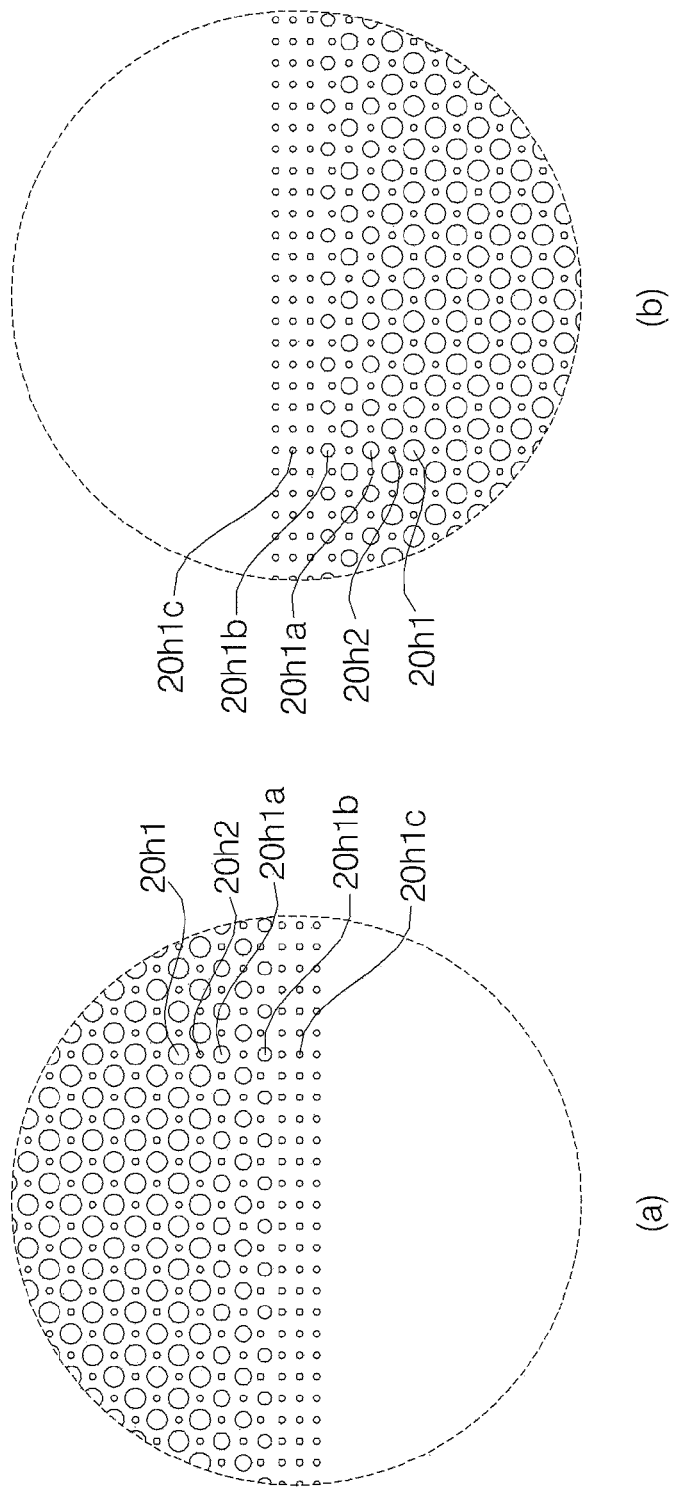
FIG. 37 is an enlarged view of portion A and portion B illustrated in FIG. 36.

Referring to FIG. 37, the through-holes 20h formed in the grille 20 may include first through-holes 20h1, and second through-holes 20h2, which have a diameter smaller than the first through-holes 20h1. The first through-holes 20h1, and second through-holes 20h2 may be provided in an arrayed pattern in which the first through-holes 20h1 and the second through-holes 20h2 alternate in both vertical and horizontal directions.

For example, the first (larger) through-holes 20h1 and the second (smaller) through-holes 20h2 may be alternatively positioned in in vertical directions to form columns of through-holes 20h1 and 20h2. The through-holes 20h1 and 20h2 may similarly be alternatively positioned in horizontal direction to form rows of through-holes 20h1 and 20h2. Although shown as having similar (i.e., circular) shapes, the first through-holes 20h1 and the second through-holes 20h2 may have different shapes (e.g., oval, rectangle, etc.) or may have similar shapes that extend in different directions The pattern of the through-holes 20h1 and 20h2 may increase the area in the grille 20 through which sound output from the speakers 43 and 44 is discharged. For example, positioning the smaller through-holes 20h2 between the larger through-holes 20h1 in the alternating array pattern may enable the grille 20 to have more open surface area to pass sound in comparison to using only the first through-holes 20H1. Furthermore, vertically and horizontally alternating the through-holes 20h1 and 20h2 may allow grille 20 to be more pliable and, therefore, enable smoother deformation of the grille 20 when rolling the shaped metal panel 720 into a cylindrical shape. Vertically and horizontally alternating through-holes 20h1 and 20h2 may additionally increase structural stability of the grille 20 due to an increased number of links between the through-holes 20h1 and 20h2.

Figure 36:
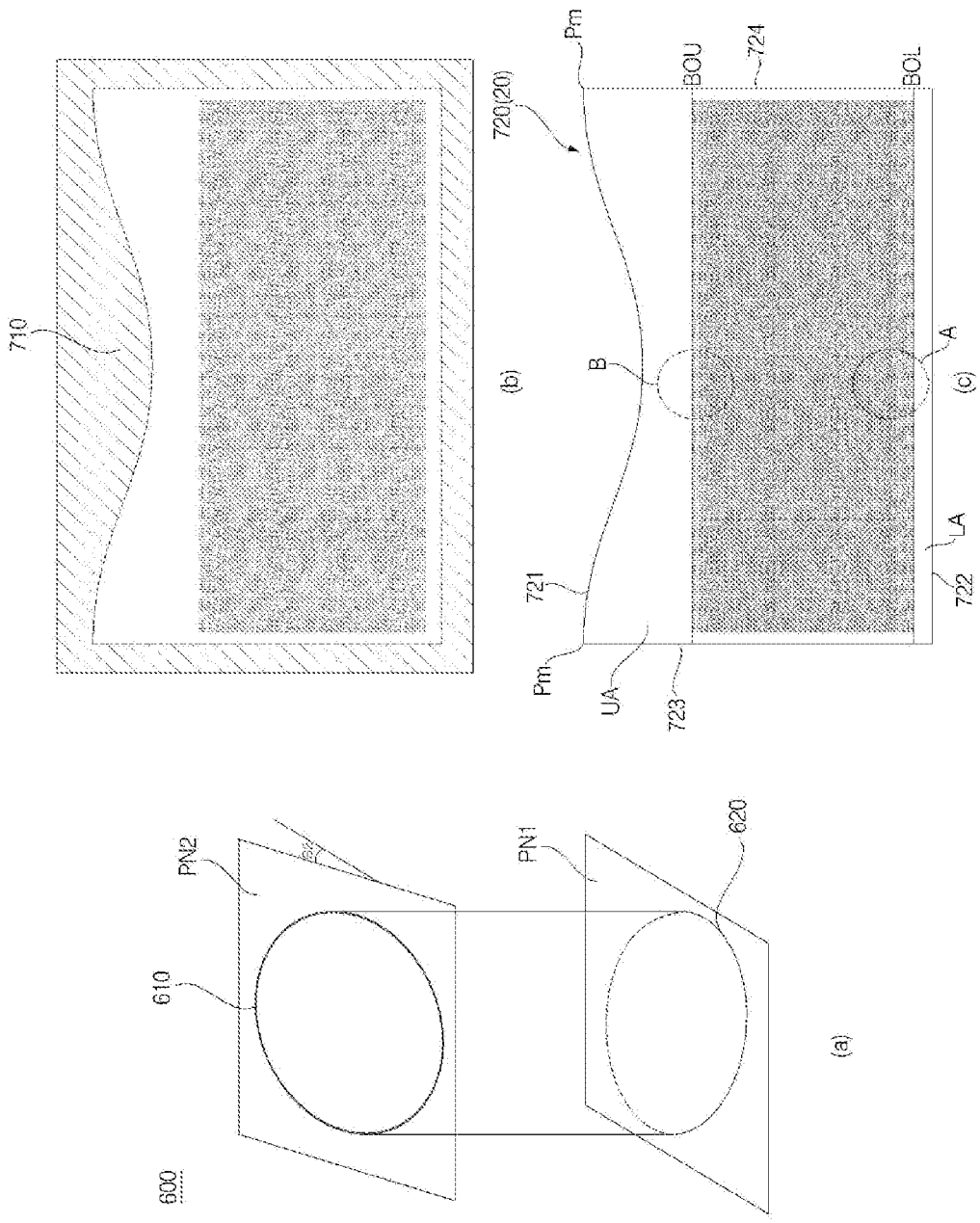
FIG. 36 illustrates a perspective view of a main shape, a flat metal panel used to process a grille, and the grille formed by etching the flat metal panel.

Referring to FIG. 36 (portion b), no through-holes 20h1 and 20h2 may be included in a lower-end peripheral portion LA in formed in a region from a lower end 722 of the grille 20 to a first boundary BOL parallel to the lower end 722. The lower-end holding portion 313 of the base 30 may come into close contact with the inner surface of the lower-end peripheral portion LA. Because the lower-end peripheral portion LA may be deformed while being fitted into the lower-end holding portion 313, the lower-end peripheral portion LA may exclude the through-holes 20h1 and 20h2 so that the lower-end peripheral portion LA has greater rigidity.

Referring to FIG. 37 (portion a), in any one column in which the first through-holes 20h1 and the second through-holes 20h2 are alternately repeated, the diameter of two or more first through-holes 20h1a, 20h1b and 20h1c is reduced with decreasing distance to the first boundary BOL so that the first through-hole 20h1c closest to the first boundary BOL has the minimum diameter. That is, the grille 20 may have the pattern in which the first through-holes 20h1 and the second through-holes 20h2 alternate in the horizontal and vertical directions away from an edge or boundary of the grille 20. Near the edge or boundary of, a diameter of the first through-holes 20h1 may gradually be reduced in the portion close to the first boundary BOL. For example, closest first through-hole 20h1c (e.g., the through holes positioned in one or more rows or columns closest to the boundary) may have a diameter smaller than the other first through-holes 20h1a and 20h1b. Intermediate first through-hole 20h1b are positioned in one or more rows or columns farther from the boundary BOL then the rows/columns for the closest first through-hole 20h1c. Intermediate first through-hole 20h1b may have a larger diameter than the closest first through-hole 20h1a. The far through-hole 20h1a are positioned in one or more rows or columns farther from the boundary BOL then the rows/columns for the through-hole 20h1c and 20h1b, and may have a larger diameters than the through-hole hole 20h1c and 20h1b. Thus, the grille 20 may have through-holes having a pattern in which the first through-holes 20h1 and the second through-holes 20h2 are repeated, and the diameter of the first through-holes 20h1 is gradually reduced in the portion close to the second boundary BOU in the order of the through-hole 20h1a (which has a diameter smaller than the other through-holes 20h1), the through-hole 20h1b and the through-hole 20h1c, as illustrated in FIG. 37.

As shown in FIG. 36, the outer shape of the flat metal panel 720 may be processed such that opposite lateral sides 723 and 724 are substantially straight and extending orthogonally from the center of the rear surface of the grille 20. Consequently, when the processed flat metal panel 720 is rolled into a cylindrical shape, the sides 723 and 724 may meet each at a straight line VL orthogonally extending downward from the uppermost point Pm.

The two sides 723 and 724 of the processed flat metal panel 720 may be bonded to each other or otherwise coupled so as to form the cylindrical grille 20 in which a curved side 721 corresponding to the upper end 610 of the main shape 600 forms an upper end 21 of the grille 20 and a straight side 722 corresponding to the lower end 620 of the main shape 600 forms a lower end 22 of the grille 20 (Step 3). Because the cylindrical grille 20 may be deformed from the flat metal panel 720 by circularly rolling the flat metal panel 720, the shape of the grille 20 may be determined by the plasticity and the elasticity or the restoring force of the material thereof. Consequently, the upper end 21 and the lower end 22 of the grille 20 may have various shapes or forms. Nevertheless, the flat metal panel 720 may have a substantially consistent width between sides 723 and 724, as illustrated in FIG. 37 (portion b), and the cylinder grille 20 formed from the flat metal panel 720 may have a cross-section that is substantially similar to a circle.

Figure 38:
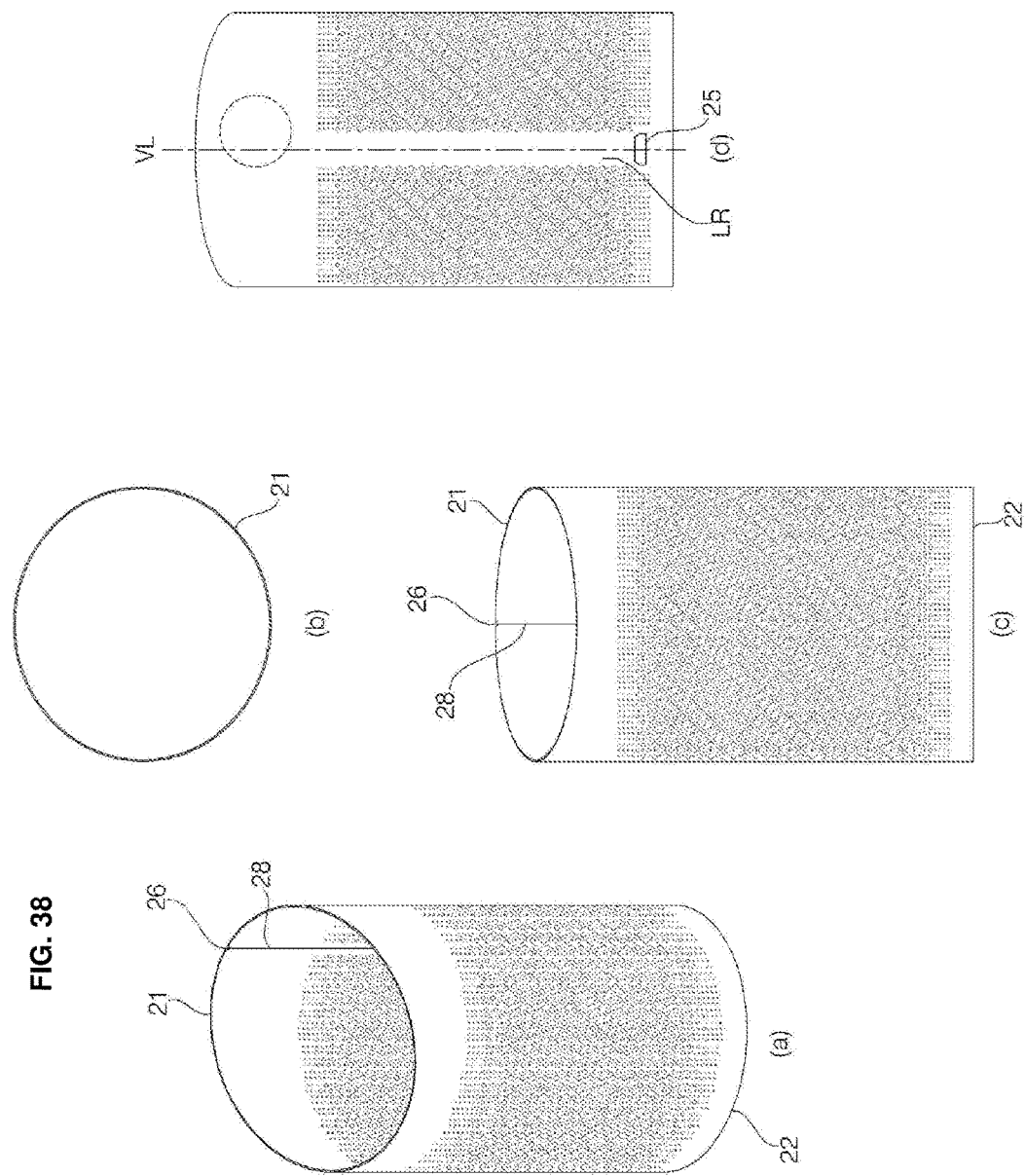
FIG. 38 is a perspective view, a plan view, a front view, and a rear view of the grill.

As shown in FIG. 38, the grille 20, when viewed from the rear side, may be horizontally symmetrical about a vertical line VL. A region LR of the grille 20 may extend from the lower end 20 to the upper end 21 along the vertical line VL and may extend a width W from the vertical line VL. A region LR, may not include any through-holes 20h. The region LR of the grille 20 may be formed by the left and right portions of the flat metal panel 720 in which no through-holes 20h are formed, as illustrated in FIG. 36 (portion c).

In Step 3, the two sides 723 and 724 of the flat metal panel 720 may be bonded together (e.g., at vertical line VL) to form the cylinder main body 600. The boding may include welding together the two sides 723 and 724. The welding may be performed using a welding rod. In this case, strip-shaped welding beads may be formed via melting the flat metal panel and the welding rod. In other examples, resistance welding (e.g. spot or projection welding) or laser welding may be used bond the two sides 723 and 724. In resistance welding, welding beads are limited to a specific portion compared to welding using a welding rod. In laser welding, the welding heat input is very small, the range of thermal effect is narrow, and the smallest welding beads are left, enabling very precise bonding between members. In other examples, the two sides 723 and 724 of the flat metal panel 720 may be bonded together without welding, such as through the use of mechanical couplers (e.g., rivets), an adhesive, a chemical bonding (e.g., electrostatic bonding), by physically shaping the two sides 723 and 724 to forming interlocking structures, etc.

Referring to FIG. 38, the grille 20, after being formed via the steps described above, may be processed to include a hole 25 for the installation of the universal serial bus (USB) port 62 (see FIG. 25) or other ports for other connections (e.g., an audio output port to connect to other speakers or a audio system). The grille 20 may also include a positioning recess 26 for the insertion of the positioning protrusion 156 (see FIG. 21) formed on the sidewall 151 of the cover housing 15. The hole 25 for the installation of the USB port and the positioning recess 26 may be formed in the region LR of the rear surface of the grille 20 in which no through-holes 20h are formed (see FIG. 38 (portion d)). The hole 25 and the recess 26 may be formed by any one of known various processing methods, such as pressing, punching, or drilling.

The hole 25 may be processed in the welded portion of the two sides 723 and 724 of the flat metal panel 720 (Step 4). The hole 25 may be positioned to enable access to the USB port 62 located on the main PCB 48 (see FIG. 28). The recess 26 may be indented from the upper end 21 of the grille 20 so as to be formed in the welded portion (e.g., along line VL).

Thereafter, the welded portion of the two sides 723 and 724 of the flat metal panel 720 on the outer surface of the grille 20 may be polished (Step 5). For example, the welded portion (e.g., region LR) may be is polished using a sheet of abrasive material (e.g., sandpaper) to form a smooth surface having no welding beads may be acquired. In another example, the welded portion may be polished using a chemical treatment or may be polished by propelling a stream of abrasive materials (e.g., sandblasting) However, welding beads 28 may still remain after polishing in step 5 because the inner surface of the grille 20 is not polished.

Figure 39:
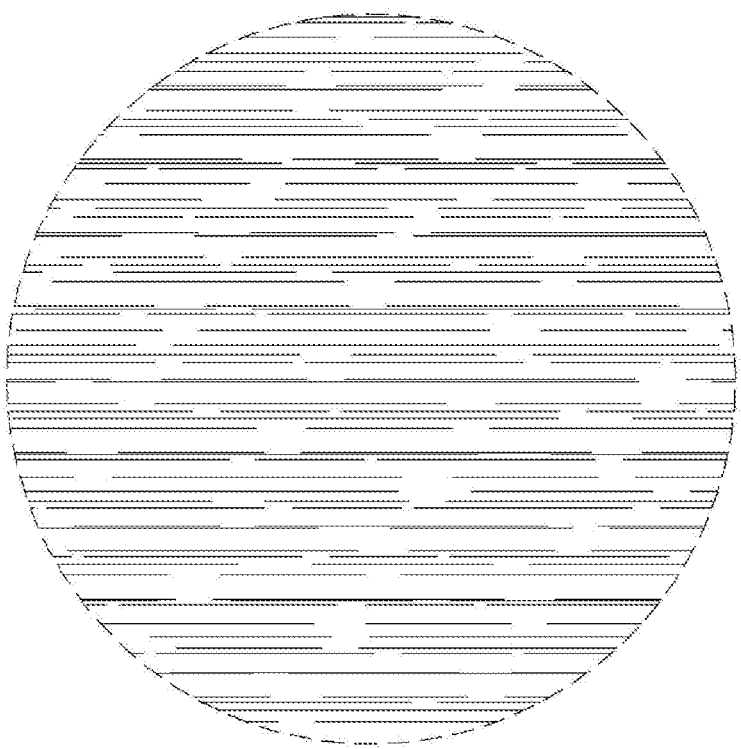
FIG. 39 is an enlarged view of portion marked by a dotted line in FIG. 38.

After removing the welding beads, the outer surface of the grille 20 may be prepared for painting, such as to polish the outer surface until hairlines are formed (see FIG. 39) (Step 6). The hairlines may be formed by cutting or scoring a metal surface using an abrasive paper having a prescribed particle size, and the hairlines may extend in a direction (e.g., horizontally) corresponding to a direction that the abrasive sheet is moved again the grille 20. The hairlines may help emphasis a unique luster and texture of the metal on the outer surface of the grille 20.

The grille having with the hairlines may be painted (Step 7). The painting of the grille 20 may be electro-plating. For example, the grille 20 may be introduced into a tank having a soluble resin plaint and an electric current may be applied to the grille 20 to cause a coating to be formed on substantially the entire surface of the grille 20. One or more marks may be formed in the outer surface of the painted grille 20 via laser processing (Step 8). The marks may include symbols, characters, figures, and the like.

A filter may be attached to the inner surface of the grille 20 formed via the above-described steps (Step 9). The filter may be formed of a piece of mesh or nonwoven fabric having fine holes. The filter may be attached to the inner surface of the grille 20 via an adhesive member, such as a piece of double-sided tape.

Referring to FIGS. 5 and 32, as described above, the upper-end holding portion 153 of the cover 10 may have a shape corresponding to the upper end 610 of the main shape 600. Furthermore, the base 30 may be provided with the lower-end holding portion 313 having a shape corresponding to the lower end 620 of the main shape 600.

The grille 20 may be fitted into the lower-end holding portion 313 and the upper-end holding portion 153. The cover 10 and the main body 40 may be coupled by the inserting upper-end holding portion 153 into the opening (i.e. the region surrounded by the upper end of the grille 20) formed in the upper surface of the grille 20 after the main body is inserted into the grille 20, as described above with reference to FIG. 5. When the cover 10 and the main body are coupled in this manner, the inner surface of the upper portion of the grille 20 may contact the outer surface of the upper-end holding portion 153 to cause the upper end of the grille 20 to be deformed into a shape corresponding to the shape of the upper-end holding portion 153.

In the same manner, when the lower-end holding portion 313 is inserted into the opening (i.e. the region surrounded by the lower end of the grille 20) formed in the lower surface of the grille 20, as described above with reference to FIG. 32, the inner surface of the lower portion of the grille 20 may contact the outer surface of the lower-end holding portion 313 such that the lower end of the grille 20 is deformed into a shape corresponding to the shape of the lower-end holding portion 313.

A hub (or a sound output apparatus) of the present disclosure may provide an interface screen, which displays information transmitted and received to and from surrounding devices via a communication module that wirelessly communicates with the surrounding devices, thereby enabling the management of various kinds of surrounding devices and the easy understanding of information acquired from devices in the Internet of Things.

In addition, when the interface screen is displayed on the upper surface of the hub, visibility is improved. In particular, such visibility is further improved when the interface screen is inclined. In addition, because coupling regions between elements are located within a cylindrical grille, an aesthetically pleasant external appearance of the hub is accomplished.

In addition, because the upper and lower ends of the grille are respectively fitted to a cover and a base, the grille may be fixed without separate fastening members. In addition, in the process of coupling the cylindrical metal grille to the cover and the base, the upper and lower ends of the grille have a fixed shape using the plasticity of a metal material thereof, which allows the grille to be provided with a fixed shape in a simplified manner. In addition, when a main PCB is located between the base and the main body, the utility of space is improved.

In addition, it is possible to manage an electronic appliance by, for example, sensing the state of the electronic appliance or controlling the operation of the electronic appliance using the function provided by an accessory, which is separate from the electronic appliance, via communication with the accessory. In particular, even if the kind of the accessory or the electronic appliance is changed, the hub may be applied to the changed appliance when the configuration of the interface thereof is changed, which results in increased versatility and expanded use range of the hub.

In addition, the upper end of the grille and the cover define a continuous curvilinear contour, which provides the hub with an improved unified external appearance. In addition, an interface screen is provided, which displays information exchanged via a communication module performing wireless communication with surrounding devices, thereby enabling management of various kinds of the surrounding devices and allowing easy understanding of information acquired from appliance in the Internet of Things.

In addition, because a window, which is placed on the upper surface of the hub to expose the screen, functions as a button for manipulating the interface, the hub may realize a simple external appearance without buttons. In addition, specific areas on the window, to which a display screen output from the interface is projected, may function as buttons for manipulating the interface, which enables more intuitive manipulation of the interface. For example, four areas on the window surrounding the region from which the interface screen is exposed, namely to the front and rear and the left and right thereof, may function as buttons, and thus a menu item displayed on the interface may be scrolled in four directions or the selection of menus items in the respective directions may be easily performed.

In addition, the respective areas on the window, which function as buttons, have uniform manipulation performance. Here, "uniform manipulation performance" means that contact switches corresponding to the respective areas are accurately operated when the respective areas are pushed. In addition, in the hub of the present disclosure, the window, which is inclined relative to the horizontal plane, and the inner surface of a cover housing, which surrounds the side surface of the window, are parallel to each other, whereby the gap between the window and the inner surface of the cover housing may be constant throughout the external appearance of the hub, which provides an aesthetically improved upper surface to the hub.

In particular, even when the window has a circular shape, a constant gap between the window and the inner surface of the cover housing may be maintained. In addition, even if the hub is moved or an external shake is applied to the hub, a display panel, which outputs the interface screen, may remain at a fixed position without shaking, which may prevent the interface screen, which is visible through a transparent portion of the window, from being moved to one side.

In addition, the position at which the display panel will be installed may be indicated via a rib formed on a partition, which supports the display panel, which may prevent assembly failure in the manufacturing process. In addition, the window, to which the screen of the display panel is projected, includes a predetermined transparent portion for showing the interface screen, and the remaining portion of the window may be colored or provided with a film attached thereto. In this case, the display panel may be installed at the correct position so that the screen is accurately located at a fixed position within the transparent portion, rather than being erroneously moved to one side.

In addition, in the hub of the present disclosure, an antenna for the communication module is located outside the metal grille, which may prevent signal interference or interception by the metal grille. In addition, when the antenna connected to the communication module is located on the inner surface of the cover housing above the grille, the antenna is not exposed to the outside of the hub, which imparts an aesthetically improved external appearance to the hub.

In addition, when the antenna is spaced apart from a display PCB placed within the cover housing, it is possible to reduce signal interference due to a magnetic field, which is generated by current flowing in the display PCB. In particular, a sidewall of the cover housing may be gradually increased in height from the upper end of the grille with increasing distance from the front end thereof or decreasing distance to the rear end thereof. In this case, when the antenna is placed on the rear portion of the sidewall, sufficient distance between the antenna and the grille may be attained.

In the hub of the present disclosure, the upper surface of the hub, on which the interface screen is displayed, is inclined relative to the horizontal plane. As such, compared to the horizontal upper surface, the angle between the upper surface and the user's eyes, located in front of the hub, may be increased, which may minimize the distortion of the screen as experienced by the user. In addition, the horizontal cross section of the grille may have a shape acquired by orthogonally projecting the inclined upper surface on the horizontal plane. As such, when viewed from the top side, the entire hub may have a unified cylindrical external appearance.

In addition, when the grille has an elliptical horizontal cross-sectional shape, the left-to-right length of which is longer than the front-to-rear length, the area through which sound output from the speaker inside the grille is emitted forward may be increased compared to the case where the grille has a fixed circular horizontal cross section. In addition, when the base has an elliptical lower surface, the left-to-right length of which is longer than the front-to-rear length, it is possible to prevent the hub from easily falling due to the application of an external force thereto in the left-to-right direction.

In the hub of the present disclosure, the grille is processed in such a manner that first through-holes and second through-holes, which have a smaller diameter than the first through-holes, form successively repeated patterns in all directions. This may increase the area through which sound output from the speaker inside the grille is emitted, resulting in improved sound quality.

In addition, the grille may achieve sufficient rigidity despite a great number of through-holes formed therein. In addition, the upper and lower ends of the grille, which are respectively coupled to the cover and the base, are not provided with the through-holes, thus achieving firm coupling with the cover and the base.

The hub of the present disclosure may dissipate heat generated from various electric elements, such as a control unit (or controller), via a radiator. In addition, in order to prevent vibrations output from the speaker, which is provided in the main body, from being directly transferred to the base, a space is provided between the main body and the base. When the main PCB and the radiator are installed in the space, the amount of a dead space may be reduced and the space may serve to dissipate heat from the radiator. In addition, when a flat portion of the radiator is spaced apart from the lower surface of the main body, it is possible to prevent vibrations output from the speaker from being transferred to the flat portion, and consequently, to reduce vibrations of the radiator and noise caused thereby.

The hub of the present disclosure may not easily fall backward due to friction between a support rubber and the supporting surface on which the hub is placed. In addition, even if the hub is placed on a wet surface, the base body is spaced apart from the wet surface by the support rubber, thereby preventing the base body from becoming wet.

In addition, because an adaptor provided at the end of a power cord is accommodated in a recess formed in the bottom of the hub, it is possible to prevent the adaptor from cluttering the area around the hub. In addition, when a power cord fixing recess is formed in the base body, even if the power cord is pulled by an unnecessary external force or when the hub is lifted by the user, the tensile force is distributed, which prevents the power cord from being easily separated.

Certain aspects of the present disclosure provide a hub (or a sound output apparatus), which displays a screen for outputting information received from or transmitted to surrounding devices via a communication module, which wirelessly communicates with the appliances. In particular, the object aims to provide an interface screen that may allow a user to easily recognize information, which is received from and/or transmitted to other IoT devices, and that may control the appliance with the IoT device.

Aspects of the present disclosure provide a hub which provides the interface at a position that is optimized in consideration of visibility. Aspects of the present disclosure also provide a hub which minimizes exposure of couplings between components as possible as it can. In particular, the couplings are hidden by a cylindrical grille Aspects of the present disclosure also provide a hub in which a main body provided with a speaker is placed within a cylindrical grille, a cover is coupled to the top of the grille, and a base is coupled to the bottom of the grille, thereby achieving a unified external appearance defined by those components. Aspects of the present disclosure also provide a hub in which the grille is fixed without using fastening members, such as bolts, when the grille is formed of a metal material.

Aspects of the present disclosure also provide a hub which includes a cylindrical metal grille whose shape is deformed using plasticity of a metal material in the process of coupling the grille to the cover and/or the base Aspects of the present disclosure also provide a hub in which a main PCB is placed between a base and a main body.

Aspects of the present disclosure also provide a hub which is capable of communicating with an accessory via a communication module, to set the function of the accessory, and to manage a home network based on information received from the accessory. Aspects of the present disclosure also provide a hub which is capable of managing an electronic appliance by, for example, sensing the state of the electronic appliance or controlling the operation of the electronic appliance using the function provided by an accessory, which is separate from the electronic appliance, via communication with the accessory.

Aspects of the present disclosure also provide a hub in which the upper surface of a cover, on which information of a display is displayed, has a circular shape and is inclined at a predetermined angle relative to the horizontal plane, and in which the upper end of a grille and the cover, on which the display is installed, define a continuous curvilinear contour when the upper end of the grille is coupled to the cover. Aspects of the present disclosure also provide a hub in which a display for outputting an interface screen and a window for showing the screen of the display are installed on a cover coupled to the top of a main body, wherein a user is able to manipulate the interface by pushing the window.

The main body is provided with a communication module for wirelessly communicating with surrounding devices, and the interface screen displays information received from and transmitted to the surrounding devices via the communication module. In this way, the object aims to provide a hub which may allow the user to easily check information transmitted to and received from various appliances, such as appliances in the Internet of Things, which has recently received attention, via mutual communication, and which may allow the user to control the appliances by manipulating the interface via a simplified motion of pushing preset portions of the window.

Aspects of the present disclosure also provide a hub, in which a display PCB, on which a display is mounted, is provided in a cover and at least one contact switch used for various purposes, for example manipulation of an interface displayed on a screen and manipulation of playback of a speaker, is provided on the display PCB, and in which a window support plate for supporting a window is placed inside the cover, and the window support plate operates the contact switch responsive to a pressure applied on the window support plate through the window.

The window support may include a window support plate provided with an opening and provided on an upper surface of the window support plate. The window support plate is supported by a plurality of support bosses and is provided on the lower surface thereof with manipulation protrusions at positions corresponding to the respective contact switches, whereby the window support plate is bent about the portion thereof supported by the support bosses when a given portion of the window is pressed, causing the manipulation protrusions to press the contact switches. In this structure, a user will operate the contact switches by selectively pushing four areas on the window corresponding respectively to the contact switches. That is, the window functions as a button for operating the contact switches, and the aspects of the present disclosure ensure that all of the four areas to accurately perform the function described above.

Aspects of the present disclosure also provide a hub, in which a window support plate is provided with support bosses at appropriate positions so that areas on the window support plate (each area being provided with a manipulation protrusion), corresponding respectively to the contact switches, may be smoothly bent about the support bosses. Aspects of the present disclosure also provide a hub, in which a window support plate is centrally provided with an opening for allowing a display screen to be seen from the top side, and in which a display panel normally has a rectangular shape having a horizontal length longer than a vertical length thereof and is horizontally provided along the left-to-right direction of the sound output apparatus. The opening in the window support plate also has a shape corresponding to the shape of the display panel so that the horizontal length (or the left-to-right length) thereof is longer than the vertical length (or the front-to-rear length) thereof. In this case, manipulation protrusions are provided on front and rear areas and left and right areas of the window support plate about the opening. Because the opening has a left-to-right length longer than a front-to-rear length thereof, among the four areas of the window support plate, the front and rear areas have different widths from the left and right areas, which causes the distances between the support bosses and the manipulation protrusions to be different in the respective areas depending on the area in which the support bosses are formed. Therefore, aspects of the present disclosure eliminate this difference.

Aspects of the present disclosure also provide a hub including a display, which displays an interface screen based on information transmitted to and received from surrounding devices via a communication module wirelessly communicating with the surrounding devices, and a window which allows the interface screen to be seen from the outside, the window constituting the upper surface of the hub. Here, the window is located in an open region of the upper surface of a cover housing, which constitutes the top of the hub.

The present disclosure achieves a constant distance between the inner surface of the cover housing, which defines the open region, and the side surface of the window when the window is inclined relative to the horizontal plane in consideration of the user's eyes upon the window.

Aspects of the present disclosure also design the shape of a cover housing so that a mold, which is used to form the outer shape of the cover housing, and a mold, which forms a portion of the inner surface of the cover housing that defines a window installation region, may be discharged in different directions. Aspects of the present disclosure also provide a hub which allow a display panel to remain at a fixed position even if the hub is moved or external shocks are applied to hub. Aspects of the present disclosure also provide a hub which may maintain a display disposed on a display PCB so as to prevent shaking thereof using a structure (partition) for supporting the display PCB.

Aspects of the present disclosure also provide a hub, which may accurately indicate the position at which a display panel will be installed, and in particular, to provide a hub in which the display panel is located at a position corresponding to an opening or a transparent portion when a window or a window support is located above the display panel and the position of the display panel is reliably maintained.

Aspects of the present disclosure also provide a hub in which a window, on which a display panel screen is projected, includes a predetermined transparent portion for showing an interface screen, and in which the remaining portion of the window may be colored or provided with a film attached thereto. In this case, the object aims to install the display panel at the correct position so that the screen is accurately located at a fixed position within the transparent portion.

Aspects of the present disclosure also provide a hub in which a main body provided with a speaker is placed within a cylindrical metal grille having therein a plurality of through-holes and a communication module, which wirelessly communicates with surrounding devices, is placed in the main body without the risk of signal interference or interception by the grille.

Aspects of the present disclosure also find an appropriate position at which an antenna connected to a communication module may be attached to the exterior of a grille. Aspects of the present disclosure also provide a hub, which prevents a display PCB from impeding the signal transmission/reception performance of an antenna Aspects of the present disclosure also provide hub, in which the upper surface thereof, on which an interface screen is displayed, and the user's eyes in front of the hub form an angle close to a right angle, which may minimize distortion of the screen. Aspects of the present disclosure also provide a hub, which has a unified cylindrical external appearance when a circular window, which constitutes the upper surface of the hub, is inclined relative to the horizontal plane. Aspects of the present disclosure also configure a grille to have an appropriate shape so as to provide a hub with a unified external appearance.

Aspects of the present disclosure also provide a hub, in which a speaker is placed within a grille having therein a plurality of through-holes for the emission of sound, and the area of a front surface portion of the grille (i.e. the area of the grille that is seen from the front side) may be increased in order to increase the proportion of sound, output from the speaker, that is emitted forward from the hub.

Aspects of the present disclosure also prevent a hub placed on a shelf, which is installed on the wall located behind the hub, from falling when an external force is applied to the left or right side surface thereof, although the wall prevents the hub from falling backward or falling from the shelf even if it is pushed rearward. Aspects of the present disclosure also provide a grille having therein a great number of through-holes in consideration of a speaker mounted on a main body placed within the cylindrical grille.

Aspects of the present disclosure also position through-holes formed in a grille so as to achieve a desired rigidity of the grille. Aspects of the present disclosure also provide a hub in which a grille has a specified area in which through-holes are formed, such that the upper end and lower end of the grille, which are respectively coupled to a cover and a base, have sufficient rigidity.

Aspects of the present disclosure also provide a hub, which includes a radiator for dissipating heat generated from various electric elements, such as a control unit (or a controller). Aspects of the present disclosure also provide a hub in which a main PCB and a radiator for dissipating heat from the main PCB are provided in the space between a main body and a base.

Aspects of the present disclosure also provide a hub, which prevents vibrations output from a speaker provided in a main body from being transferred to a radiator. Aspects of the present disclosure also provide a hub, which has no risk of falling owing to increased friction between the surface on which the hub is placed and the hub.

Aspects of the present disclosure also provide a hub, in which a base body constituting a base, which supports a main body, has no risk of becoming wet even if the hub is placed on a wet surface. Aspects of the present disclosure also provide a hub, in which a space for accommodating an adaptor at the end of a power cord is defined in the bottom of the hub.

Aspects of the present disclosure also provide a hub, which may prevent a power cord from being easily separated therefrom. In one aspect of the present disclosure, a hub (or a sound output apparatus) includes a communication module provided in a main body thereof, wherein the hub wirelessly communicates via the communication module with a surrounding device (for example, a Internet of Thing (IoT) device having a sensor) and a screen is displayed on the upper surface of the hub based on information exchanged via the communication module. The main body may include a speaker so that the hub functions as a sound output means.

To allow sound, output from the speaker, to be discharged, the main body may be provided in a cylindrical grille having a plurality of through-holes formed therein, and the grille may have an upper end of coupled to a cover, which displays the screen, and a lower end coupled to a base. The coupling of the grille and the cover may be realized without using separate fastening members, such as bolts, but is realized in such a manner that an rib-type upper-end holding portion, which is formed in the base, is inserted (or fitted) into an opening formed in the upper end of the grille. The coupling of the grille and the base is realized in a manner that a rib-type lower-end holding portion, which is formed in the base, is inserted into an opening defined by the lower end of the grille.

The grille may be formed by processing a metal panel. The upper-end holding portion and the lower-end holding portion may come into close contact with the inner surface of the grille, and thus, the upper end of the grille of the metal panel is deformed to correspond to the shape of the upper-end holding portion, and the lower end of the grille is deformed to correspond to the shape of the lower-end holding portion. That is, each of the upper-end holding portion and the lower-end holding portion may be formed in an appropriate shape to thereby form the grille in a desired shape, and, in this manner, the grille may is maintained with a cylindrical cross section.

The cover may be coupled to the main body, and include a cover housing having an opening, the cover housing is formed on the upper surface of the cover, and a display for showing the interface screen may be provided in the cover housing. In addition, a transparent window is provided in the opening so that the interface screen is visible through the window.

The window is a transparent plate processed into a circular shape, and the window is inclined upward from a front side to a rear side thereof, and a vector, acquired by orthogonally projecting a normal vector of an upper surface of the window on a horizontal plane, directs forward. That is, when the window is seen from the side surface, only the side surface defining the thickness of the window is seen, and the upper end of the side surface is located at front of the hub, while the rear end of the side surface is located at rear of the hub.

The upper surface of the window falls in the same plane as the upper end of the cover housing, and thus, the upper surface of the hub has a unified external appearance. The window may be formed in a circular shape, and in this case, the shape of the window orthogonally projected on the horizontal plane is an ellipse having a short radius in the front-to-rear direction. In particular, when the window is in a circular shape, the shape of the window orthogonally projected on the horizontal plane is an ellipse having a short radius in the front-to-rear direction and a long radius in the left-to-right direction. Thus, to achieve the hub having a unitized external appearance, the grille needs to have an elliptical shape corresponding to the elliptical window. The shape of the grille may be achieved by forming the upper-end holding portion and the lower-end holding portion in an elliptical shape.

The cover housing may include a display PCB provided below the display to support the display. Contact switches for manipulating the interfaces are provided on the upper surface of the display PCB, and the contact switches are symmetrically provided in front, rear, left, and right areas. The cover housing may further include a window support provided below the window to support the window. Apart from supporting the window, the window support function as a button for selectively operating the contact switches. Specifically, the window support may include: a window support, which is provided above the display to support the window and has an opening for exposing a screen of the display, and a support boss, which protrudes downward from the window support and is coupled to the cover housing.

The window support is in close contact with the window, and, once an area of the window corresponding to the contact switch is pressed, the window support plate is slightly bent about the support boss so that a protrusion which protrudes downward from the window support plate operates a contact switch at a corresponding location.

The cover housing may include a cylindrical sidewall, and the inside of the sidewall is divided by a partition into upper and lower regions. In addition, the partition may include an insertion boss into which a support boss protruding from the window support plate is inserted.

The window support plate may include an opening formed thereon, the opening which exposes a screen of the display provided below the window support. To correspond to a shape of a general display panel, the opening of the window support plate may be formed in a manner that a length of a front-to-rear direction is longer than a length of a left-to-right direction. In this case, the support boss may be formed in an area in front of the opening of the window support plate, and in an area at rear of the opening of the window support plate.

The main body may include a speaker case for accommodating the speaker therein, and the speaker case may be coupled to the cover within the grille. A plurality of fastening bosses extending in a horizontal direction may be formed in the cover. The speaker case may have boss insertion grooves which are indented forward and rearward. Each of the boss insertion grooves includes an opening on the upper surface of the speaker so as to allow the fastening boss to be inserted from the above.

The speaker case may be coupled to the base. The speaker case and the base may be coupled within the grille. The speaker case and the base is coupled in a manner that a fastening boss protrudes from the bottom surface of the speaker case, and the base may include an insertion boss into which the fastening boss is inserted. A fastening hole communicating with the insertion boss may be formed on the bottom surface of the base, and a bolt pass through the fastening hole from the bottom of the base to thereby be coupled to the fastening boss.

A main PCB may be provided between the bottom of the speaker case and the base body. The main PCB may include a controller which controls various electronic devices, such as the speaker, the communication module, and the display, and the main PCB may be circuit-connected to the display panel.

The display PCB may include a volume switch for increasing and decreasing volume of the speaker, and a volume button for operating the volume switch may be installed in the cover housing. An opening may be formed on the sidewall of the cover housing, and the volume button may be fixed in the opening. The base may include a base body coupled to the fastening boss of the speaker case, and a support rubber fixed onto a lower surface of the base body.

The communication module may include a Wi-Fi moduel, a BluEtooth module, a Zigbee module, a Z-wave module, and the like. The Wi-Fi module and the BluEtooth module may be provided on the rear surface of the speaker case, and, in particular, the Wi-Fi module and the Bluetooth module may be combined as one body to constitute an assembly that is detachably coupled to the speaker. The Zigbee communication module and/or the Z-wave communication module may be provided on the side surface of the speaker.

The hub has a communication module, which is provided in the body having the speaker, and wirelessly communicates via the communication module with a surrounding device (for example, a IoT device having a sensor), and an interface screen may be displayed on the upper surface of the hub based on information exchanged via the communication module.

The cover housing may be coupled to the top of the main body, and the display for showing the interface screen may be provided in the cover housing. The cover housing may include a vertically extending sidewall and a partition that extends from the inside of the sidewall to partition the inside of the sidewall into upper and lower regions.

A display PCB may be provided on the partition, and the display and four contact switches may be provided on the upper surface of the display PCB. In this case, the four contact switches may be respectively provided in the front, rear, left, and right areas about the display. The contact switches may have various functions, such as manipulating the interface screen.

A window support may be provided in the cover housing and may have an opening for exposing the interface screen, the opening which has a length of a left-to-right direction is longer than a length of a front-to-rear direction. Specifically, the window support may include: manipulation protrusions protruding downward from the window support plate at positions corresponding to the four contact switches, respectively, and operating the corresponding contact switches responsive to a pressure applied on the window support plate through the window; and a plurality of support bosses protruding downward from the window support plate and coupled to the cover housing so that the window support plate is spaced apart from the display PCB.

As the opening in the window support plate has a longer left-to-right length than a front-to-rear length, the window support plate may have an area at a left or right side of the opening is smaller than an area at a front or rear side of the opening, and the difference in the size of the areas may be significant when the window support plate is substantially circular. Thus, when the support bosses are formed in a relatively small area, a distance between a manipulation protrusion and a support boss, which belong to the area, is reduced, and this means a short moment arm, which is a short distance between a force applied from the relatively small area to the window support plate and the support bass, and thus, it suggests that a greater force is required to operate contact switches in the relatively small area. Therefore, the support bosses needs to be formed in an area at the front or rear side of the opening on the window support plate.

In this case, however, manipulation protrusions formed in an area at the left or right sides of the opening are sufficiently spaced apart from the support bosses, it is possible to smoothly operate the contact switches. In contrary, manipulation protrusions formed in an area at the front or rear side of the opening becomes relatively closer to the support bosses, and thus, a greater force needs to be applied to the area at the front or rear side of the opening. Therefore, in order to eliminate this difference in manipulation of the areas, slits extending in a left-to-right direction may be formed between the support bosses and the manipulation protrusions in areas at the front and rear side of the opening on the window support plate.

The opening of the cover housing is located on a plane that is at an accurate angle relative to a horizontal plane. That is, a normal vector with respect to the plane is at an accurate angle relative to the horizontal plane. Furthermore, a normal vector with respect to the plane in which the opening falls is at an accurate angle relative to the horizontal plane, and a vector acquired by orthogonally projecting the normal vector on the horizontal plane faces forward. This structure may be such that the lowest part of the opening is located at front of the hub, while the highest part of the opening is located at rear of the hub.

A portion of the inner surface of the cover housing, which is within a predetermined distance downward from an upper end defining the opening, is parallel with the normal vector, and the window is provided in an area of the inner surface of the cover housing, the area which is defined by the portion being parallel with the normal vector. The upper surface of the window is provided to face a direction which the normal vector faces, and thus, even an area of the inner surface of the cover housing, which defines where the window is provided, is parallel with the side surface of the window.

In another aspect, the upper surface the window is parallel with a plane in which the opening of the cover housing falls, and, in other words, a normal vector with respect to the upper surface of the window is at an accurate angle relative to the horizontal plane, and a vector acquired by orthogonally projecting the normal vector on the horizontal plane faces forward.

A cover housing may be coupled to the top of the main body. The cover housing may include a vertically extending sidewall and a partition that extends from the inside of the sidewall to partition the inside of the sidewall into upper and lower regions.

The display PCB may be provided in the partition, and the display panel may be provided in the display PCB. At least one rib may protrude upward from the partition, and the rib may pass through between the display PCB and the sidewall to thereby come into contact with the periphery of the display panel.

The display PCB may include board arms extending forward, rearward, leftward, and right ward from the center thereof, and thus, regions divided by the four boss arms are defined. The rib may pass through the region, divided by the four boss arms, to thereby come into contact with the periphery of the display panel.

The main body is provided in a cylindrical metal grille provided with a plurality of through-holes, so that sound output from the speaker is discharged. A first communication module for wirelessly communicating with surrounding devise is provided in the main body, and at least one antenna connected to the first communication module is provided in the exterior of the grille. A cover housing is coupled to a top of the main body, and a display Printed Circuit Board (PCB) is provided in the cover housing. On an upper surface of the display PCB, there may be provided a display for showing an interface screen configured based on information exchanged via the first communication module.

The antenna may be provided in the inner surface of the cover housing. The cover housing may be provided above the grille, and include a tubular sidewall that extends in a vertical direction and a partition extending from an inner surface of the sidewall for dividing an inside of the sidewall into upper and lower regions. The display PCB may be provided on an upper surface of the partition. The appropriate position of the antenna may be on the inner surface of the sidewall. In particular, the sidewall may be gradually increased in height, measured from the upper end of the grille, from a front side to a rear side thereof, and, in this case, the antenna is provided on a rear portion of the sidewall so as to securer a sufficient distance between the antenna and the grille.

An opening is formed in an upper surface of the cover housing, and a window is provided in the opening. The opening falls in a first plane that is at a first angle relative to a horizontal plane. The cover housing includes a cylindrical sidewall extending in a vertical direction, the sidewall provided above the grille, and the opening is a region surrounded by the upper end of the sidewall. The opening may be in a circular shape, and, in this case, a shape of the outer circumference of the opening, which is orthogonally projected on the horizontal plane, has a short diameter in the same direction as a vector obtained by orthogonally projecting a first normal vector upward from the first plane, and a long diameter in a direction orthogonal to the vector obtained by orthogonally projecting the first normal vector upward from the first plane.

A horizontal cross section of the grille has a shape corresponding to a shape of the opening orthogonally projected on the horizontal plane, so when the grille is viewed from the front, the grille has a left-to-right width greater than a grille having a circular horizontal cross section, and thus volume discharged forward in increased. The outer circumference of the upper end of the sidewall may be circular, and the horizontal cross section of the grille may correspond to a shape of the outer circumference orthogonally projected to the horizontal plane, and thus, when the hub is viewed from the top side, the cover housing and the grille form a unified external appearance.

When the lowermost point and the uppermost point of the opening of the cover housing is orthogonally projected on the horizontal plane, they are provided in the same direction as a vector obtained by orthogonally projecting a normal vector, upward from the first plane, on the horizontal plane. That is, when a vector obtained by orthogonally projecting the normal vector on the horizontal plane faces forward of the hub, even the opening of the cover housing is located on a plane that is inclined upward from a front side to a rear side. In this case, the window may be also provided to be inclined in the same manner as the opening. The upper surface of the window may be located on a plane in which the opening falls.

This structure is such that the upper surface of the window, which showing a screen of the display, is provided to face forward, an eye gaze of a user forward of the hub and the upper surface of the window may be at an angle greater than the case where the window is horizontally provided. The base has a lower surface having a shape corresponding to the horizontal cross section of the cylindrical grille, and specifically, the lower surface is a elliptical shape having a long diameter in the left-to-right direction and a short diameter in the front-to-rear direction.

The through-holes formed in the grille may include first through-holes and second through-hole each having a diameter smaller than that of the first through-hole, and the pattern composed of the first through-holes and the second through-holes may be repeatedly provided in all directions. The all-directional successive pattern may increase the area through which sound output from the speakers is discharged by forming the smaller-diameter second through-hole $20h$ between the larger-diameter first through-holes.

The main body may define a cavity for accommodating the speaker, a speaker case having a communication module provided in an outer surface thereof, and a plurality of support bosses protruding downward from a lower surface of the speaker case to support a radiator.

The main PCB may be provided between the main body and the base, and the radiator may be provided between the main PCB and a lower surface of the main body. In particular, because the speaker case defines a cavity, vibration caused by output of the speaker may be transferred to the lower surface of the speaker case. Thus, in order to reduce vibration output from the speaker and transferred to the radiator, the radiator needs to be spaced apart from the lower surface of the main body.

In this aspect, the radiator includes a plurality of support taps which extends from a flat portion in which a plurality of support through-holes are formed, the through-holes through which the support bosses respectively pass, and the support tabs are coupled to the support bosses at a lower side of the flat portion, so that the flat portion is maintained at a position spaced apart from the lower surface of the speaker case.

For strong support of the hub, sufficient friction is required between the base and a floor surface on which the hub is placed. To this end, the base may include a base body having a bottom provided with a rubber insertion groove formed in a bottom surface of the base body, and a support rubber inserted into the rubber insertion groove.

The support rubber may cause the base body to be spaced apart from the floor surface, and, in this respect, the support rubber may include: a rubber main body extending a long length to correspond to the rubber insertion groove, and a plurality of support protrusions protruding from the rubber main body to the outside of the rubber insertion groove.

In addition, the base body may include a recess for accommodating an adaptor, which receives power. The recess may include: an opening formed in the button surface of the base body; a recess side portion extending upward from the periphery of the opening; and an upper surface extending horizontally from the recess side portion $316a$ so as to face the opening.

A socket, into which an output terminal of a cord connected to the adaptor, may be provided in the recess side portion, and a cord-fixing groove may be formed in the body base to prevent the output terminal from being separated from the socket. Specifically, an outer opening may be formed in the base outer wall portion, and inner opening may be formed in the recess side portion, a cord insertion hole may be formed in the lower surface of the base bottom portion so as to connect the inner opening and the outer opening to each other, and the cord-fixing groove may be indented from the cord insertion hole to form a passage through which a power supplying cord pass between the outer opening and the inner opening.

The present disclosure provides a hub comprising: a main body having a speaker configured to output sound; communication circuitry provided in the main body and configured to wirelessly communicate with another device; a base coupled to a lower surface of the main body to support the main body; a cover housing having a lower surface coupled to a top surface of the main body and an upper surface defining an opening that is inclined; a display panel provided in the cover housing and configured to display a screen; a window positioned above the display panel, the window being provided in the opening and substantially parallel to the upper surface of the cover housing; and a grille having a vertically elongated cylindrical shape defining a cavity, the grille including an upper end coupled to the cover housing, and a lower end coupled to the base, wherein the main body is received within the cavity, and grille further includes a plurality of through-holes to pass the sound outputted by the speaker, wherein the grille has a horizontal cross-sectional shape corresponding to a shape acquired by orthogonally projecting the window on the horizontal plane.

The present disclosure also provides a hub comprising: a main body with a speaker configured to output sound; communication circuitry provided on the main body and configured to wirelessly communicate with another device; a base provided below the main body and coupled to a bottom surface of the main body; a cover housing coupled to a top surface of the main body and having an opening that is formed in an upper surface, the opening extending in a first plane inclined at a first angle with respect to a horizontal plane; a display panel provided in the cover housing and configured to present a screen; a window to cover the display panel and positioned in the opening; and a grille having a vertically elongated cylindrical shape and provided with a plurality of through-holes therein, the main body being positioned within the grille, the grille including an upper end coupled to the cover housing and a lower end coupled to the base, wherein the cover housing includes a cylindrical sidewall provided above the grille, and an upper surface of the sidewall defines the opening, wherein the upper surface of the sidewall has an annular outer circumference, and wherein the grille has a horizontal cross-section shape corresponding to a shape obtained by orthogonally projecting an outer circumference of the sidewall in a horizontal plane.

The present disclosure further provides a sound output apparatus comprising: a main body including a speaker configured to output sound; a cover housing coupled to a top surface of the main body and having an upper surface that defines an opening in a plane inclined at a prescribed angle with respect to a horizontal plane; a display panel provided in the cover housing and configured to output playback information associated with the speaker; and a window positioned over the display panel and in the opening, a grille having a vertically elongated cylindrical shape and provided with a plurality of through-holes, the main body being positioned within the grille, an upper end of the grille being coupled to the cover housing, wherein the cover housing includes a cylindrical sidewall that defines the opening, wherein an outer surface of the sidewall has an annular outer circumference, and wherein the upper end of the grille is inserted over the outer surface of the sidewall and has a horizontal cross-section shape corresponding to a shape obtained by orthogonally projecting the outer circumference of the sidewall on a horizontal plane.

The present disclosure further provides a sound output apparatus comprising: a main body including a speaker configured to output sound; a base provided below the main body configured to support the main body; a cover housing coupled to a top surface of the main body and having an opening formed in a plane that is inclined upward from a front side to a rear side thereof at a predetermined angle relative to a horizontal plane; a display panel provided in the cover housing; a window having a circular shape and provided in the opening to cover the display panel, the window having an upper surface inclined parallel to the plane of the opening of the cover housing; and a grille having a vertically elongated cylindrical shape and provided with a plurality of through-holes, the main body being positioned within the grille, and the grille having an upper end coupled to the cover housing and a lower end coupled to the base, wherein the grille has a horizontal cross section that is an ellipse having a short diameter in a front-to-rear direction and a long diameter in a left-to-right direction.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A hub comprising:
a main body having a speaker configured to output sound;
communication circuitry provided in the main body and configured to wirelessly communicate with another device;
a base coupled to a lower surface of the main body to support the main body;
a cover housing having a lower surface coupled to a top surface of the main body and an upper surface that defines an opening and is inclined upward from a front side to a rear side thereof with respect to a horizontal plane;
a display panel provided in the cover housing and configured to display a screen;
a window that has a circular shape and is positioned above the display panel, the window being provided in the opening and substantially parallel to the upper surface of the cover housing;
a window support plate to support the window and having an opening to expose the display panel;
at least one support boss extending downward from the window support plate and coupled to the cover housing; and
a grille having a vertically elongated cylindrical shape defining a cavity, the grille including an upper end coupled to the cover housing, and a lower end coupled to the base,
wherein the main body is received within the cavity, and grille further includes a plurality of through-holes to pass the sound outputted by the speaker,
wherein the grille has a horizontal cross-sectional shape corresponding orthogonally projecting an outer periphery of the window on to the horizontal plane, and
wherein a lower surface of the base has an elliptical shape having a long diameter in a left-to-right direction and a short diameter in a front-to-rear direction, corresponding to the horizontal cross section of the grille.

2. A hub comprising:
a main body with a speaker configured to output sound;
communication circuitry provided on the main body and configured to wirelessly communicate with another device;
a base provided below the main body and coupled to a bottom surface of the main body;
a cover housing coupled to a top surface of the main body and having an opening that is formed in an upper surface, the opening extending in a first plane inclined upward from a front side to a rear side thereof at a first angle with respect to a horizontal plane;
a display panel provided in the cover housing and configured to present a screen;
a window to cover the display panel and positioned in the opening;
a window support plate to support the window and having an opening to expose the display panel;
at least one support boss extending downward from the window support plate and coupled to the cover housing; and
a grille having a vertically elongated cylindrical shape and provided with a plurality of through-holes therein, the main body being positioned within the grille, the grille including an upper end coupled to the cover housing and a lower end coupled to the base,
wherein the cover housing includes a cylindrical sidewall provided above the grille, an upper surface of the sidewall defines the opening, and an outer circumference of the sidewall of the cover housing has a circular shape, wherein the upper surface of the sidewall has an annular outer circumference, wherein the grille has a horizontal cross-section shape corresponding to orthogonally projecting the outer circumference of the sidewall of the cover housing on to a horizontal plane, and wherein a lower surface of the base has an elliptical shape having a long diameter in a left-to-right direction and a short diameter in a front-to-rear direction, corresponding to the horizontal cross section of the grille.

3. The hub according to claim 2, wherein, when a highest point and a lowest point of the opening are orthogonally projected on a horizontal plane, the highest and lowest points of the opening are provided along a direction associated with orthogonally projecting a normal vector, which extends upward from the first plane, on the horizontal plane.

4. The hub according to claim 3, wherein the window has an upper surface inclined parallel to the first plane associated with the opening.

5. The hub according to claim 4, wherein the upper surface of the window is located on the first plane associated with the opening.

6. The hub according to claim 5, wherein the opening has a circular shape.

7. The hub according to claim 5, wherein the upper surface of the window has a circular shape corresponding to the opening.

8. The hub according to claim 7, wherein the window has a prescribed thickness, and the window includes a side surface spaced apart from an inner surface of the sidewall.

9. The hub according to claim 8, wherein the inner surface of the sidewall extends parallel to the side surface of the window.

10. The hub according to claim 2, wherein the shape obtained by orthogonally projecting the outer circumference of the sidewall on the horizontal plane has a short diameter along a vector acquired by orthogonally projecting a first normal vector, which extends upward from the first plane, on the horizontal plane, and a long diameter in a direction perpendicular to the vector acquired by orthogonally projecting the first normal vector on the horizontal plane.

11. The hub according to claim 2, wherein the horizontal cross-section of the grille forms an ellipse.

12. The hub according to claim 11, wherein a horizontal cross-section of a sidewall of the base coupled to the lower end of the grille has a shape corresponding to the ellipse.

13. The hub according to claim 12, wherein an opening defined by the upper side of the grille is on a second plane inclined at a second angle with respect to the horizontal plane, and wherein a vector obtained by orthogonally projecting a second normal vector, extending upward from the second plane, on the horizontal plane direct extends in a same direction as a vector acquired by orthogonally projecting the first normal vector on the horizontal plane.

14. A sound output apparatus, comprising:
a main body including a speaker configured to output sound;
a base coupled to a lower surface of the main body to support the main body;
a cover housing coupled to a top surface of the main body and having an upper surface that defines an opening in a plane inclined upward from a front side to a rear side thereof at a prescribed angle with respect to a horizontal plane;
a display panel provided in the cover housing and configured to output playback information associated with the speaker;
a window having a circular shape and positioned over the display panel and in the opening;
a window support plate to support the window and having an opening to expose the display panel;
at least one support boss extending downward from the window support plate and coupled to the cover housing; and
a grille having a vertically elongated cylindrical shape and provided with a plurality of through-holes, the main body being positioned within the grille, an upper end of the grille being coupled to the cover housing and a lower end of the grille being coupled to the base,
wherein the cover housing includes a cylindrical sidewall that defines the opening,
wherein an outer surface of the sidewall has an annular outer circumference,
wherein the upper end of the grille is inserted over the outer surface of the sidewall and has a horizontal cross-section shape corresponding to orthogonally projecting the outer circumference of the sidewall of the cover housing on to a horizontal plane, and
wherein a lower surface of the base has an elliptical shape having a long diameter in a left-to-right direction and a short diameter in the front-to-rear direction, corresponding to the horizontal cross section of the grille.

15. The sound output apparatus according to claim 14, wherein the circular shape of the window has a diameter corresponding distance between a highest point of the opening and a lowest point of the opening.

16. The sound output apparatus according to claim 14, further comprising:
a radiator plate positioned between the main body and the base, wherein the radiator plate receives and dissipates heat raising from the main body, and wherein the radiator plate is spaced from the main body.

17. A sound output apparatus comprising:
a main body including a speaker configured to output sound;
a base provided below the main body configured to support the main body;
a cover housing coupled to a top surface of the main body and having an opening formed in a plane that is inclined upward from a front side to a rear side thereof at a predetermined angle relative to a horizontal plane;
a display panel provided in the cover housing;
a window having a circular shape and provided in the opening to cover the display panel, the window having an upper surface inclined parallel to the plane of the opening of the cover housing
a window support plate to support the window and having an opening to expose the display panel;
at least one support boss extending downward from the window support plate and coupled to the cover housing; and
a grille having a vertically elongated cylindrical shape and provided with a plurality of through-holes, the main body being positioned within the grille, and the grille having an upper end coupled to the cover housing and a lower end coupled to the base, wherein the grille has a horizontal cross section that is an ellipse having a short diameter in a front-to-rear direction and a long diameter in a left-to-right direction, and wherein a lower surface of the base has an elliptical shape having a long diameter in the left-to-right direction and a short diameter in the front-to-rear direction, corresponding to the horizontal cross section of the grille.

18. The sound output apparatus of claim 17, wherein the cover housing includes a sidewall, and the sidewall extends into the upper end of the grille, and wherein a portion of the sidewall that extends into the upper end of the grille has a cross-sectional shape of an ellipse with a short diameter in a front-to-rear direction and a long diameter in a left-to-right direction.

19. The sound output apparatus of claim 17, wherein the base includes a sidewall, an external surface of the sidewall of the base is inserted into the lower end of the grille, and the external surface of the sidewall of the base has a horizontal cross-section shape of a circle.

* * * * *